US008785327B2

(12) United States Patent
Kikutani

(10) Patent No.: US 8,785,327 B2
(45) Date of Patent: Jul. 22, 2014

(54) METHOD OF MANUFACTURING SEMICONDUCTOR DEVICE

(75) Inventor: Keisuke Kikutani, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/603,887

(22) Filed: Sep. 5, 2012

(65) Prior Publication Data

US 2013/0237050 A1    Sep. 12, 2013

(30) Foreign Application Priority Data

Jan. 6, 2012    (JP) ................................ 2012-001404

(51) Int. Cl.
*H01L 21/3213* (2006.01)
*H01L 21/027* (2006.01)

(52) U.S. Cl.
USPC ............ 438/703; 438/618; 438/637; 438/696

(58) Field of Classification Search
None
See application file for complete search history.

(56) References Cited

U.S. PATENT DOCUMENTS

| 7,838,996 | B2 | 11/2010 | Sato et al. |
| 8,003,544 | B2 | 8/2011 | Sato et al. |
| 2008/0008969 | A1 | 1/2008 | Zhou et al. |
| 2010/0155959 | A1* | 6/2010 | Park et al. .................... 257/773 |
| 2011/0039389 | A1 | 2/2011 | Yamashita et al. |
| 2012/0241834 | A1* | 9/2012 | Nakajima et al. ............. 257/316 |
| 2013/0237051 | A1 | 9/2013 | Kikutani et al. |

FOREIGN PATENT DOCUMENTS

| JP | 2008-27791 | 2/2008 |
| JP | 2008-27991 | 2/2008 |
| JP | 2009-252954 | 10/2009 |
| JP | 2009-543378 | 12/2009 |
| JP | 2010-153869 | 7/2010 |
| JP | 2011-40561 | 2/2011 |
| JP | 2011-108812 | 6/2011 |
| JP | 2013-135202 A | 7/2013 |
| WO | WO 2008/008338 A2 | 1/2008 |

OTHER PUBLICATIONS

U.S. Appl. No. 13/602,841, filed Sep. 4, 2012, Kikutani et al.

* cited by examiner

*Primary Examiner* — Zandra Smith
*Assistant Examiner* — Pamela E Perkins
(74) *Attorney, Agent, or Firm* — Oblon, Spivak, McClelland, Maier & Neustadt, L.L.P.

(57) ABSTRACT

According to one embodiment, a method of manufacturing a semiconductor device, includes forming first layer on first and second regions in substrate, first layer having first width in first region and having larger dimension than first width in second region, forming first sidewall on first layer, forming second layer covering first sidewall in the second region and forming third layer having second width smaller than first width on the side face of first sidewall having second width after removing first layer, forming second and third sidewalls having second width so that second and third sidewalls is adjacent to first sidewall across third layer by second width in first region and across second and third layers by second interval larger than second width in the second region.

19 Claims, 34 Drawing Sheets

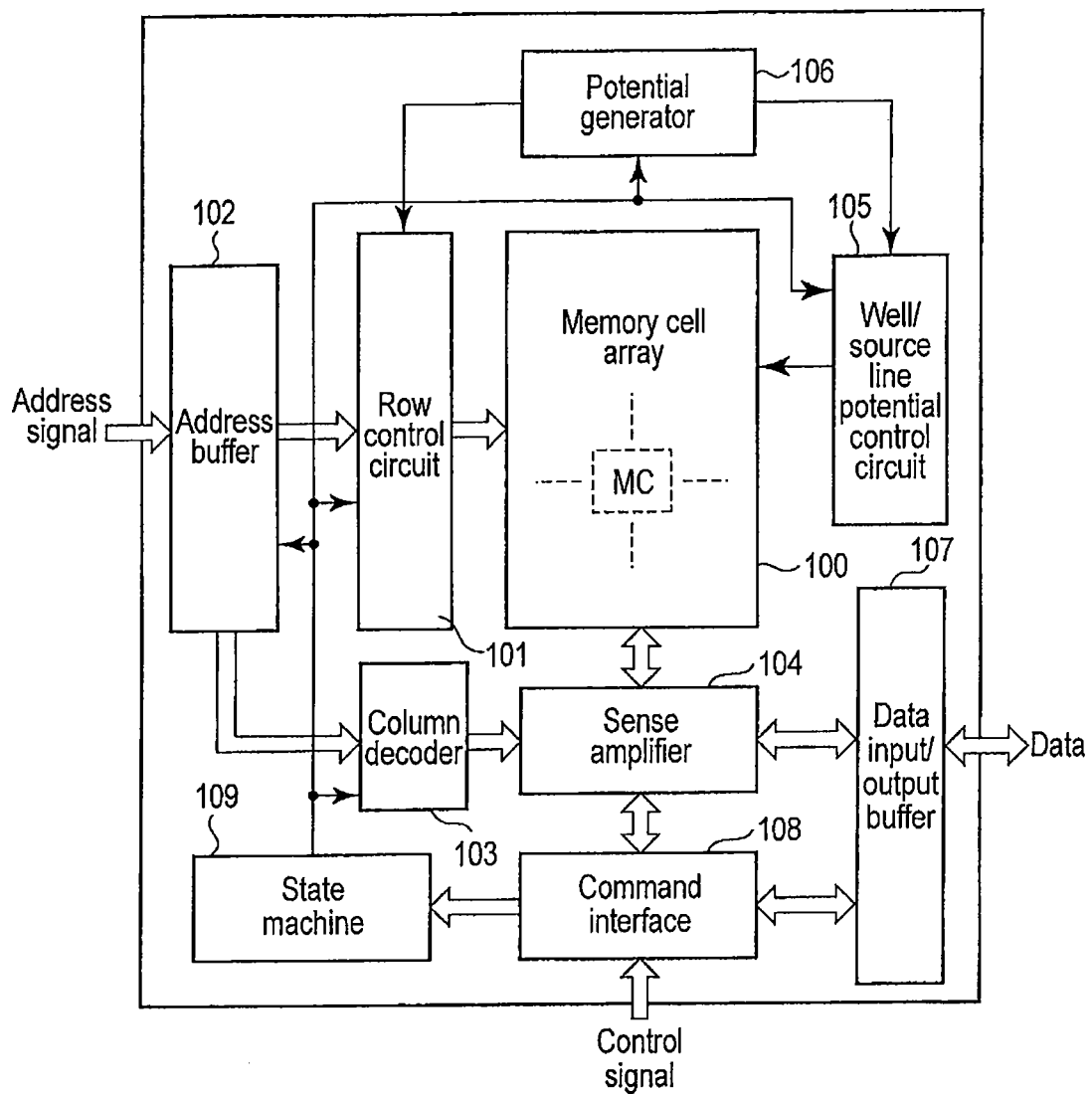
F I G. 1

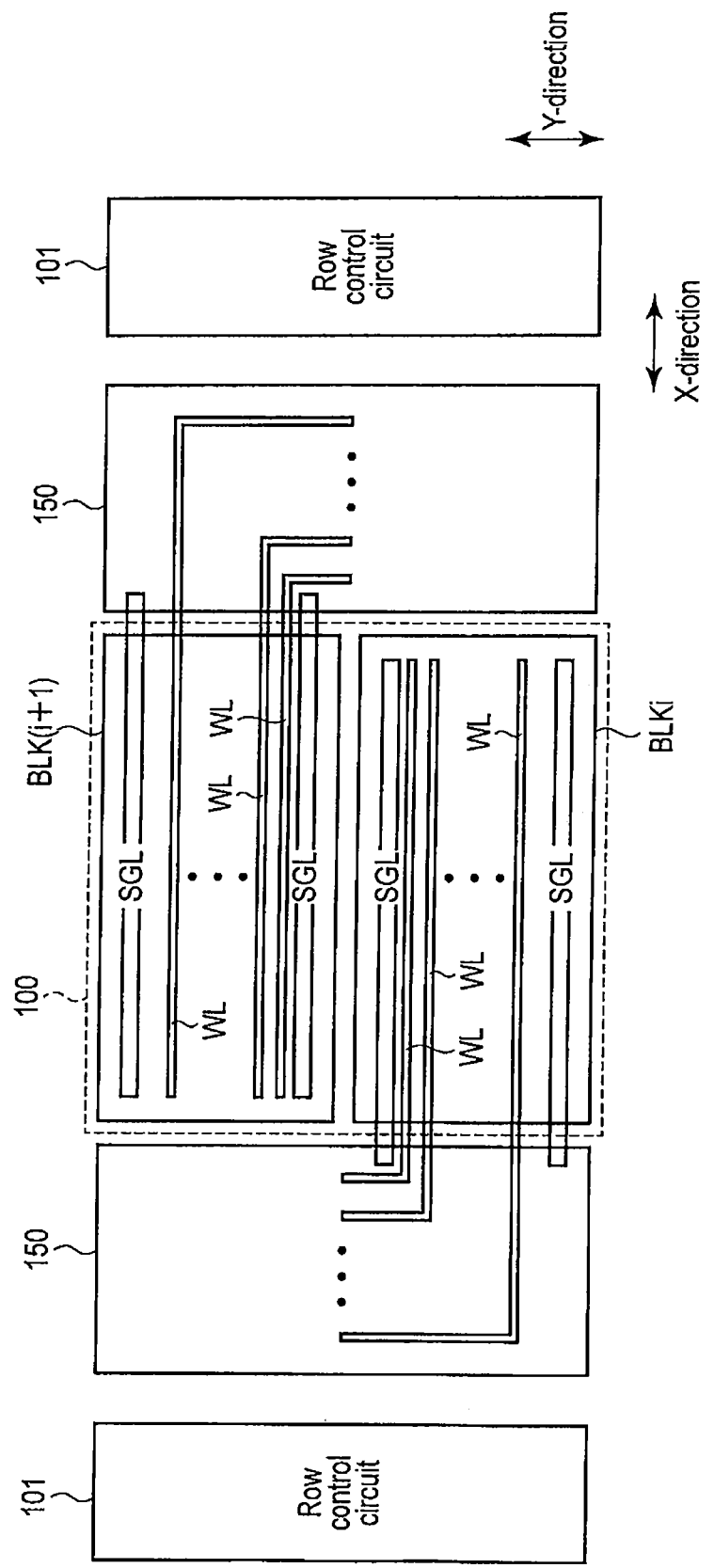
F I G. 3

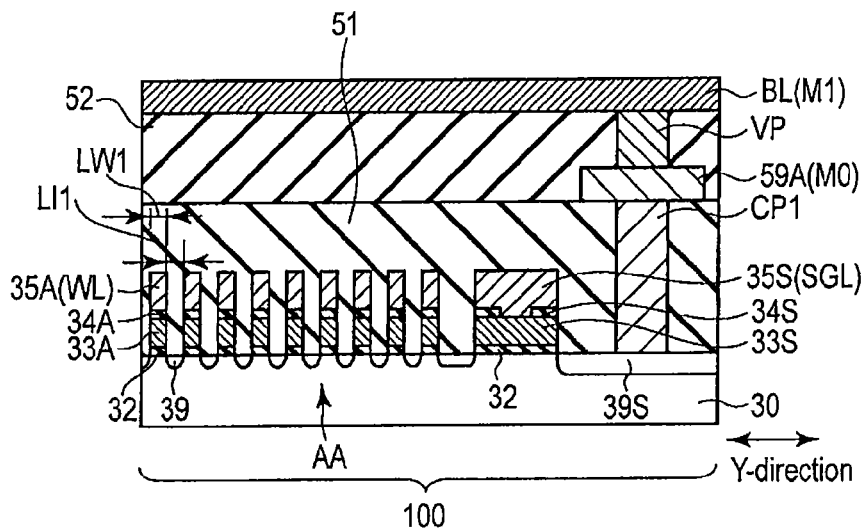
F I G. 5A
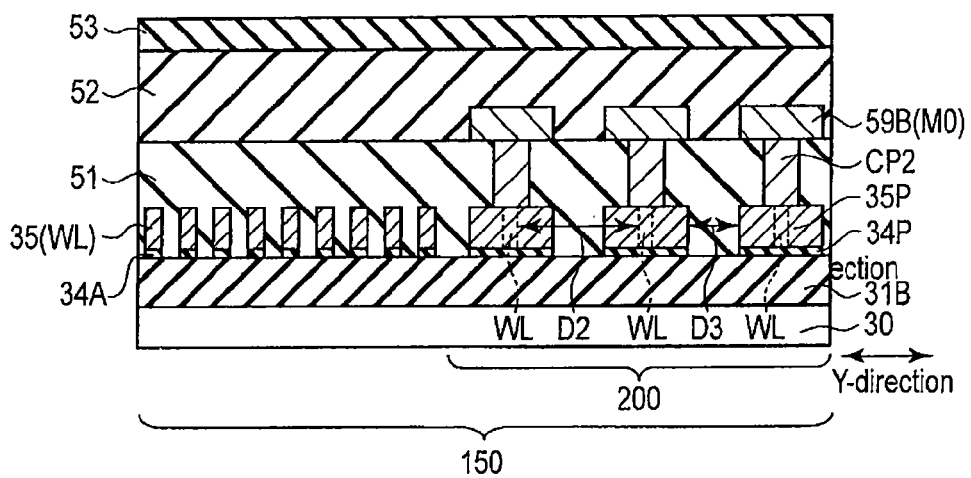
F I G. 5B
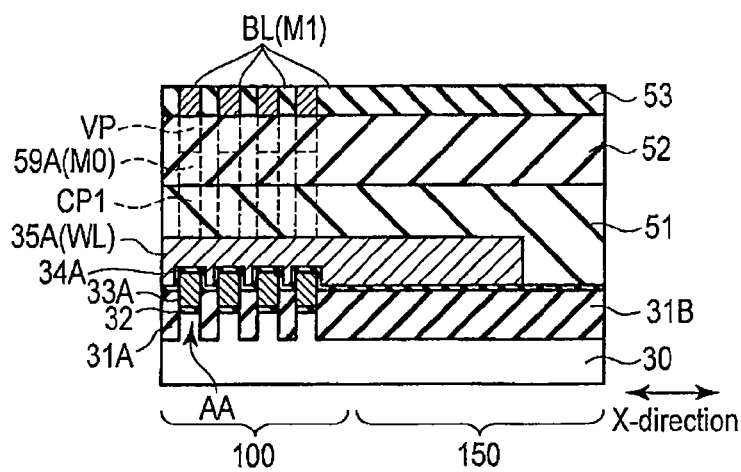
F I G. 5C

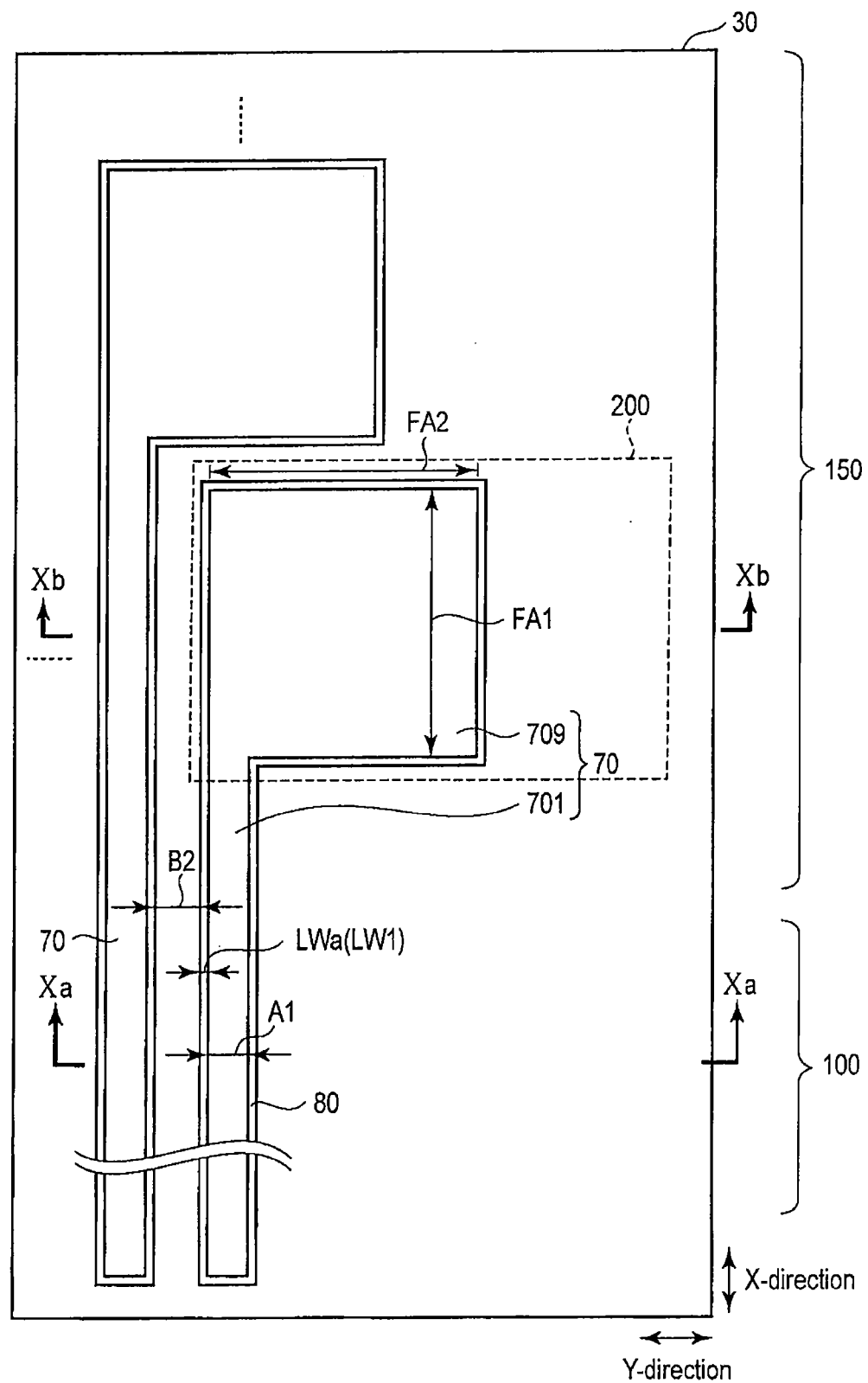
F I G. 9

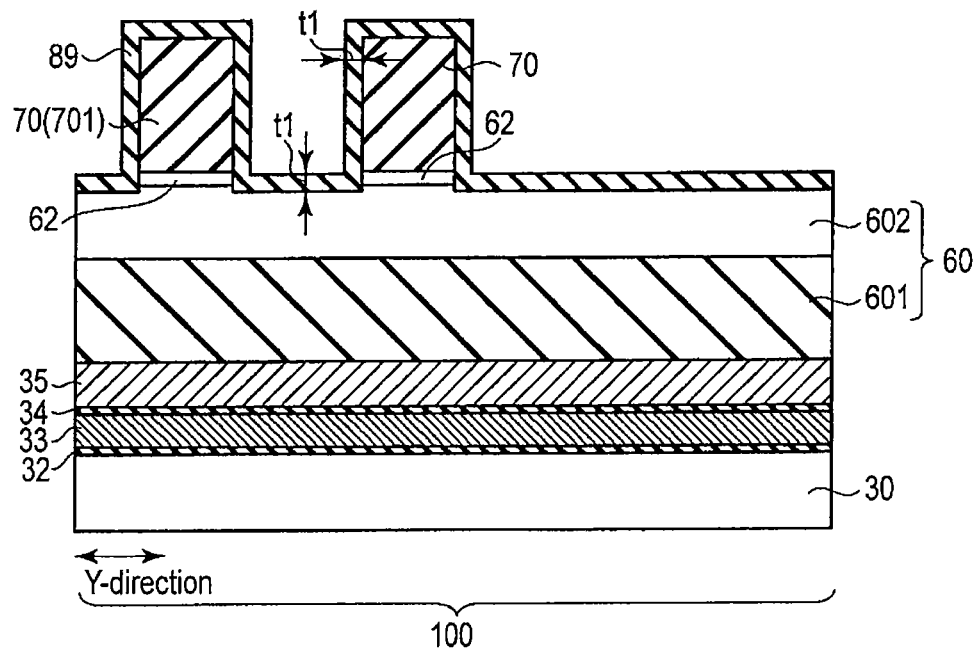
F I G. 10A
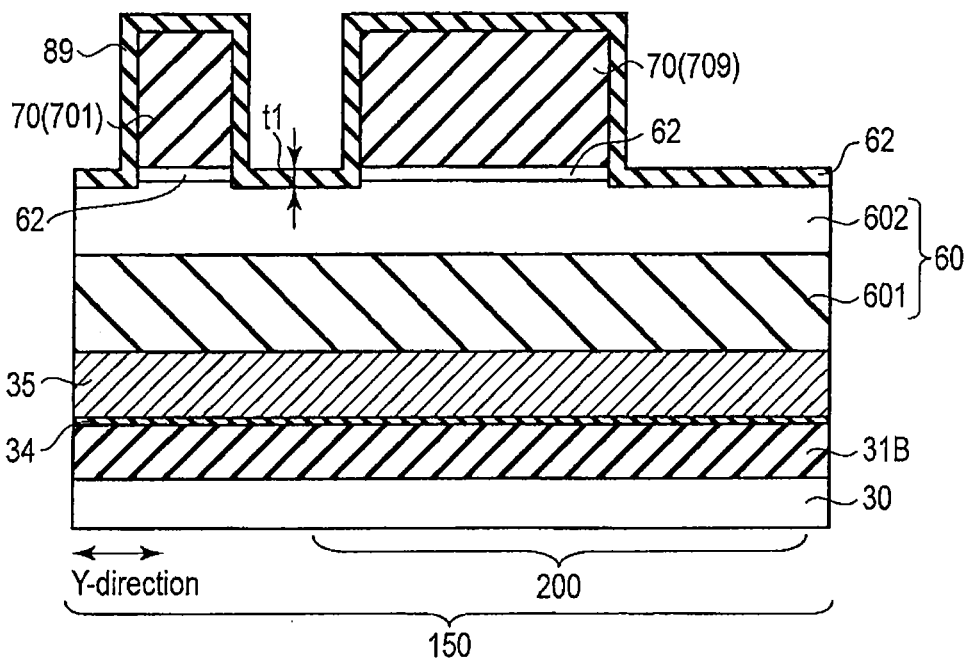
F I G. 10B

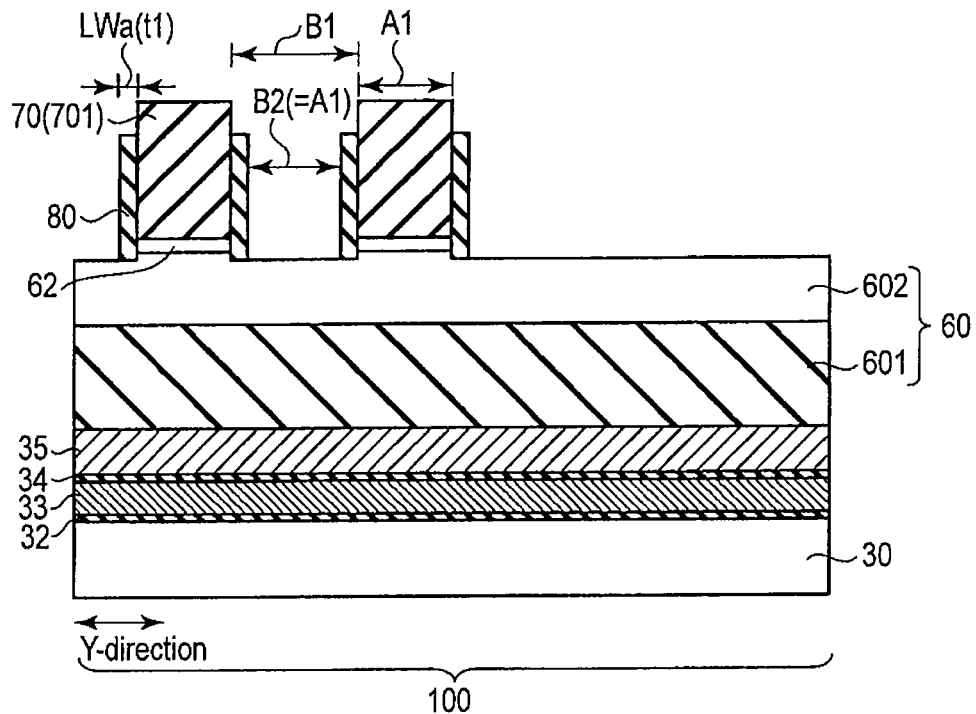
F I G. 11A
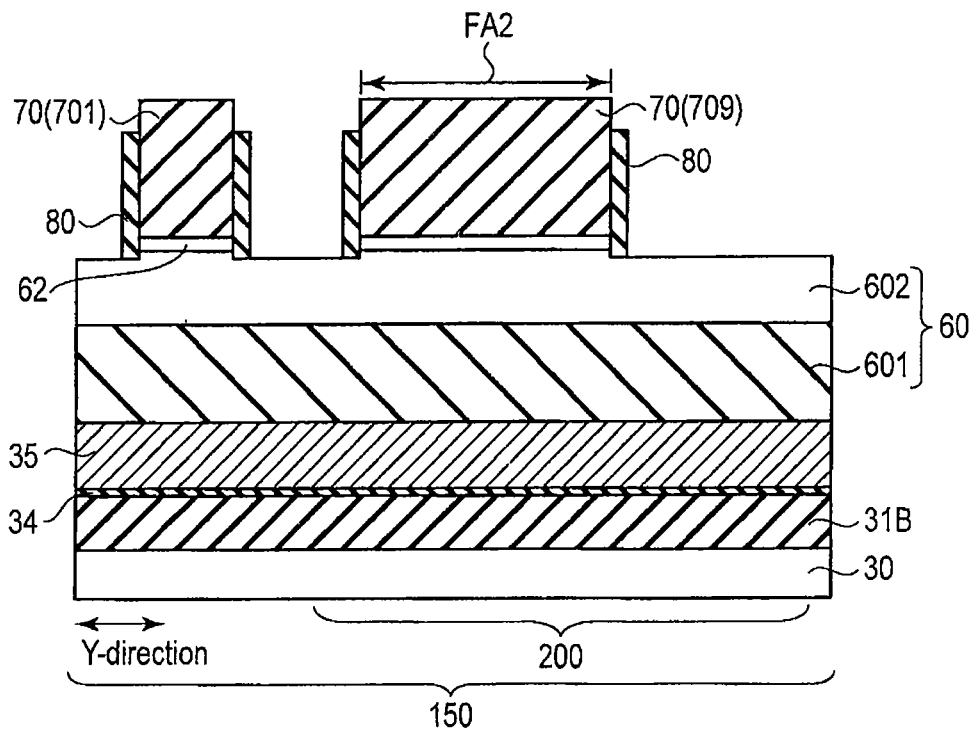
F I G. 11B

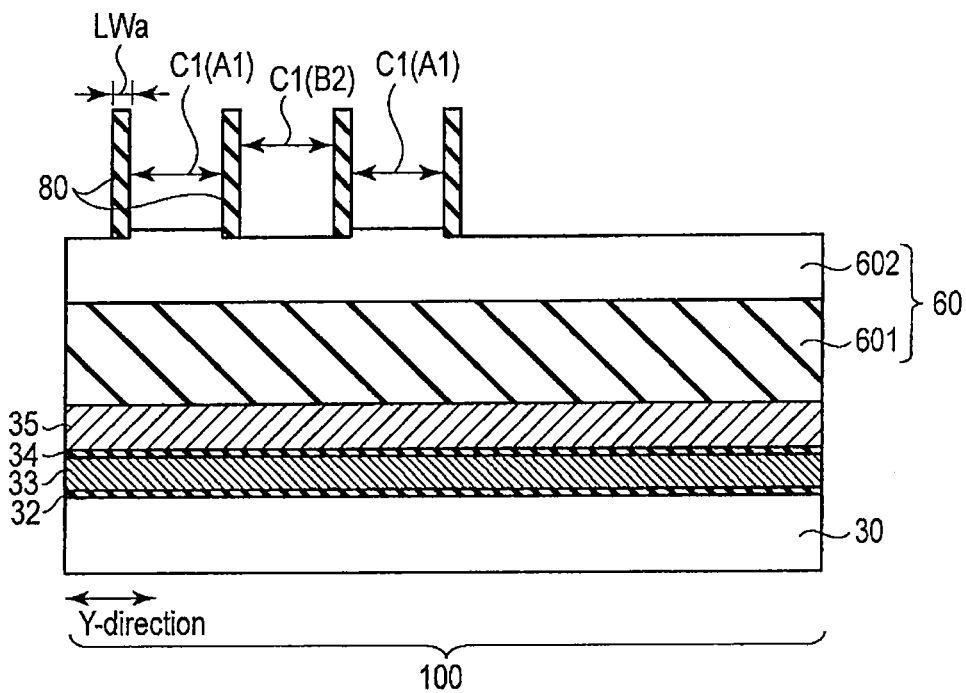
F I G. 13A
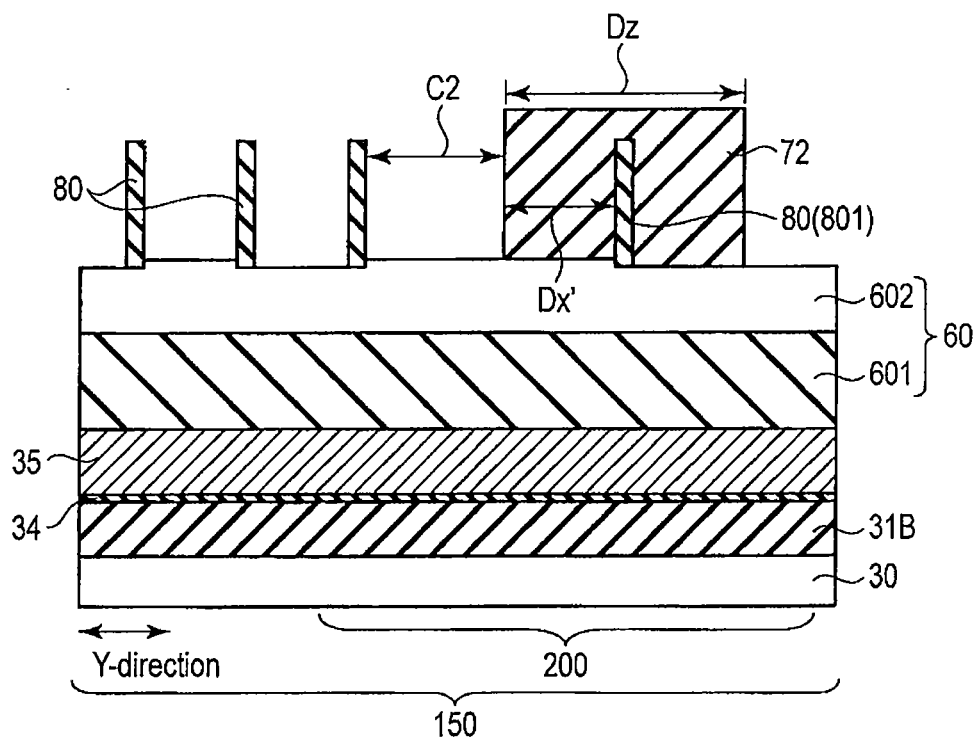
F I G. 13B

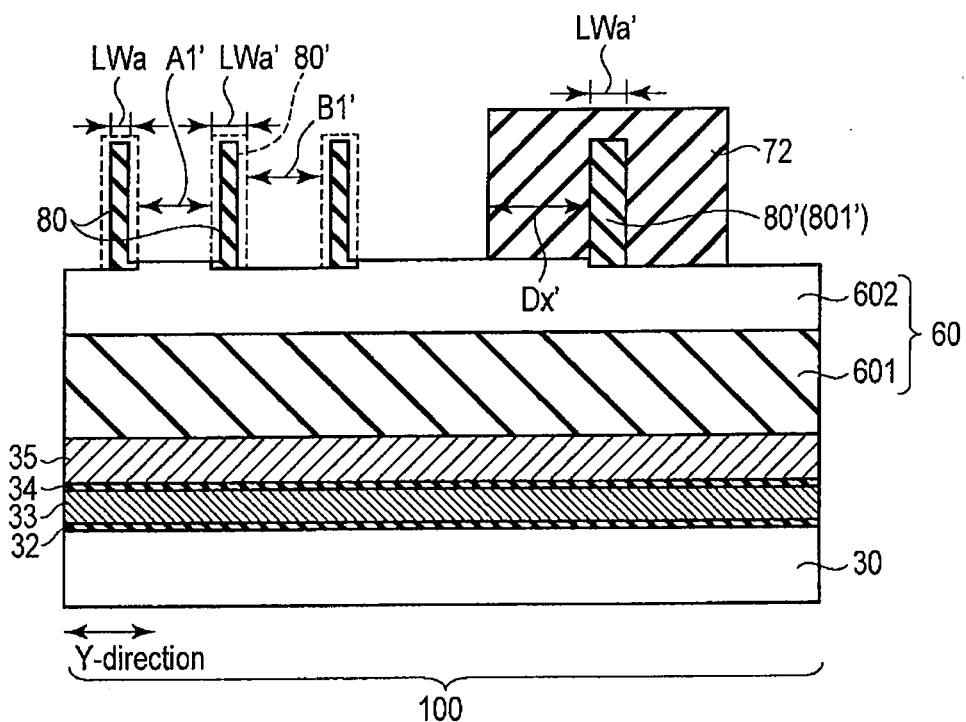
F I G. 13C
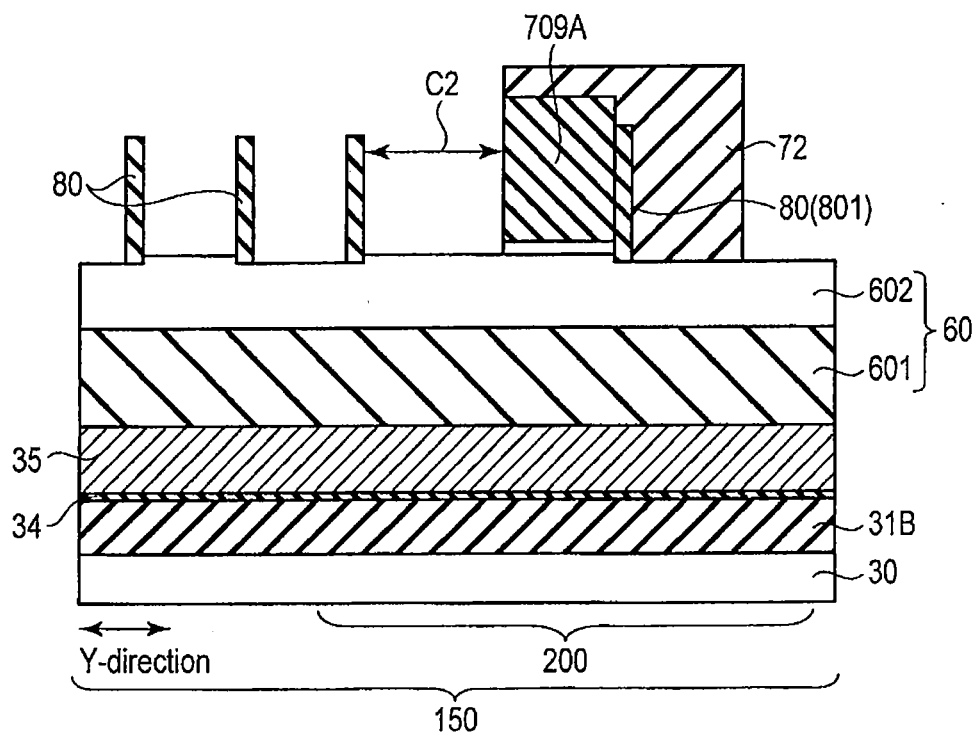
F I G. 13D

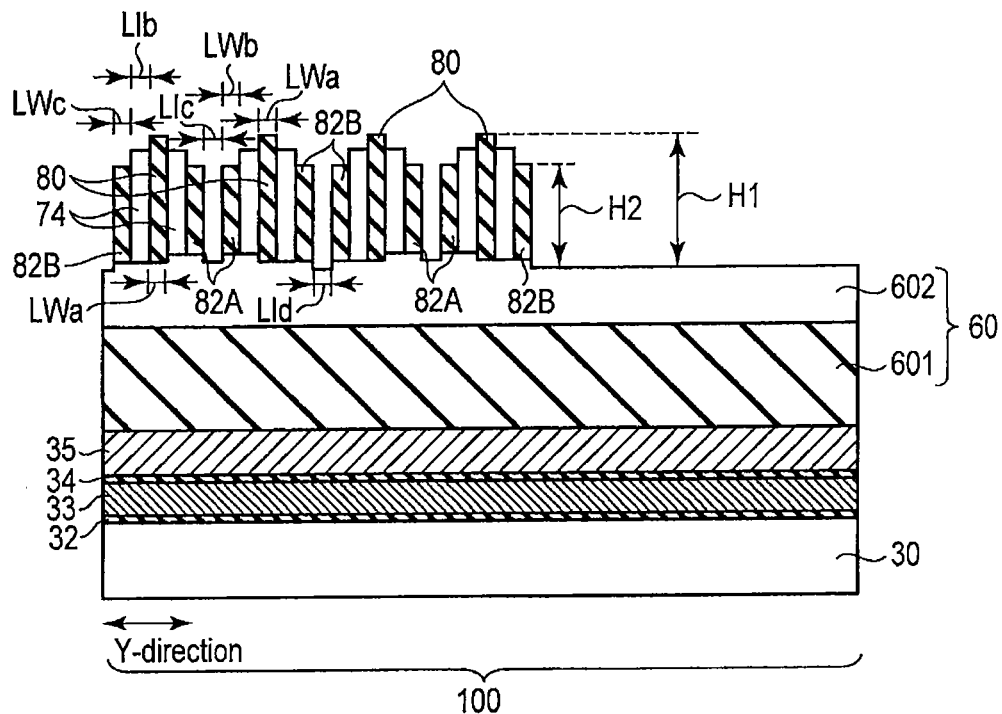
F I G. 15A
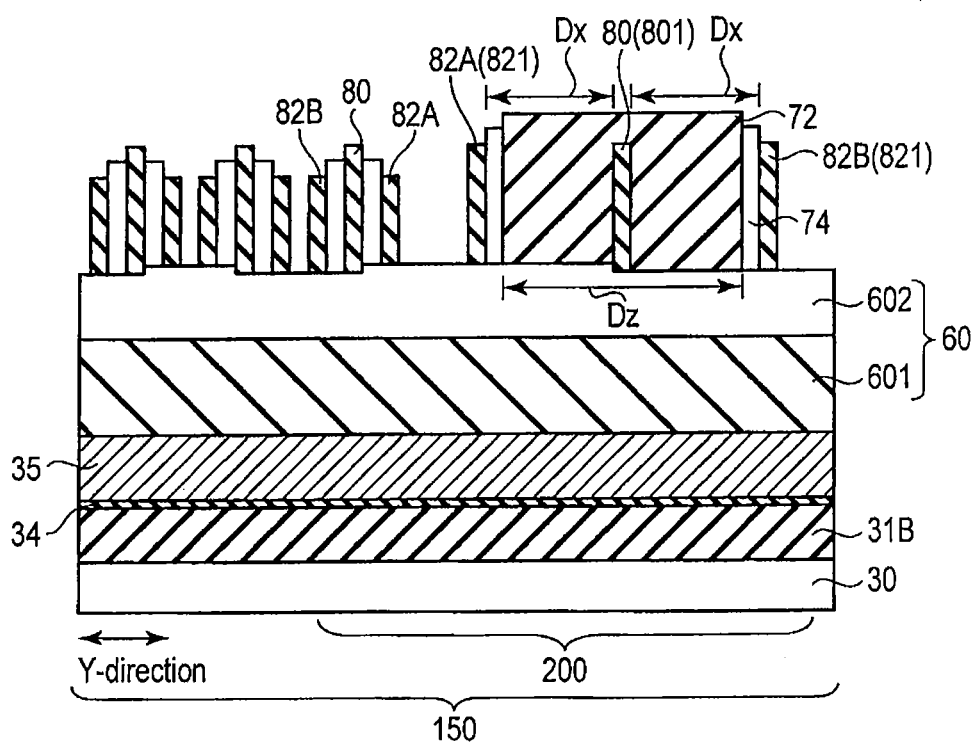
F I G. 15B

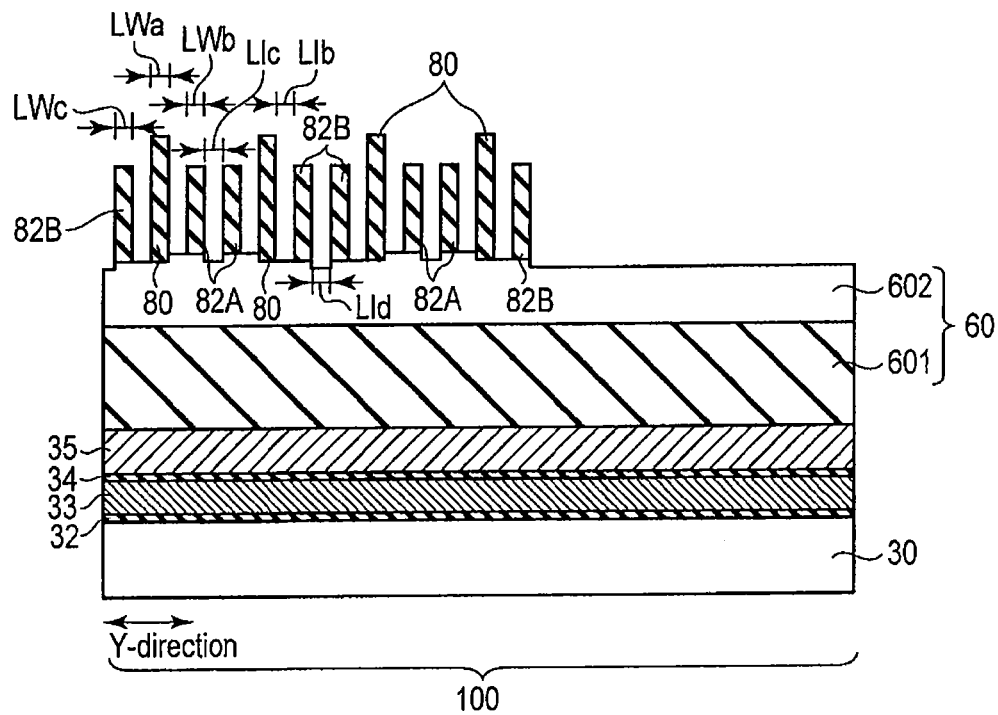
F I G. 16A
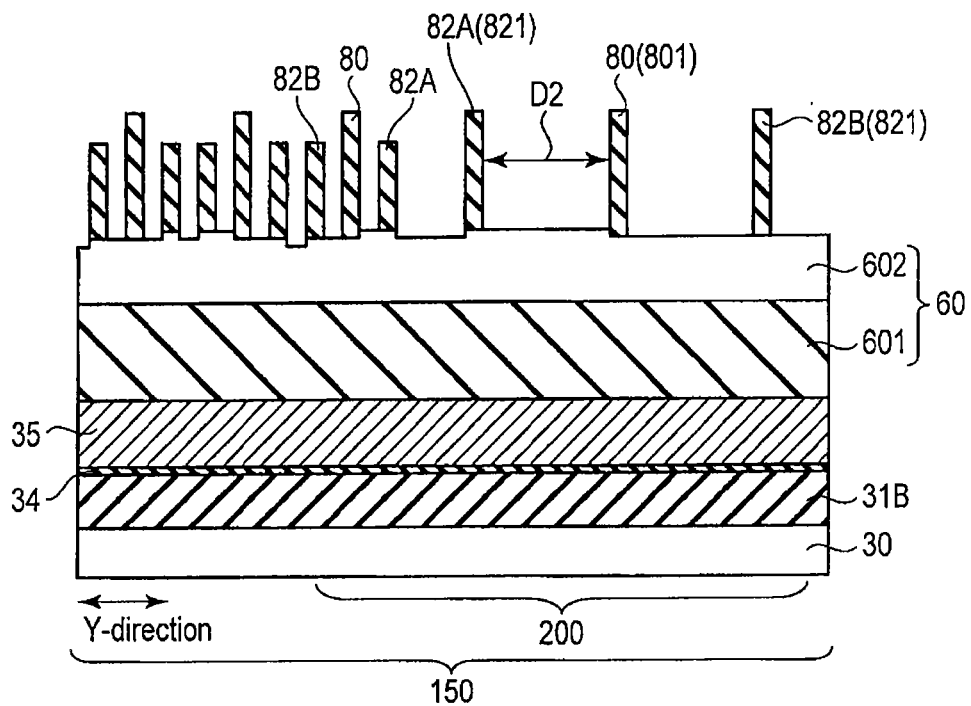
F I G. 16B

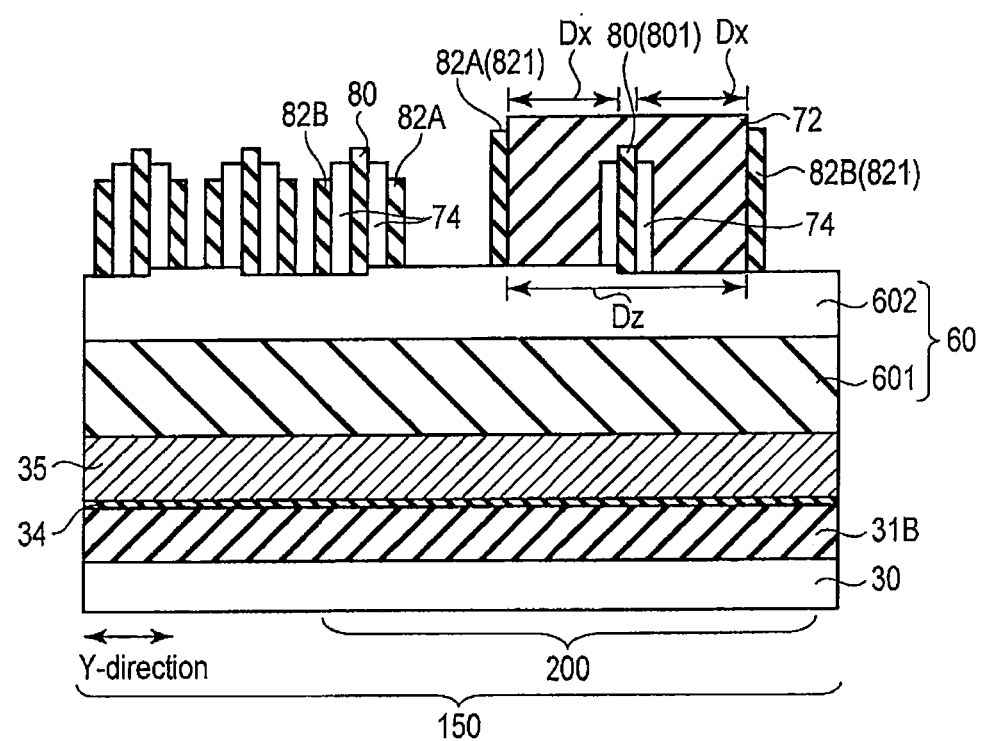
F I G. 16C

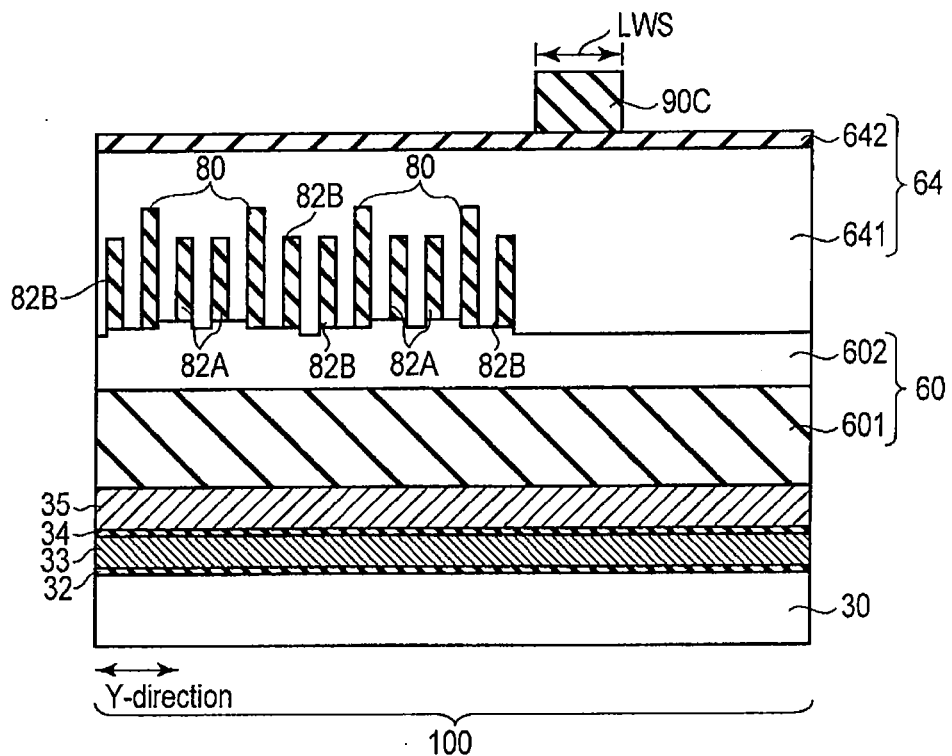
F I G. 18A
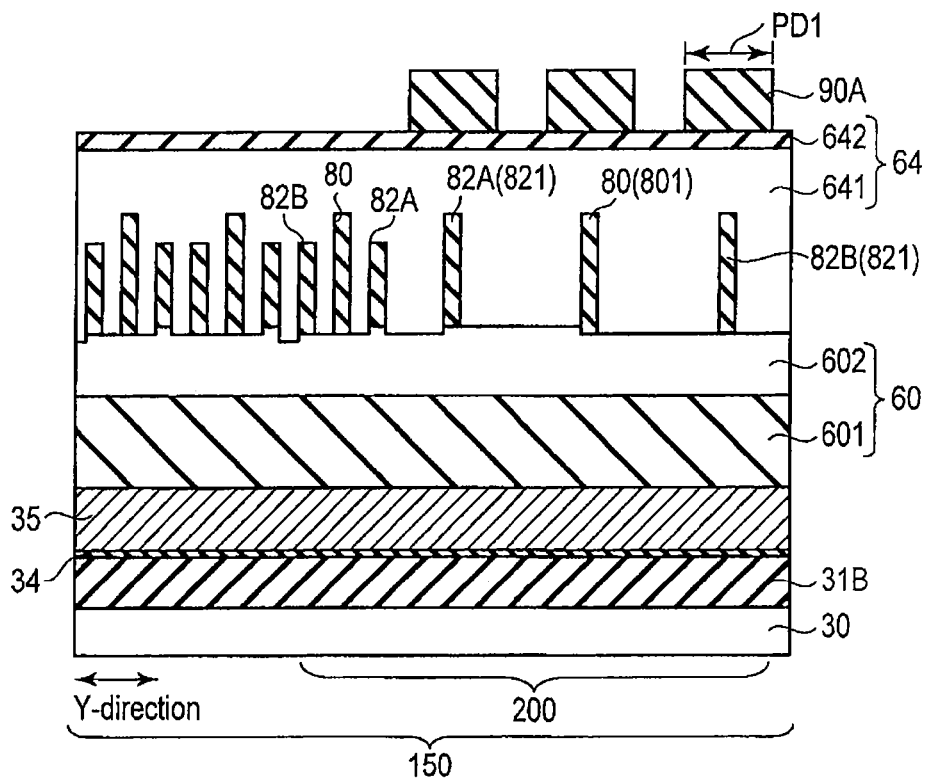
F I G. 18B

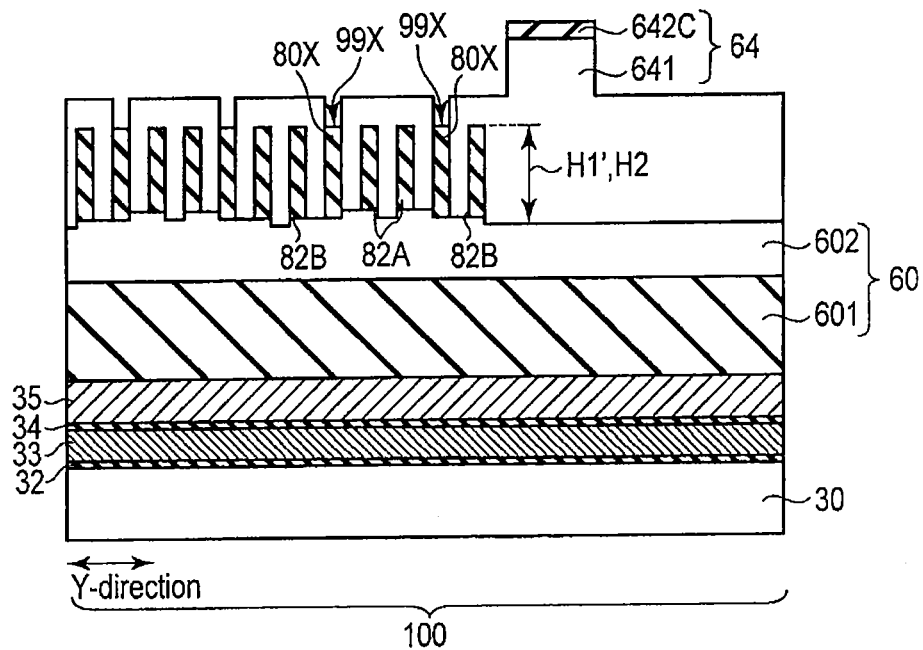
F I G. 20A
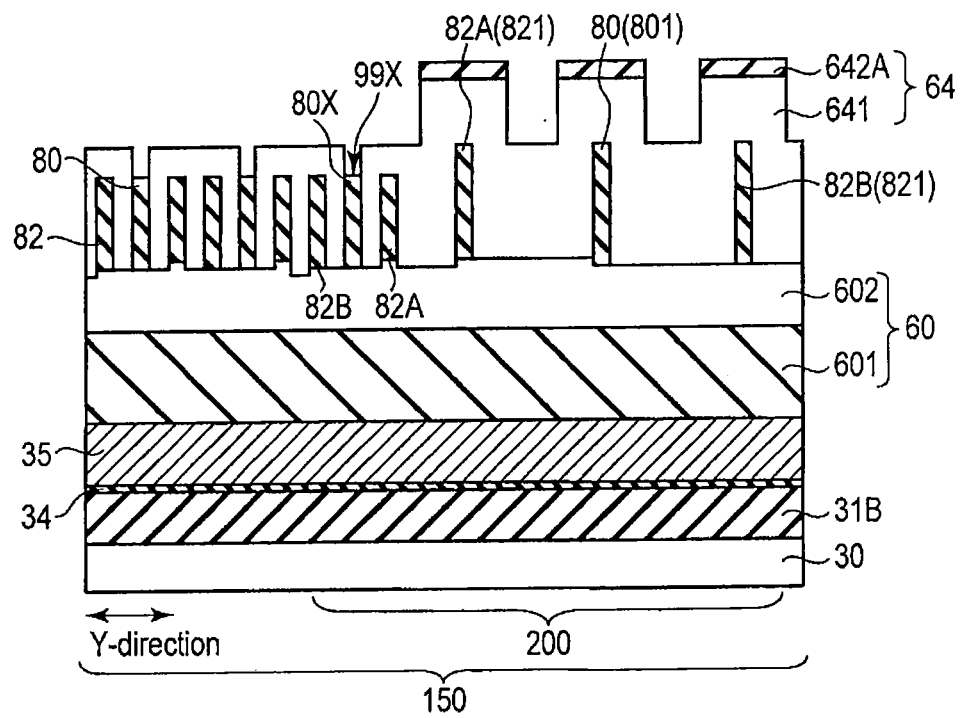
F I G. 20B

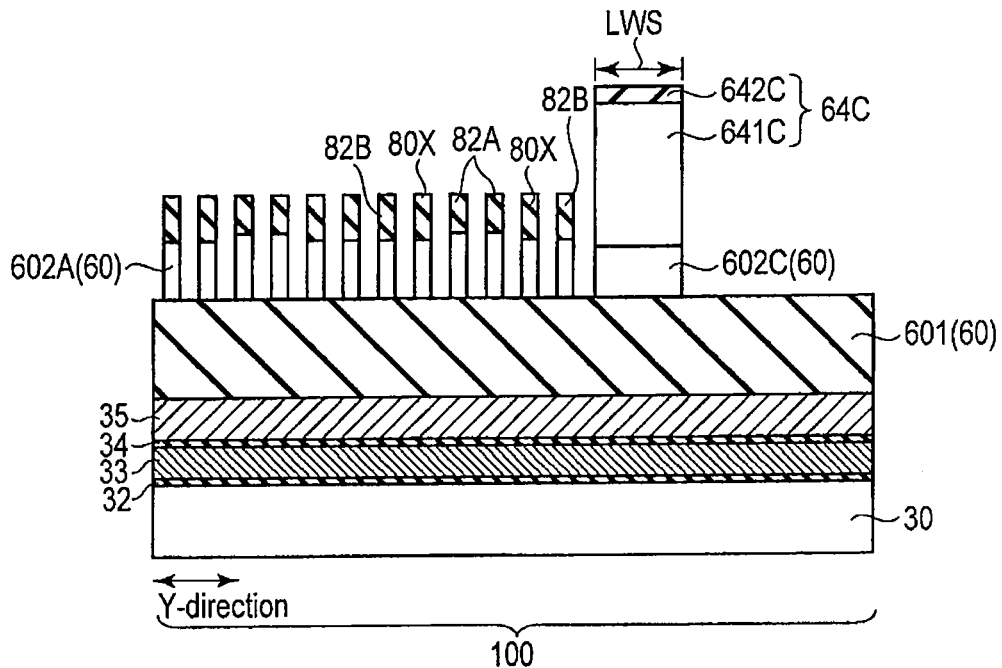
F I G. 21A
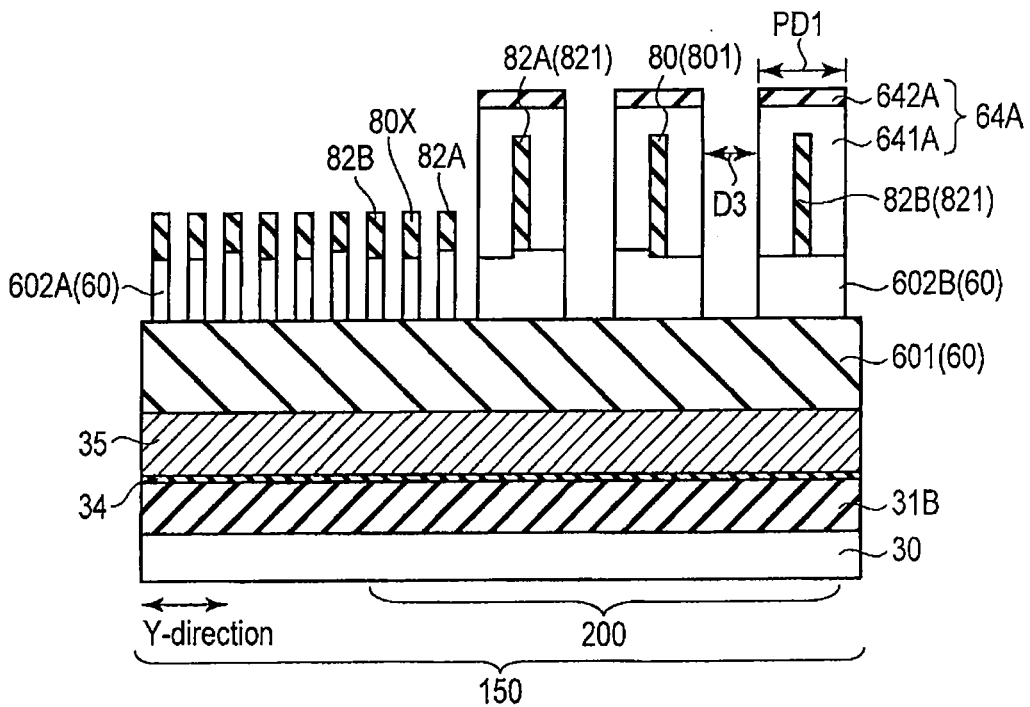
F I G. 21B

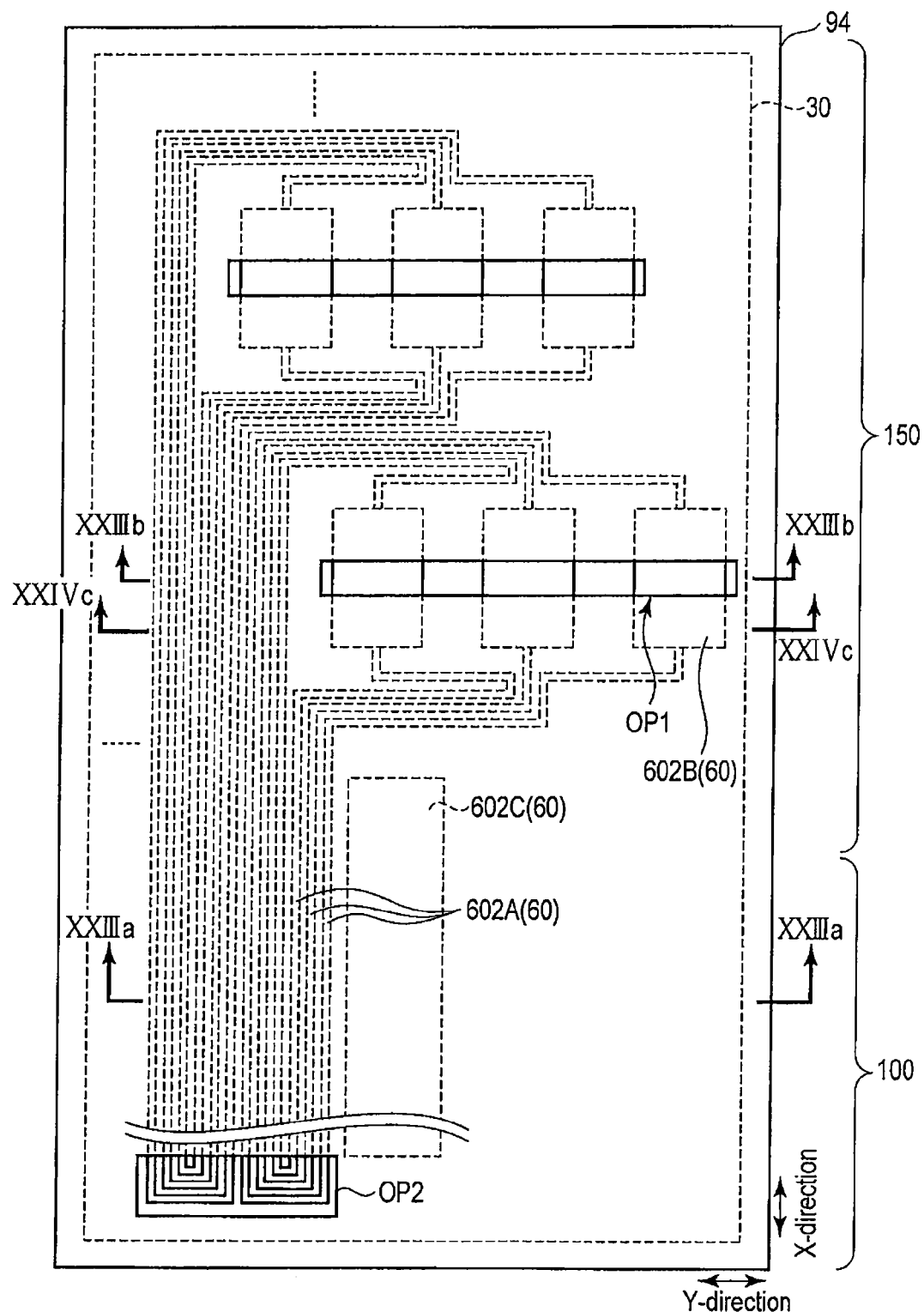
F I G. 22

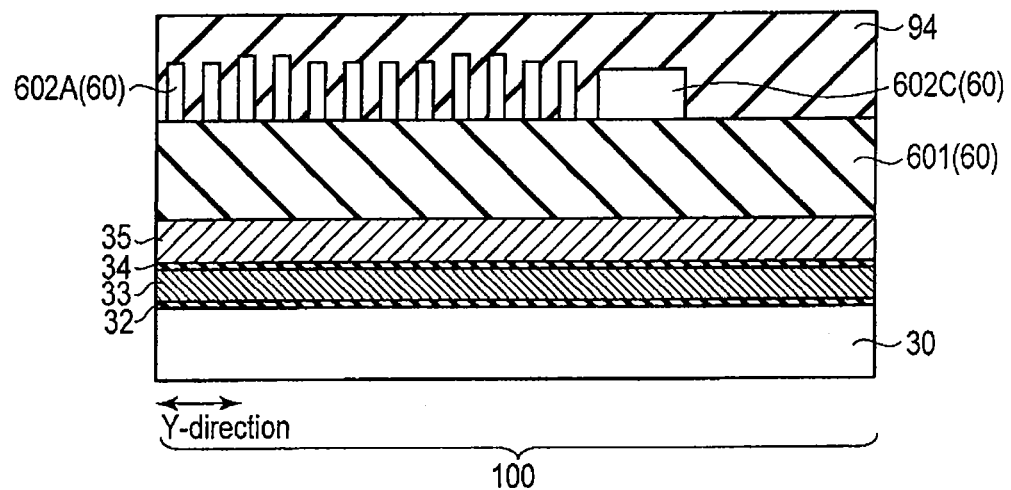
F I G. 23A
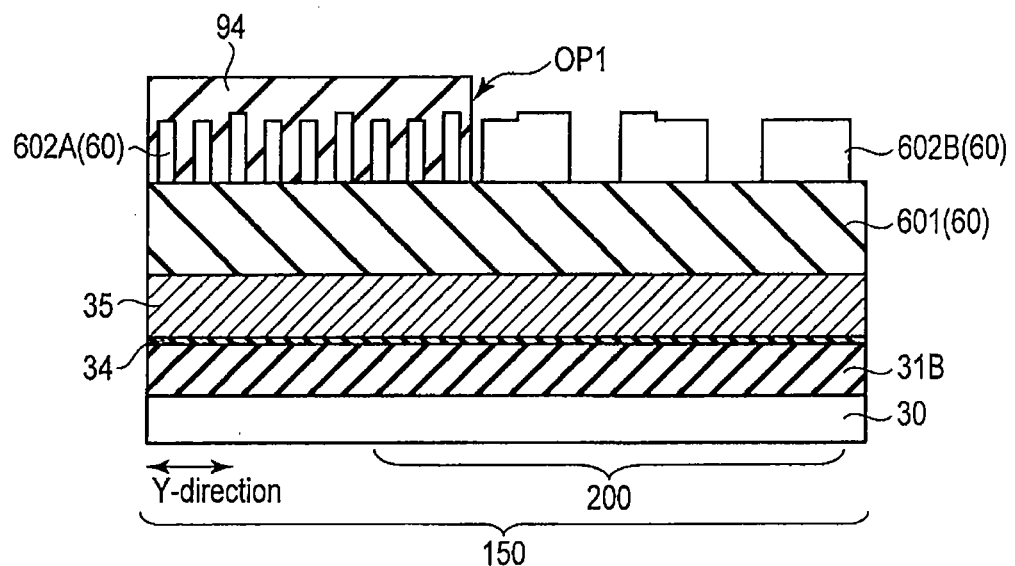
F I G. 23B

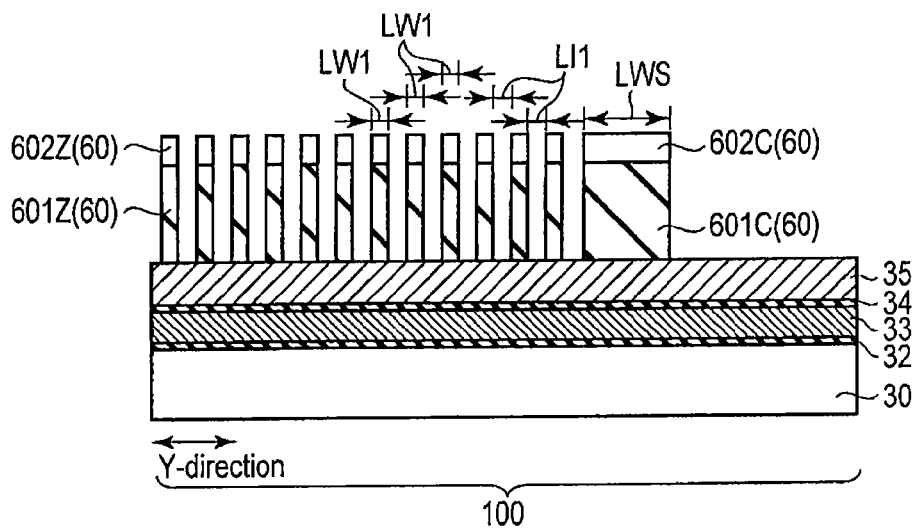
F I G. 24A
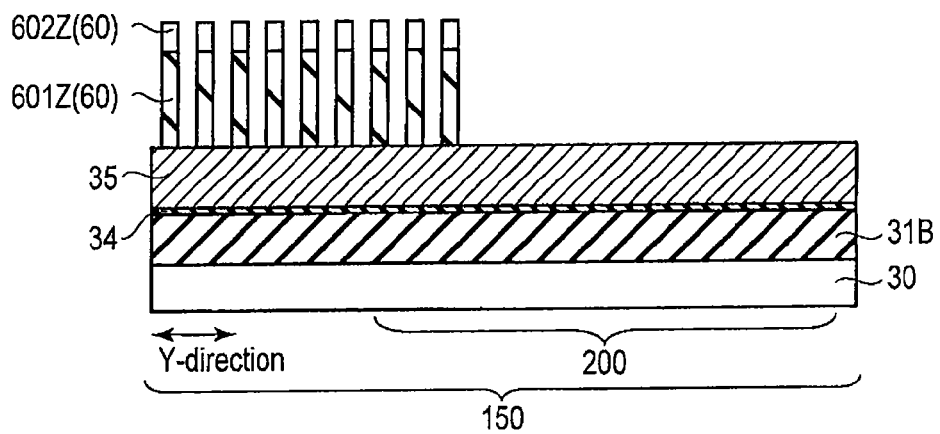
F I G. 24B
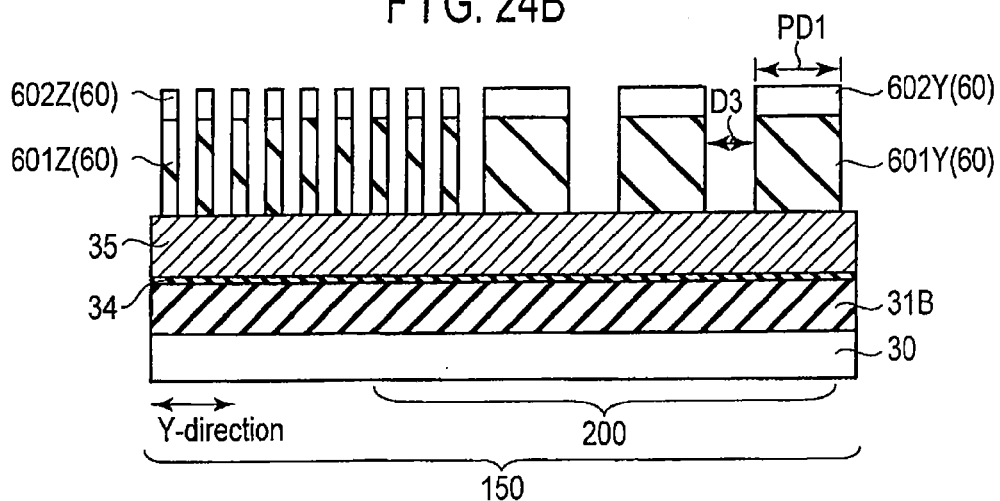
F I G. 24C

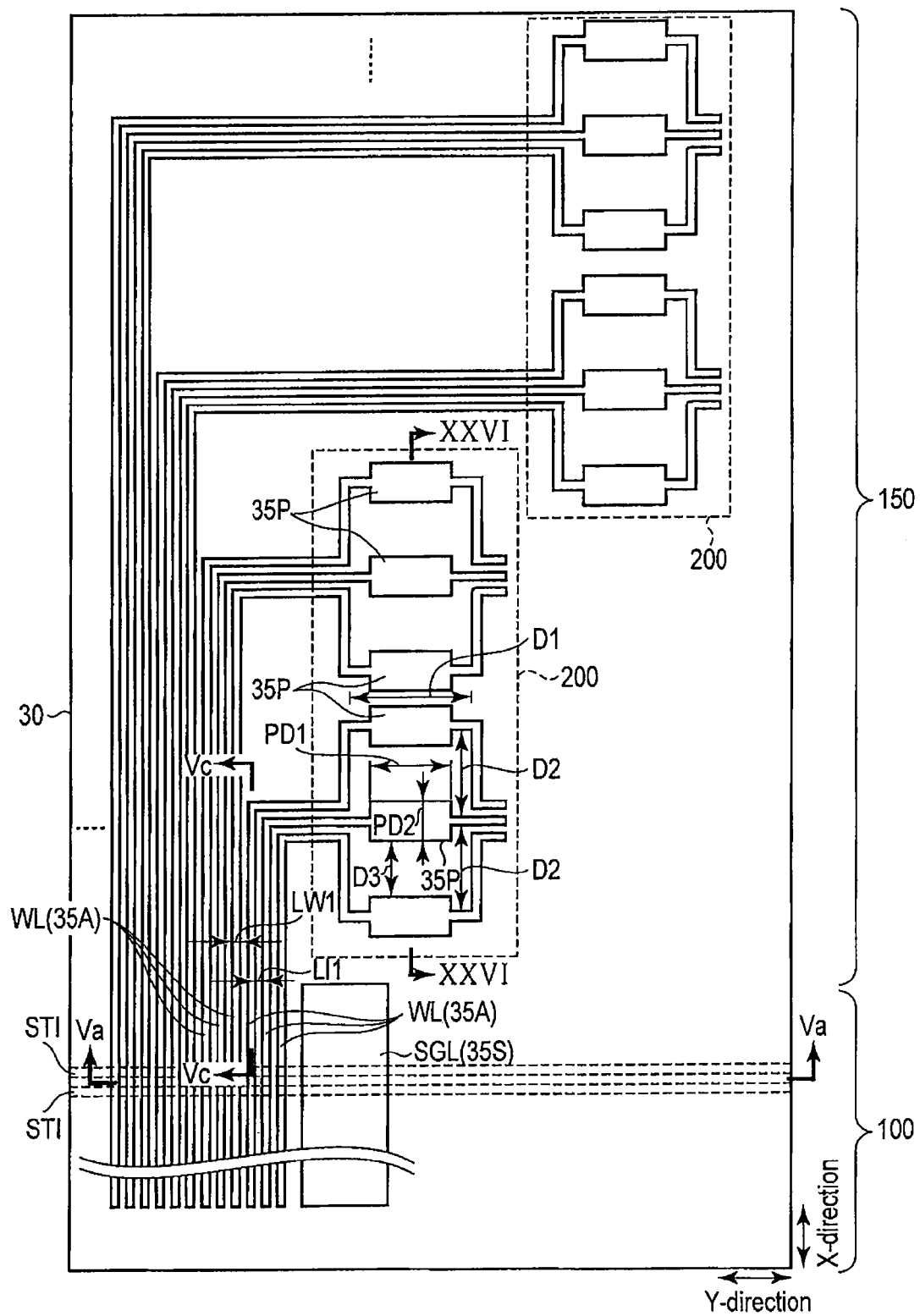
F I G. 25

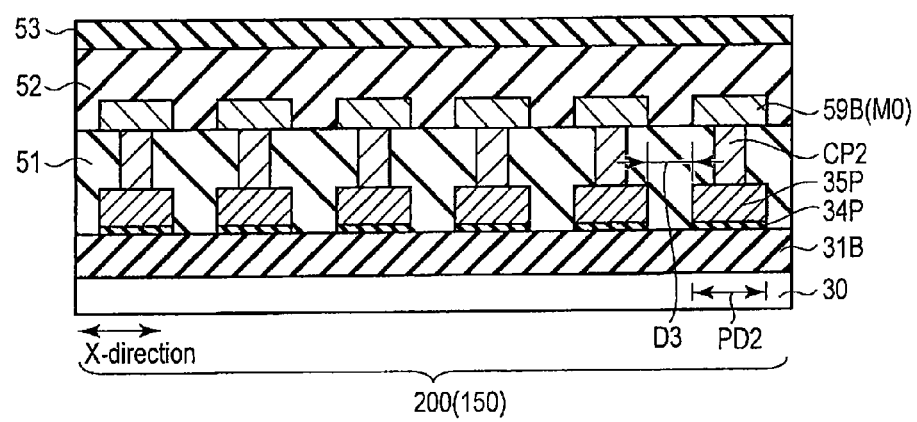
F I G. 26

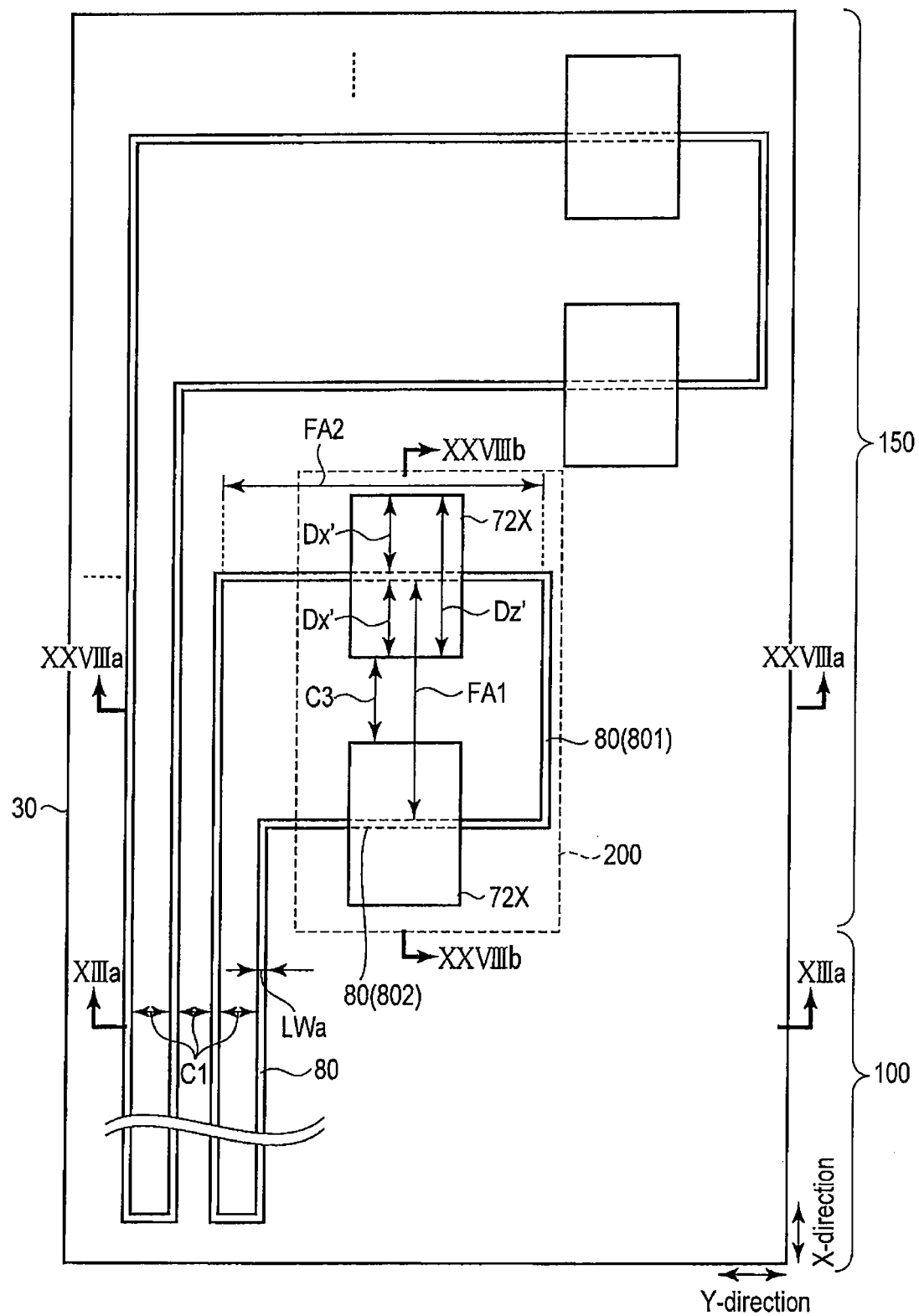
F I G. 27

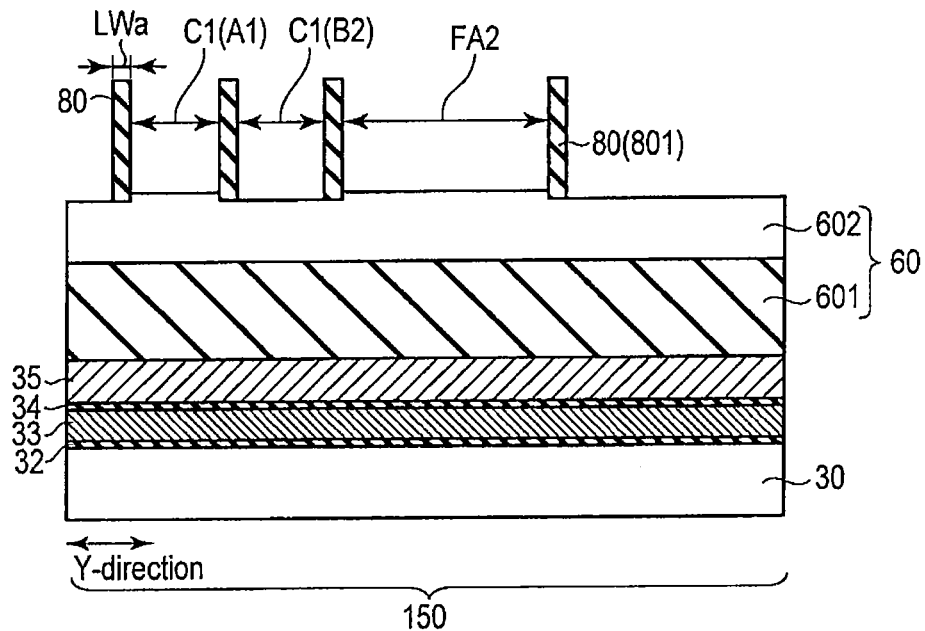
F I G. 28A
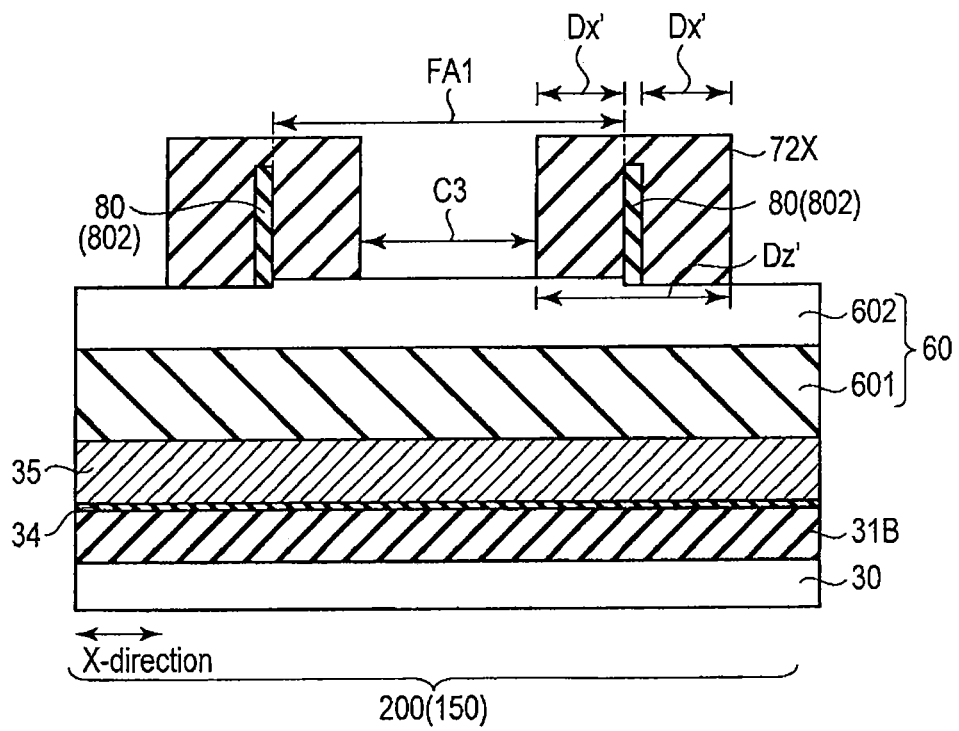
F I G. 28B

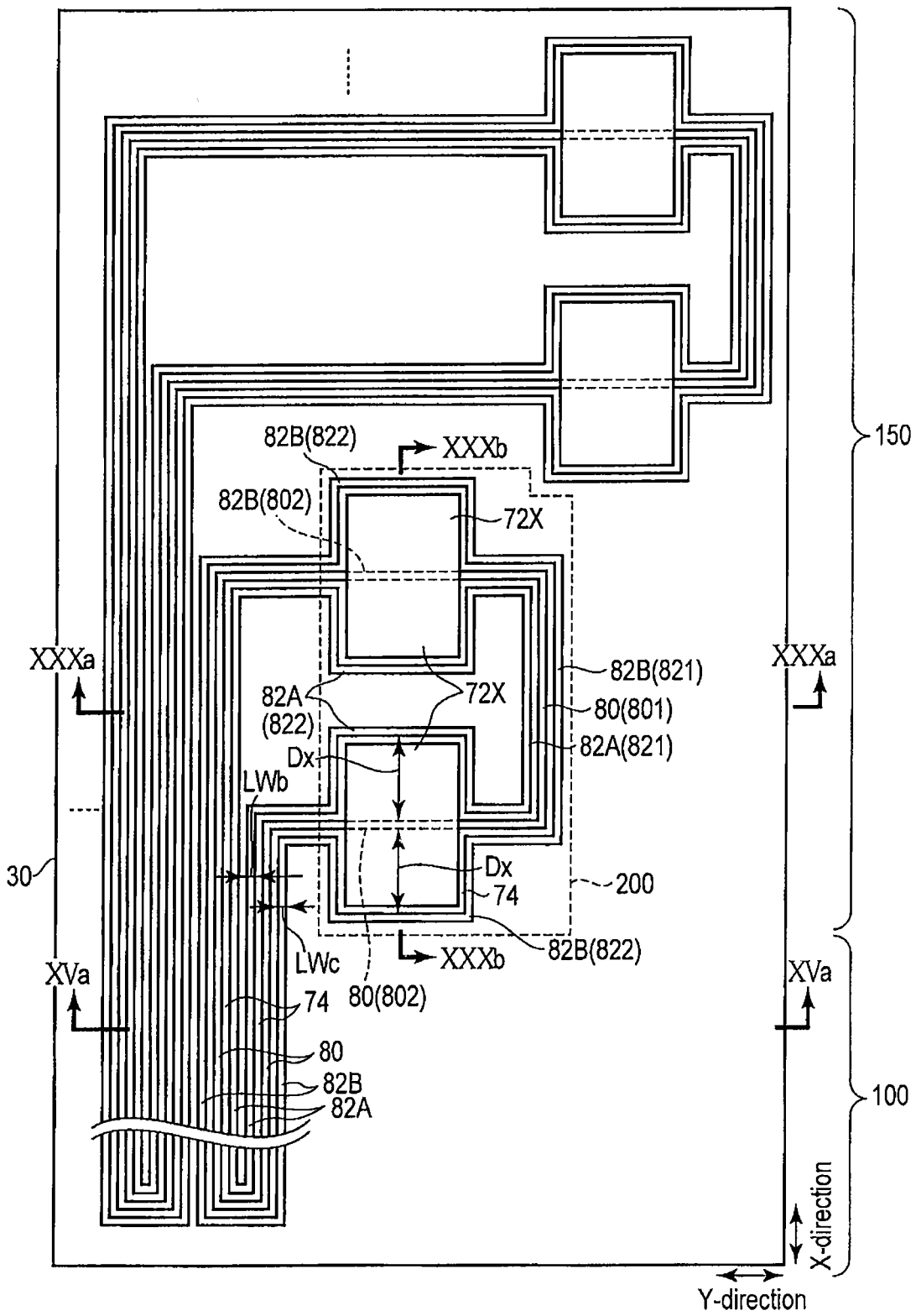
F I G. 29

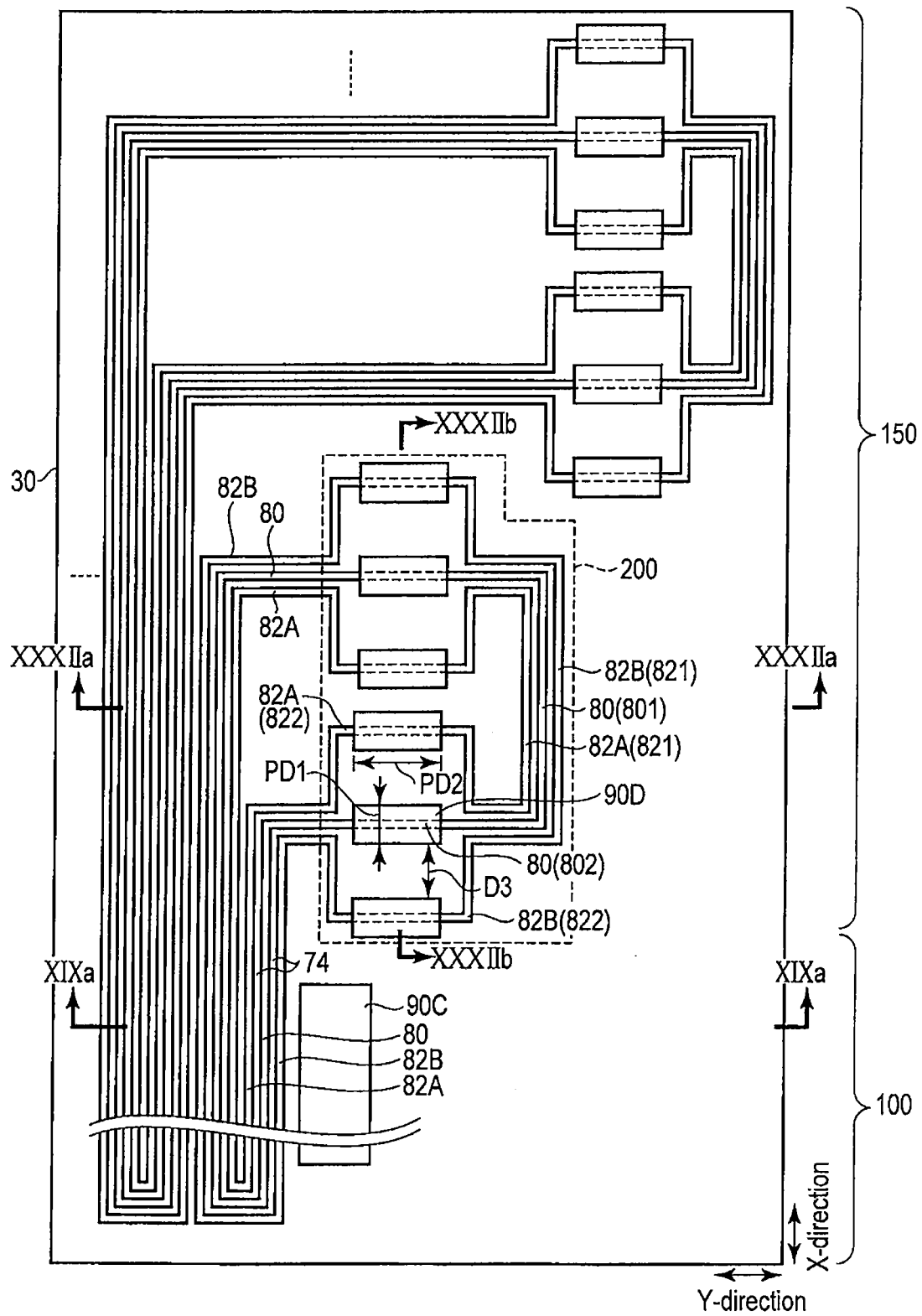
F I G. 31

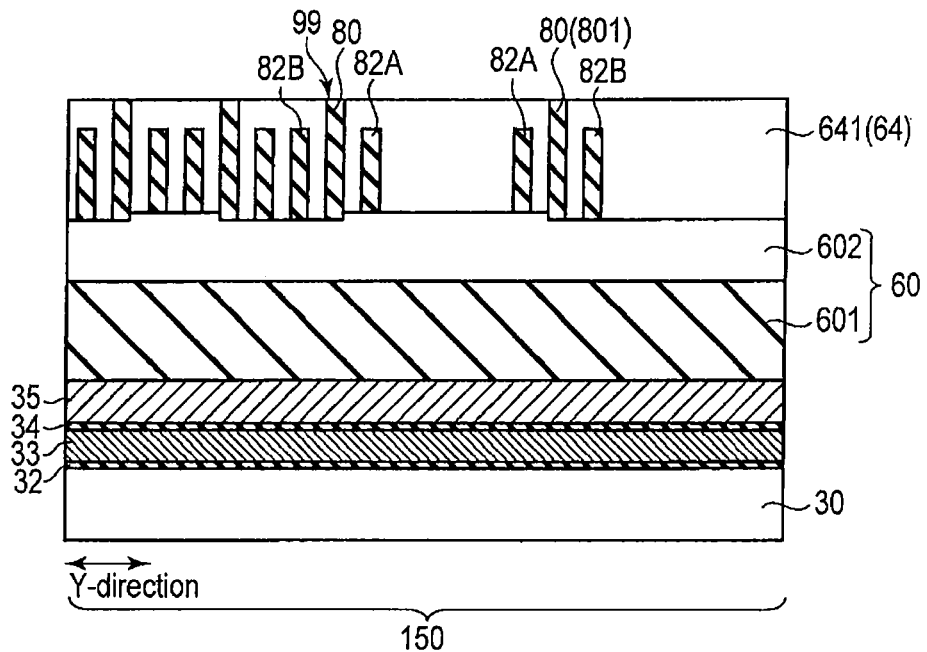
F I G. 32A
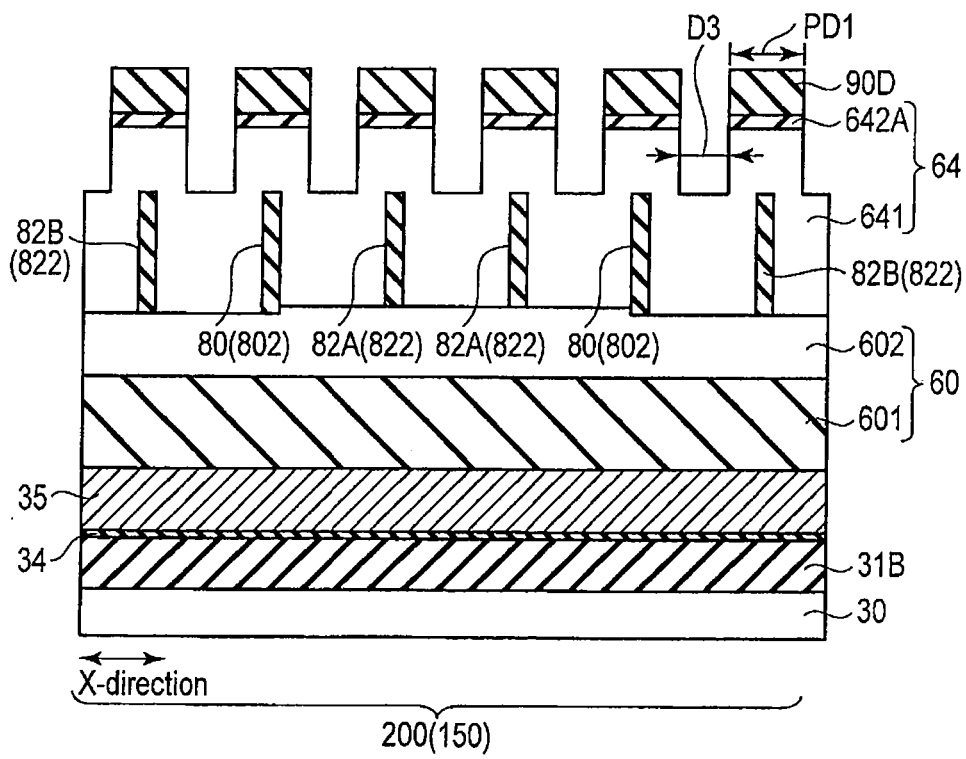
F I G. 32B

METHOD OF MANUFACTURING SEMICONDUCTOR DEVICE

CROSS-REFERENCE TO RELATED APPLICATIONS

This application is based upon and claims the benefit of priority from Japanese Patent Application No. 2012-001404, filed Jan. 6, 2012, the entire contents of which are incorporated herein by reference.

FIELD

Embodiments described herein relate generally to a method of manufacturing a semiconductor device.

BACKGROUND

With an increasingly finer structure of a semiconductor device, the formation of an interconnect pattern smaller than a critical dimension of the resolution of lithography is demanded. The sidewall transfer technology is known as a technology to form a fine interconnect pattern.

According to the sidewall transfer technology, a pattern having a dimension smaller than the critical dimension (a line width or pitch) of the resolution of lithography can be formed by a pattern transfer using a formed sidewall film as a mask.

A technique to form a pattern having a dimension less than half the resolution limit of lithography by repeating a sidewall transfer process a plurality of times is also proposed.

For example, a line & space pattern like a pattern of a memory cell of a flash memory is formed by the sidewall transfer technology. A contact pattern is formed so as to be connected to an interconnect pattern (line pattern) led from a memory cell array in a region to connect a peripheral circuit and the memory cell array. The dimension of the contact pattern is preferably larger than the dimension of the interconnect pattern.

However, it has been difficult to form a contact pattern having different dimensions from those of a line pattern in a process common to a manufacturing process to which the sidewall transfer technology to form a line & space pattern is applied.

BRIEF DESCRIPTION OF THE DRAWINGS

FIG. 1 is a schematic diagram showing an example of an overall configuration of a semiconductor device;

FIG. 3 is a schematic diagram showing an example of a plane layout of the semiconductor device;

FIGS. 5A, 5B, and 5C are sectional views showing the structure of the semiconductor device according to the first embodiment;

FIG. 9 is a plan process drawing illustrating the method of manufacturing the semiconductor device according to the first embodiment;

FIGS. 10A and 10B are sectional process drawings illustrating the method of manufacturing the semiconductor device according to the first embodiment;

FIGS. 11A and 11B are sectional process drawings illustrating the method of manufacturing the semiconductor device according to the first embodiment;

FIGS. 13A, 13B, 13C and 13D are sectional process drawings illustrating the method of manufacturing the semiconductor device according to the first embodiment;

FIGS. 15A and 15B are sectional process drawings illustrating the method of manufacturing the semiconductor device according to the first embodiment;

FIGS. 16A, 16B and 16C are sectional process drawings illustrating the method of manufacturing the semiconductor device according to the first embodiment;

FIGS. 18A and 18B are sectional process drawings illustrating the method of manufacturing the semiconductor device according to the first embodiment;

FIGS. 20A and 20B are sectional process drawings illustrating the method of manufacturing the semiconductor device according to the first embodiment;

FIGS. 21A and 21B are sectional process drawings illustrating the method of manufacturing the semiconductor device according to the first embodiment;

FIG. 22 is a plan process drawing illustrating the method of manufacturing the semiconductor device according to the first embodiment;

FIGS. 23A and 23B are sectional process drawings illustrating the method of manufacturing the semiconductor device according to the first embodiment;

FIGS. 24A, 24B, and 24C are sectional process drawings illustrating the method of manufacturing the semiconductor device according to the first embodiment;

FIG. 25 is a plan view illustrating the structure of a semiconductor device according to a second embodiment;

FIG. 26 is a sectional view illustrating the structure of the semiconductor device according to the second embodiment;

FIG. 27 is a plan process drawing illustrating a method of manufacturing the semiconductor device according to the second embodiment;

FIGS. 28A and 28B are sectional process drawings illustrating the method of manufacturing the semiconductor device according to the second embodiment;

FIG. 29 is a plan process drawing illustrating the method of manufacturing the semiconductor device according to the second embodiment;

FIG. 31 is a plan process drawing illustrating the method of manufacturing the semiconductor device according to the second embodiment; and FIGS. 32A and 32B are sectional process drawings illustrating the method of manufacturing the semiconductor device according to the second embodiment.

DETAILED DESCRIPTION

Embodiments

Figure 2:
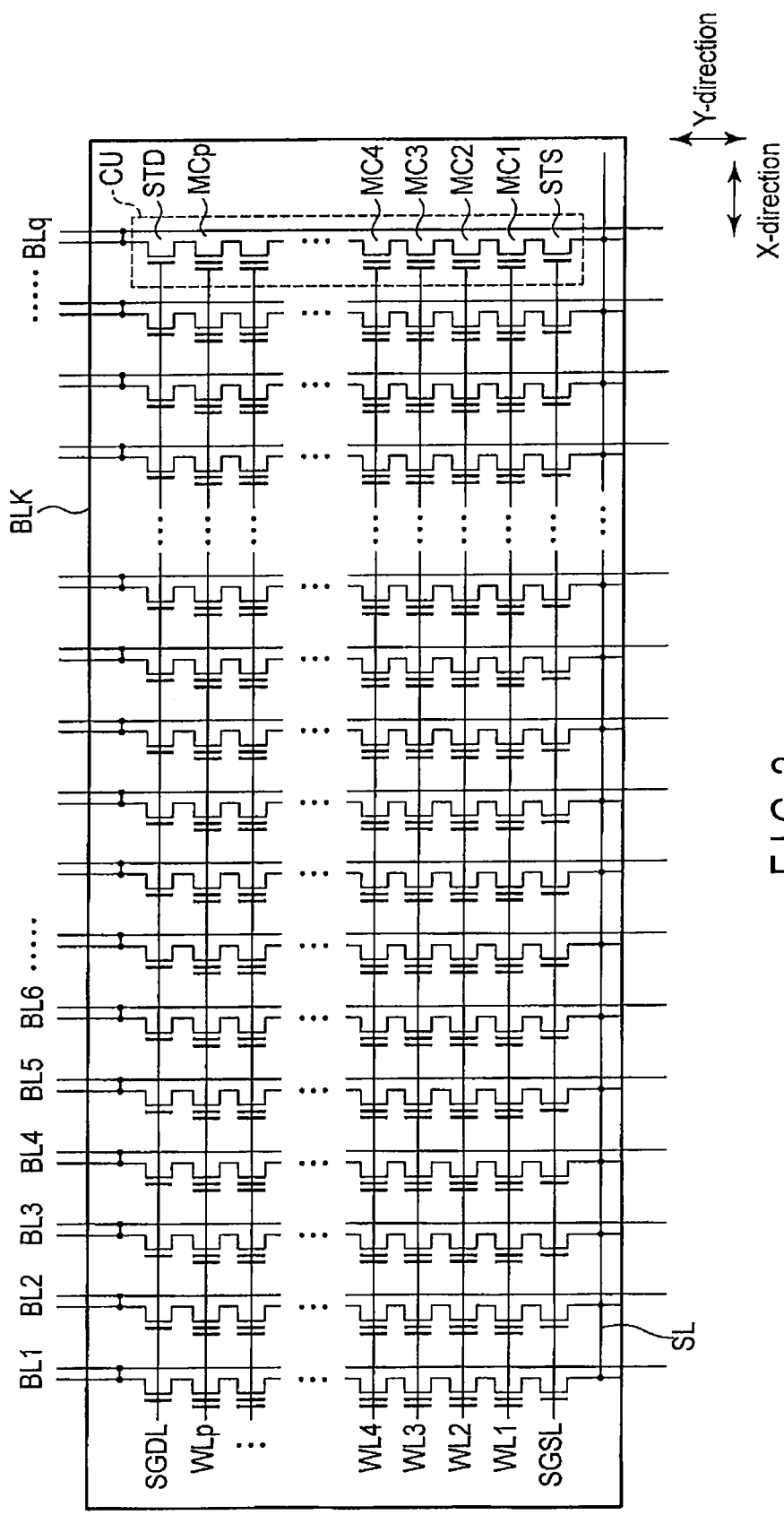
FIG. 2 is a schematic diagram showing an example of an internal configuration of the semiconductor device.

The embodiments will be described in detail below with reference to the drawings. In the description that follows, the same reference numerals are attached to elements having the same function and configuration and a duplicate description will be provided when necessary.

In general, according to one embodiment, a method of manufacturing a semiconductor device, includes forming a first sacrificial layer above a processed layer in first and second regions adjacent to each other in a first direction of a semiconductor substrate, the first sacrificial layer including a first portion extending in the first direction and having a first width and a fringe provided in the second region and having a first dimension in a second direction crossing the first direction larger than the first width; forming a first sidewall film on a side face of the first sacrificial layer; forming at least a second sacrificial layer covering at least a second portion included in the first sidewall film in the second region so as to project to both sides in a direction parallel to a width direction of the second portion from a side face of the second portion and forming a third sacrificial layer having substantially a second width smaller than the first width on a side face of the first sidewall film having the second width and the side face of the second sacrificial layer after the first sacrificial layer is removed; and forming second and third sidewall films having substantially the second width in such a way that each of the second and third sidewall films is adjacent to the first sidewall film across the third sacrificial layer by having a first interval corresponding to the second width in the first region and is adjacent to the first sidewall film across the second and third sacrificial layers by having a second interval larger than the first interval in the second region.

(1) First Embodiment (a) Overall Configuration

An overall configuration example of a semiconductor device according to the first embodiment will be described by using FIGS. 1 and 2. FIG. 1 is a block diagram showing principal units of the semiconductor device according to the present embodiment.

The semiconductor device according to the first embodiment is, for example, a semiconductor memory. However, the semiconductor device according to the first embodiment is not limited to the semiconductor memory.

A memory cell array 100 includes a plurality of memory cells (memory devices) MC. The memory cell array 100 stores data from outside.

The configuration of the memory cell array 100 will be described using FIG. 2 by taking a flash memory as an example. In a NAND flash memory, for example, a plurality of blocks as a control unit are provided in the memory cell array 100. FIG. 2 shows an equivalent circuit diagram of one block BLK in the memory cell array 100.

One block BLK includes a plurality of memory cell units CU aligned in an X direction (row direction). In one block BLK, for example, q memory cell units CU are provided. The number of bit lines BL1 to BLq assigned to the block BLK is the same as the number of the memory cell units CU in the block BLK.

One memory cell unit CU includes a memory cell string formed of a plurality (for example, p) of memory cells MC1 to MCp, a first select transistor STS (hereinafter, called the source-side select transistor) connected to one end of the memory cell string, and a second select transistor STD (hereinafter, called the drain-side select transistor) connected to the other end of the memory cell string. In the memory cell string, a current path of the memory cells MC1 to MCp is connected in series along a Y direction (column direction).

A source line SL is commonly connected to one end (source side) of q memory cell units CU, that is, one end of the current path of the source-side select transistor STS. Also, the respective bit lines BL1 to BLq are connected to the other end (drain side) of q memory cell units CU, that is, one end of the current path of the drain-side select transistor STD.

The number of memory cells forming one memory cell unit CU may be 2 or greater and may be, for example, 16, 32, or 64 or more. The memory cells MC1 to MCp are simply denoted as the memory cells MC when the memory cells MC1 to MCp are not to be distinguished below. Likewise, the source-side and drain-side select transistors STD, STS are simply denoted as the select transistor ST when the source-side and drain-side select transistors STD, STS are not to be distinguished.

The memory cell MC is a field effect transistor of a stack gate structure having a charge storage layer capable of holding charges. In the memory cell MC, the threshold of the transistor changes depending on the amount of charges in the charge storage layer. Data to be stored and the threshold voltage of the transistor are associated in the memory cell MC.

The source/drains are connected in two memory cells MC adjacent in the Y direction. Accordingly, the current path of the memory cells MC is connected in series to form a memory cell string.

The drain of the source-side select transistor STS is connected to the source of the memory cell MC1. The source of the source-side select transistor STS is connected to the source line SL. The source of the drain-side select transistor STD is connected to the drain of the memory cell MCp. The drain of the drain-side select transistor STD is connected to one corresponding bit line of the bit lines BL1 to BLq.

Word lines WL1 to WLp extend in the X direction and each of the word lines WL1 to WLp is commonly connected to gates of a plurality of memory cells MC arranged along the X direction. In one memory cell unit CU, the number of word lines WL1 to WLp is equal to the number (p) of memory cells in one memory cell string.

A source-side select gate line SGSL extends in the X direction and is commonly connected to gates of a plurality of source-side select transistors STS arranged along the X direction. A drain-side select gate line SGDL extends in the X direction and is commonly connected to gates of a plurality of drain-side select transistors STD arranged along the X direction.

The word lines WL1 to WLp are simply denoted as the word line WL when the word lines WL1 to WLp are not to be distinguished and the bit lines BL1 to BLq are simply denoted as the bit line BL when the bit lines BL1 to BLq are not to be distinguished. Likewise, the source-side and drain-side select gate lines SGSL, SGDL are simply denoted as the select gate line SGL when the source-side and drain-side select gate lines SGSL, SGDL are not to be distinguished.

A row control circuit (for example, a word line driver) 101 controls the row of the memory cell array 100. The row control circuit 101 drives the word line WL to access the selected memory cell based on an address signal from an address buffer 102.

A column decoder 103 selects a column of the memory cell array 100 based on an address signal from an address buffer 102 and drives the selected bit line BL.

A sense amplifier 104 detects and amplifies potential fluctuations of the bit line BL. Also, the sense amplifier 104 temporarily holds data read from the memory cell array 100 and data to be written into the memory cell array 100.

A well/source line potential control circuit 105 controls the potential in a well region in the memory cell array 100 and the potential of the source line SL.

A potential generator 106 generates a voltage applied to the word line WL when data is written (programmed), data is read, or data is erased. The potential generator 106 also generates a potential applied to, for example, the select gate line SGL, the source line SL, and the well region in a semiconductor substrate. The potential generated by the potential generator 106 is input to the row control circuit 101 and applied to each of the select word line WL, the non-select word line WL, and the select gate line SGL.

A data input/output buffer 107 acts as a data input/output interface. The data input/output buffer 107 temporarily holds data input from outside. The data input/output buffer 107 temporarily holds data output from the memory cell array 100 and outputs the held data to the outside at a predetermined timing.

A command interface 108 determines whether data input into the data input/output buffer 107 is command data (command signal). If data input into the data input/output buffer 107 includes command data, the command interface 108 transfers the command data to a state machine 109.

The state machine 109 controls the operation of each circuit in a flash memory in accordance with a request from outside.

(b) Structure

The structure of a semiconductor device (for example, a flash memory) according to the present embodiment will be described with reference to FIGS. 3 to 5C.

An example of the interconnect layout (wiring layout) of the flash memory according to the present embodiment will be described by using FIG. 3.

FIG. 3 is a diagram schematically showing a physical relationship between the memory cell array 100 and the row control circuit 101 and a leading region 150 arranged on the periphery of the memory cell array 100.

The memory cell array 100 is formed of a plurality of blocks arranged by being aligned in the Y direction (column direction). To simplify the description, two blocks BLKi, BLK(i+1) are shown in FIG. 3. However, the number of blocks in the memory cell array 100 is not limited to 2.

A plurality of word lines WL are provided in the blocks BLKi, BLK(i+1). Two select gate lines SGL are arranged at one end and the other end in the Y direction of each of the blocks BLKi, BLK(i+1) so as to sandwich the word lines WL in each of the blocks BLKi, BLK(i+1). In each of the blocks BLKi, BLK(i+1), one of the two select gate lines SGL is the select gate line SGL of the source-side select transistor and the other select gate line SGL is the select gate line SGL of the drain-side select transistor.

In the example shown in FIG. 3, the leading region 150 is provided at one end and the other end of the memory cell array 100. In this case, the word lines WL in the two blocks BLKi, BLK(i+1) adjacent to each other are led into the leading regions 150 on the opposite sides.

The pitch (line width of the interconnect and the interval between interconnects) of interconnects (wirings) in the memory cell array 100 is different from the pitch (line width of the interconnect and the interval between interconnect) of interconnects of peripheral circuits such as the row control circuit 101. Thus, as shown in FIG. 3, the leading region (also called a hookup region) 150 to convert the line width of the interconnect and the interval (and the pitch) of interconnects is provided in the chip (semiconductor substrate) between the memory cell array 100 and the row control circuit 101.

In the example shown in FIG. 3, the word lines WL as a whole surround the two select gate lines SGL present on the boundary side of the two blocks BLKi, BLK(i+1). The plurality of word lines WL extend in the X direction in the memory cell array 100. The plurality of word lines WL are bent in the leading region 150 to the boundary side of the two blocks BLKi, BLK(i+1) (Y direction, upward direction or downward direction in the drawing).

As shown in FIG. 3, the plurality of word lines WL are separated at an end of the memory cell array 100 or in the leading region 150 to ensure independence of each word line WL.

In the leading region 150, a contact plug (contact hole) is connected to the word line WL, for example, between the position where the word line WL is bent and the tip thereof. The contact plug (not shown) is arranged on a contact portion (not shown) provided in the leading region 150. The contact portion is connected to the word line WL in the leading region 150. The contact portion is formed of the same member (material) as the word line WL. The contact portion may also be called a pad or fringe below. Also, a portion of a word line in the leading region 150 may be called a leading line.

A region (hereinafter, called a dummy cell region) including dummy cells that do not function as memory cells may be provided between the memory cell array 100 and the leading region 150. In the present embodiment, the illustration of the dummy cell region is omitted.

FIGS. 4, 5A, 5B, and 5C are diagrams showing the structure of the flash memory according to the present embodiment.

Figure 4:
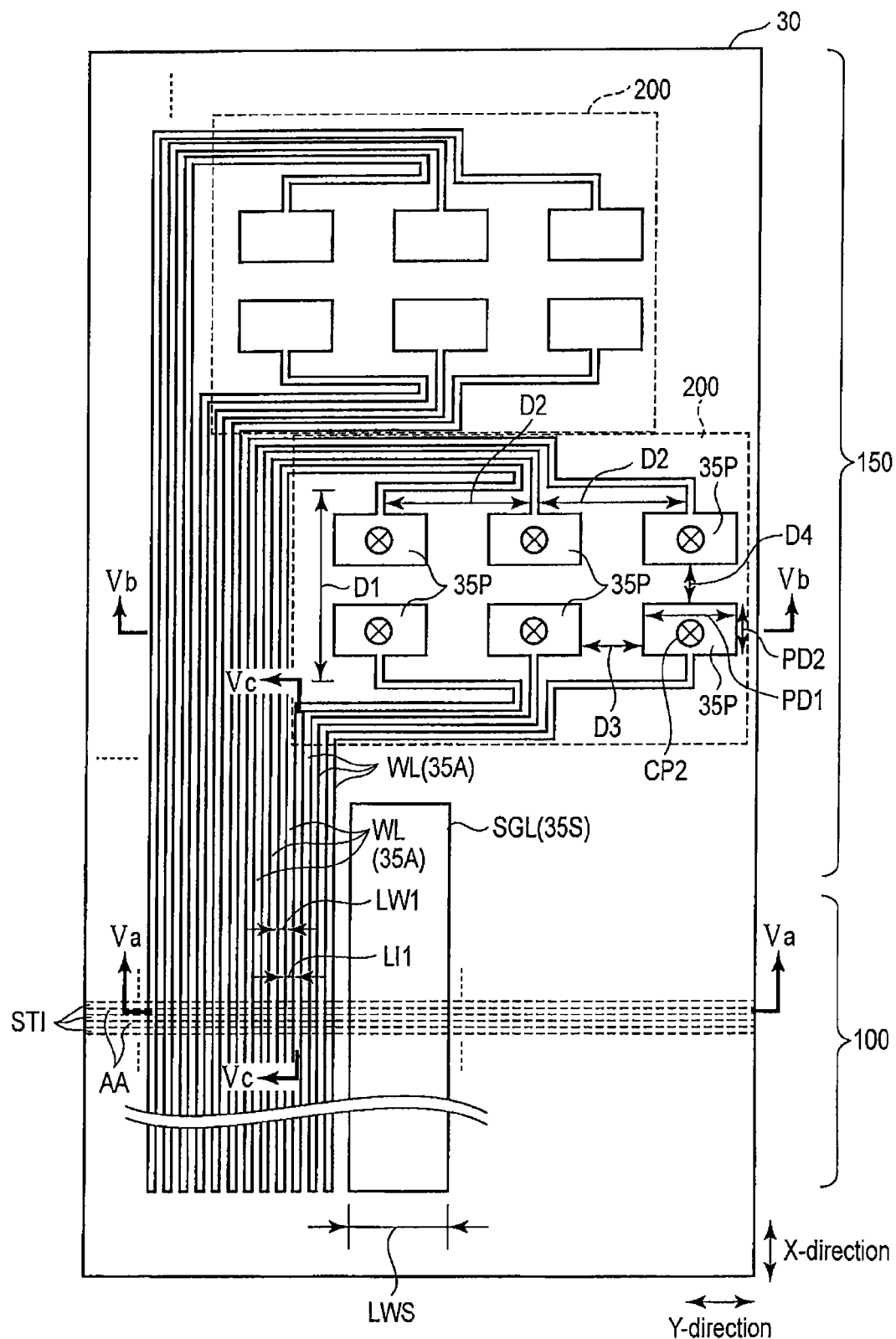
FIG. 4 is a plan view showing the structure of a semiconductor device according to a first embodiment.

FIG. 4 is a plan view showing a planar structure of the flash memory according to the present embodiment. FIGS. 5A, 5B, and 5C are sectional views showing a section structure of the flash memory according to the present embodiment. FIG. 5A is a sectional view along a Va-Va line in FIG. 4. FIG. 5B is a sectional view along a Vb-Vb line in FIG. 4. FIG. 5C is a sectional view along a Vc-Vc line in FIG. 4.

In FIGS. 4 to 5C, a portion of the structure of the memory cell array 100 and the leading region 150 is shown. In FIGS. 4 and 5, the word line WL, the memory cell MC connected to the word line WL, the select gate line SGL on one side of the memory cell unit, and the select transistor ST connected to the select gate line SGL are illustrated.

As shown in FIGS. 4 to 5C, the memory cell MC and the select transistor ST are provided on a semiconductor substrate 30 formed in a well region (not shown).

As shown in FIGS. 5A and 5C, the memory cell MC is arranged in the memory cell array 100. The memory cell MC is, as described above, a field effect transistor of a stack gate structure having a charge storage layer. The gate of the memory cell MC includes a charge storage layer 33A formed on a gate insulating film (tunnel insulating film) 32, an insulator (called an inter-gate insulating film or block insulating film) 34A formed on the charge storage layer 33A, and a control gate electrode 35A formed on the insulator 34A. In the example shown in FIGS. 5A and 5C, the charge storage layer 33A is formed by using conductive silicon. The silicon charge storage layer 33A is called the floating gate electrode 33A. Incidentally, the charge storage layer 33A may be formed by using a insulating film (for example, silicon nitride) including a trap level for electrons. The insulator 34A may have a single-layer structure including one of silicon oxide, silicon nitride, and a high-permittivity insulating film (high-k film) or a multilayer structure including a plurality of these films.

In the memory cell array 100, as shown in FIG. 5C, a device isolation insulating film 31A in an STI structure is embedded in a device isolation region STI in the semiconductor substrate 30. An active region AA is partitioned in the semiconductor substrate 30 by the isolation insulating film 31A. The active regions AA extend in the Y direction.

A plurality of the floating gate electrodes 33A arranged in the X direction are isolated by the isolation insulating film 31A for each memory cell MC.

The control gate electrode 35A extends in the X direction and is shared by a plurality of memory cells MC arranged in the X direction. The control gate electrode 35A is used as the word line WL.

Gate electrodes 33S, 35S of the select transistor ST have a structure close to the stack gate structure of the memory cell MC. The gate electrodes 33S, 35S of the select transistor ST include, for example, the first electrode layer 33S formed simultaneously with the charge storage layer 33A, an insulator 34S formed simultaneously with the inter-gate insulating film 34A and the second electrode layer 35S formed simultaneously with the control gate electrode 35A. In the select transistor ST, the first electrode layer 33S and the second electrode layer 35S are connected via an opening formed in the insulator 34S.

A plurality of the first electrode layers 33S arranged in the X direction are electrically isolated, like the floating gate electrodes 33A, by the isolation insulating film 31A. The second electrode layer 35S extends, like the control gate electrode 35A, in the X direction and is shared by a plurality of select transistors ST arranged in the X direction. The gate electrodes 33S, 35S of the select transistor ST are used as the select gate lines SGL.

Current paths of the memory cell MC and the select transistor ST are connected in series in the Y direction by, for example, a diffusion layer 39 formed in the semiconductor substrate 30. The diffusion layers 39, 39S are used as the source and drain of each of the transistors MC, ST and are shared by the adjacent transistors MC, ST. A plurality of memory cells MC and select transistors ST whose current paths are connected in series via the diffusion layers 39, 39S form a memory cell unit. The two select transistors ST adjacent in the Y direction share the diffusion layer 39S formed in the semiconductor substrate 30.

In the peripheral region adjacent to the memory cell array 100, for example, field effect transistors (hereinafter, called peripheral transistors) forming a row control circuit or column control circuit are formed in practically a simultaneous process by using the same material as the memory cell and the select transistor. The gate structure of the peripheral transistor is different from the gate structure of the select transistor only in the dimensions of the gate length and the gate width and the substantial structure thereof is the same as the structure of the select transistor.

A first inter-layer insulating film 51 is provided on the semiconductor substrate 30. In the memory cell array 100, the inter-layer insulating film 51 covers the gate electrodes 33A, 35A of the memory cell MC and the gate electrodes 33S, 35S of the select transistor ST. A contact plug CP1 is embedded in a contact hole formed in the inter-layer insulating film 51. The contact plug CP1 is connected to the diffusion layer 39S of the select transistor ST. The diffusion layer 39S is connected to a first wiring layer (intermediate interconnect) 59A on the inter-layer insulating film 51 via the contact plug CP1. The first wiring layer 59A is provided at a first interconnect level M0.

A second inter-layer insulating film 52 is stacked on the first inter-layer insulating film 51. A third inter-layer insulating film 53 is stacked on the second inter-layer insulating film 52.

If the diffusion layer 39S is shared with the drain-side select transistor STD, a second wiring layer (interconnect) BL provided at a second interconnect level M1 is connected as the bit line BL to the diffusion layer 39S via a via plug VP in the inter-layer insulating film 52, the first wiring layer 59A, and contact plug CP1. The second wiring layer BL as a bit line extends in the Y direction. The contact plug CP1 connected to each bit line BL is electrically isolated for each memory cell unit arranged in the X direction.

If the diffusion layer 39S is shared with the source-side select transistor STS, the source line SL formed by using a wiring layer at the first interconnect level M0 is connected to the diffusion layer 39S.

As shown in FIGS. 4, 5B, and 5C, the control gate electrode 35A as the word line WL extends from in the memory cell array 100 into the leading region 150. Then, in the leading region 150, the word lines WL are separated from each other to ensure independence of each word line WL. The separation location of each word line WL is not limited to the location shown in FIG. 4.

While each word line WL extends linearly in the memory cell array 100, the word line WL is bent two-dimensionally in the leading region 150. By adjusting the bending position of the word line WL led into the leading region 150, the position and size of a pad 35P and a contact plug CP2, the interval (pitch) between the pads 35P, and the interval between the contact plugs CP2 can be adjusted two-dimensionally. For example, the layout of a plurality of the contact plugs CP2 and the pads 35P can be changed by shifting in the X direction and the Y direction for each group formed by the word lines WL. Thus, the layout of the wiring layer to connect the word line WL and the row control circuit can be simplified.

The word line WL is connected to the pad 35P in the leading region 150. The pad 35P and the word line WL are continuous conductive layers.

The contact plug CP2 is provided on the pad 35P so that the pad 35P and the contact plug CP2 are electrically connected. To connect the word line WL and the row control circuit, for example, a wiring layer 59B at the first interconnect level M0 provided in the leading region 150 is provided. The wiring layer 59B extending from the row control circuit is connected to the contact plug CP2 on the pad 35P. Accordingly, the word line to which the memory cell MC is connected is connected to the row control circuit. Incidentally, the word line WL may be connected to the row control circuit by further using a wiring layer positioned at the second interconnect level M1, which is the same level as that of the bit line BL.

In the leading region 150, as shown in FIGS. 5B and 5C, an isolation insulating film 31B is provided, for example, in the semiconductor substrate 30. The isolation insulating film 31B is formed in the whole leading region 150. In the leading region 150, the pad 35P is provided on the isolation insulating film 31B via an insulator 34P formed simultaneously with the inter-gate insulating film 34A.

To clarify the description, a region 200 in the leading region 150 in which the pad (a fringe or contact portion) 35P and the contact plug CP2 are provided will also be called the contact formation region 200 below.

The gate electrode (second electrode layer) 35S of the select transistor ST as the select gate line SGL extends, for example, from in the memory cell array 100 into the leading region 150.

In the present embodiment, six word lines WL are led into one of the contact formation regions 200 in the leading region 150 as a group formed by the manufacturing method described later. Among six word lines in one group, two word lines WL on the outer side (outer circumferential side) are laid out to surround the word lines on the inner side (inner circumferential side).

The six pads 35P are provided in one of the contact formation regions 200 so as to correspond to one group of the word lines WL.

The pad 35P has, for example, a rectangular (quadrangular) plane shape. Each word line WL extends from a side of the corresponding pad 35P. The plane shape of the pad 35P may be a quadrangular shape lacking corners, a quadrangular shape with round corners, a semicircular shape, an elliptic shape, or a circular shape.

In the layout of the pads 35P connected to the respective six word lines forming a group, the three pads 35P are arranged along the Y direction and the two pads 35P are opposed in the X direction. A plurality (here six) of the pads 35P corresponding to the word lines WL of one group in the contact formation region 200 are laid out so that the pads 35P have a symmetric relation (a line symmetry or mirror image relationship) with respect to a line (symmetry axis) extending in the Y direction.

The word lines WL have a line & space pattern in the memory cell array 100.

The line & space pattern is a layout in which a line pattern (for example, a linear interconnect pattern, here a word line) and a space pattern (for example, an insulator pattern) between line patterns are alternately arranged in a predetermined period in a direction crossing an extending direction of the line pattern. For example, like the word lines WL, the layout of the active region AA of the memory cell array 100 and the device isolation region STI has a line & space pattern.

The word line WL corresponding to a line pattern in the memory cell array 100 has a certain line width (interconnect width) LW1. A width LI1 of a space pattern, that is, an interval (interconnect interval) LI1 between adjacent word lines WL in the memory cell array 100 preferably has a size approximately equal to the line width LW1 of the word line WL. For the word lines WL of such a line & space pattern in the memory cell array 100, the half pitch of an interconnect structure of the word lines WL is substantially equal to the line width LW1 of the word line WL or the interconnect interval (line interval) LI1 between the word lines WL. However, due to variations (for example, dimensional conversion differences) of processing in the manufacturing process, the line width LW1 may be different from word line WL to word line WL. Accordingly, the size of the interconnect interval (space) LI1 between the word lines WL may vary.

The dimension of the memory cell MC in a channel length direction is substantially equal to the line width LW1 of the word line WL.

In a flash memory according to the present embodiment, an interconnect (for example, the word line WL) of the flash memory is formed by the sidewall transfer technology. The line width LW1 of the word line WL of the flash memory according to the present embodiment is smaller than the critical dimension (limit dimension) of the resolution of lithography.

For example, a sidewall film (sidewall mask) as a mask pattern to form the word line WL is formed by the manufacturing method described later in such a way that an interconnect structure of the half pitch of about ⅙ the critical dimension of the resolution of photolithography is formed. In this case, the line width LW1 of the formed word line WL has a dimension about ⅙ the critical dimension of the resolution of photolithography.

In the memory cell array 100 including an interconnect structure of a line & space pattern like the flash memory according to the present embodiment, if the interval LI1 between the word lines WL adjacent to each other has substantially the same dimension as the line width LW1 of the word line WL, the interval LI1 between the word lines WL is set to a size about ⅙ the critical dimension of the resolution of photolithography.

For example, ⅙ the critical dimension of the resolution of photolithography corresponds to the size of 14 nm to 16 nm. However, this value changes depending on specs of the apparatus used to manufacture the flash memory, such as the light source of exposure or a numerical aperture of a lens.

If the half pitch of an interconnect structure, the line width LW1 of the word line WL, and the interconnect interval L1' of the word line WL are dimensions less than the critical dimensions of the resolution of photolithography formed by the sidewall transfer technology, such dimensions may be dimensions (for example, ½ to ¼ the critical dimension of the resolution of photolithography) larger than ⅙ the critical dimension of the resolution of photolithography or dimensions smaller than ⅙ the critical dimension of the resolution of photolithography.

A dimension PD1 of the pad (contact portion) 35P in the Y direction and a dimension PD2 of the pad 35P in the X direction in the contact formation region 200 of the leading region 150 are set to a dimension larger than the line width LW1 of the word line WL. With the dimensions PD1, PD2 of the pad 35P set larger than the line width LW1 of the word line WL, contact resistance generated between the contact plug CP2 and the word line WL can be reduced and a contact failure between the contact plug CP2 and the word line WL caused by alignment shifts can be controlled.

A line width LWS of the select gate line SGL is larger than the line width LW1 of the word line WL. No pad is connected to the select gate line SGL and a contact plug (not shown) is provided on the select gate line SGL in the leading region 150.

In the flash memory according to the present embodiment, interconnect intervals D1, D2 between word lines (leading lines) WL in the X direction and the Y direction in the contact formation region 200 of the leading region 150 respectively are larger than at least one of the line width LW1 of the word line WL and the interval LI1 between the word lines WL in the memory cell array 100.

In the flash memory according to the present embodiment, the interconnect intervals D1, D2 between word lines WL in the X direction and the Y direction in the contact formation region 200 respectively are larger than ⅙ the critical dimension of the resolution of photolithography. The interconnect intervals D1, D2 between word lines WL in the contact formation region 200 respectively are more preferably equal to the critical dimension of the resolution of photolithography or more.

An interval D3 between the pads 35P adjacent to each other in the Y direction and an interval D4 between the pads 35P in the X direction in the contact formation region 200 are preferably larger than ⅙ the critical dimension of the resolution of photolithography and the intervals D3, D4 between the pads 35P are particularly preferably equal to the critical dimension of the resolution of photolithography or more.

If the intervals D1, D2 between the word lines WL near the formation position of the pad 35P are larger than the interconnect interval LI1 between the word lines WL in the memory cell array 100, the interconnect interval between the word lines WL in the entire leading region 150 (in the contact formation region 200) may not be larger than the interval LI1 between the word lines WL in the memory cell array 100.

For the bit lines BL of a line & space pattern, the relationship between the line width and the interconnect interval of the bit lines BL in the memory cell array 100 and the leading region in the Y direction may have the same relationship as the relationship between the line width LW1 of the word line WL and the interconnect intervals LI1, D1, D2 of the word lines WL in the memory cell array 100 and the leading region 150 in the X direction.

In a semiconductor device (for example, a flash memory) according to the present embodiment, interconnects (for example, word lines or bit lines) having a line & space pattern of dimensions smaller than the critical dimension of the resolution of photolithography are formed by the formation of a sidewall film and a transfer process (sidewall transfer technology) using the sidewall film as a mask.

In the flash memory according to the present embodiment, each of a plurality of word lines WL formed by the manufacturing method described later has the line width LW1 smaller than the critical dimension of the resolution of photolithography (for example, a dimension about ⅙ the critical dimension of the resolution of photolithography) and the interconnect interval LI1 smaller than the critical dimension of the resolution of photolithography (for example, a dimension about ⅙ the critical dimension of the resolution of photolithography) to be adjacent to each other in the memory cell array 100.

If the interconnect interval between the word lines WL in the contact formation region 200 of the leading region 150 is the same as the interconnect interval LI1 of the word lines WL in the memory cell array 100, it may become difficult to secure a space to form and arrange the pad 35P connected to the word line WL.

In the flash memory according to the present embodiment, the interconnect intervals D1, D2 of the word lines WL in the contact formation region 200 of the leading region 150 are made larger than the interconnect interval LI1 of the word lines WL (or the line width LW1 of the word line WL) in the memory cell array 100 by adjusting each of the size of a fringe of a sacrificial layer to form a sidewall mask in the first sidewall mask formation process and the size of the sacrificial layer (spacer layer) covering the first sidewall mask formed before the second sidewall mask formation process in the manufacturing method of a semiconductor device described later. Also, the bending position of the word line WL in the X direction and the Y direction in the leading region 150 is adjusted by the formation position of the sacrificial layer.

In this manner, the interconnect intervals D1, D2 larger than the interconnect interval (or the half pitch) LI1 in the interconnect structure of line & space pattern in the memory cell array 100 are secured in the leading region 150. As a result, the flash memory according to the present embodiment can secure a space to arrange the pad 35P and a mask to form the pad 35P and also a space to increase a processing margin of the pad 35P and the mask in the leading region 150.

The flash memory according to the present embodiment can secure the intervals D1, D2 that prevent the pad 35P connected to each interconnect WL from coming into contact with (short-circuiting) the other adjacent interconnects WL or the other adjacent pads 35P in the leading region 150. Thus, the flash memory according to the present embodiment can make the line width LW1 of an interconnect and the interconnect interval LI1 (or the pitch) in the memory cell array 100 finer and also reduce failures caused by short-circuits of the interconnect WL, the pad 35P, and the contact plug CP2 in the contact formation region 200 of the leading region 150.

Because the intervals D1, D2 between the interconnects WL in the leading region 150 can be increased, the dimensions PD1, PD2 of the pad 35P connected to the interconnects WL can also be increased. As a result, a contact area of the pad 35P and the contact plug CP2 can be increased so that the contact resistance between the pad 35P and the contact plug CP2 can be decreased. Thus, the flash memory according to the present embodiment can improve electric characteristics of the memory and enhance operation characteristics.

Therefore, according to the first embodiment, reliability of contact formation in a semiconductor device including a fine pattern can be enhanced without using complex manufacturing processes.

(b) Manufacturing Method

The method of manufacturing a semiconductor device (for example, a flash memory) according to the first embodiment will be described with reference to FIGS. 4 to 24C.

Figure 6:
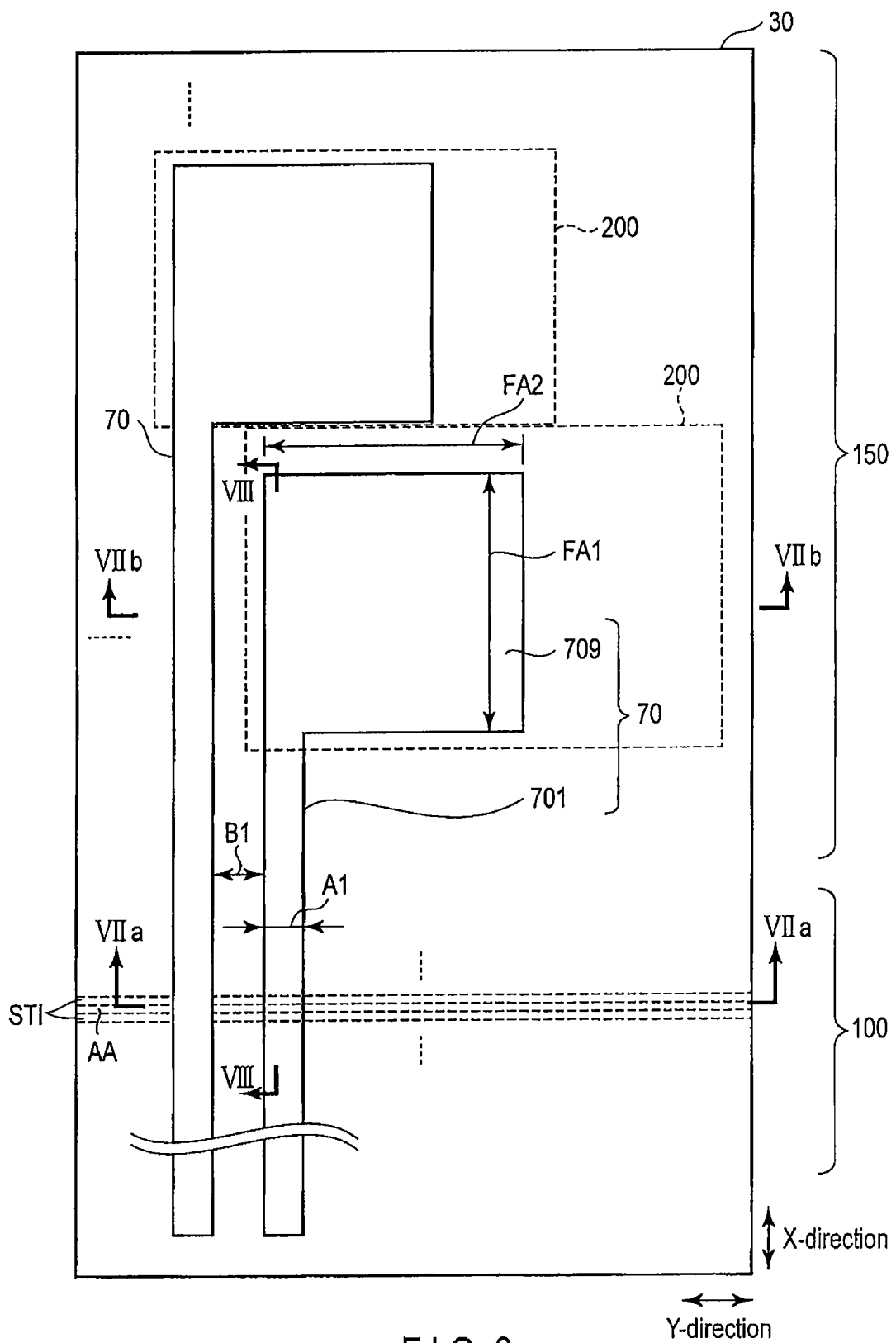
FIG. 6 is a plan process drawing illustrating a method of manufacturing the semiconductor device according to the first embodiment.
Figure 7A:
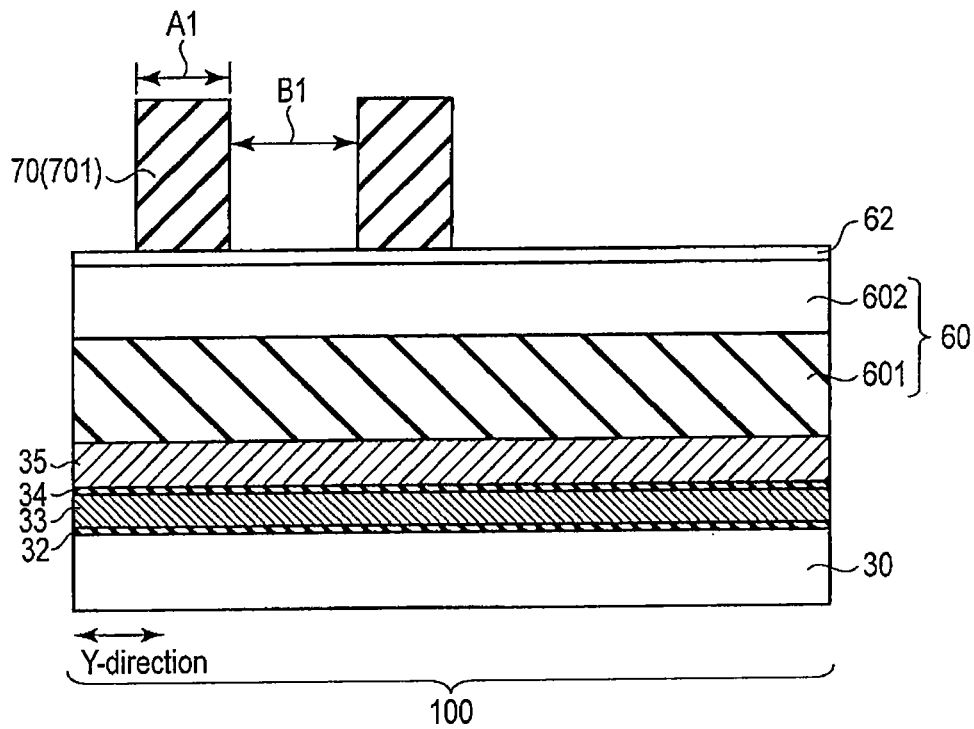
FIGS. 7A and 7B are sectional process drawings illustrating the method of manufacturing the semiconductor device according to the first embodiment.
Figure 7B:
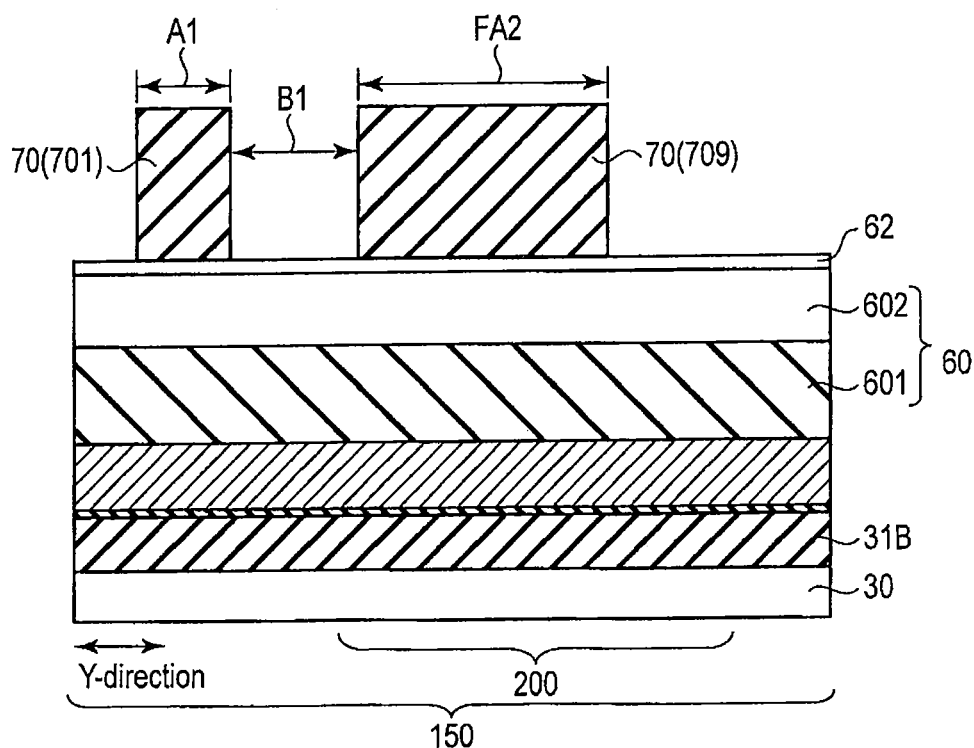
Figure 8:
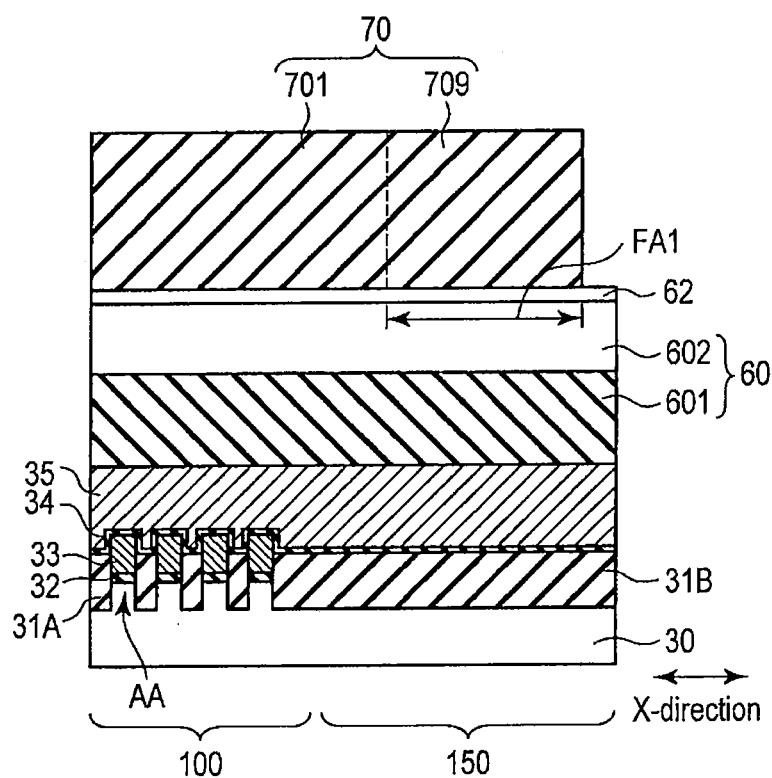
FIG. 8 is a sectional process drawing illustrating the method of manufacturing the semiconductor device according to the first embodiment.

A process of the method of manufacturing a flash memory according to the present embodiment will be described using FIGS. 6 to 8. FIG. 6 shows a plan view of a portion of the memory cell array 100 and the leading region 150 of a flash memory in a process of the method of manufacturing a flash memory according to the present embodiment. FIGS. 7A and 7B show sectional process drawings corresponding to FIG. 6. FIG. 7A shows a sectional process drawing along a VIIa-VIIa line in FIG. 6. FIG. 7B shows a sectional process drawing along a VIIb-VIIb line in FIG. 6. FIG. 8 shows a sectional process drawing along a VIII-VIII line in FIG. 6.

As shown in FIGS. 6 to 8, the insulating film 32 (for example, silicon oxide) is formed on the semiconductor substrate 30 on which a well region (not shown) is formed in the memory cell array 100, in the leading region 150, and in the peripheral region. The insulating film 32 is formed by, for example, thermal oxidation of the silicon substrate. The insulating film 32 is used as the gate insulating film (tunnel insulating film) of a memory cell, the gate insulating film of a select transistor, or the gate insulating film of a peripheral transistor.

A first conductive layer (for example, polysilicon) 33 is formed on the insulating film 32 by a CVD (Chemical Vapor Deposition) method. The conductive layer 33 on the insulating film 32 is used as the floating gate electrode of a memory cell, a portion of the gate electrode (first electrode layer) of a select transistor, or a portion of the gate electrode of a peripheral transistor. Instead of polysilicon, an insulating film such as silicon nitride including a trap level of charges (electrons) may be formed on the insulating film 32.

Then, a mask layer (not shown) is formed on the conductive layer 33. Subsequently, a predetermined pattern for the mask layer on the conductive layer 33 is formed by photolithography or sidewall transfer technology. The mask layer is processed by, for example, RIE (Reactive Ion Etching). Accordingly, the mask layer (not shown) having a line & space pattern extending in the Y direction is formed on the conductive layer 33 in the memory cell array 100. For example, the mask layer is removed by RIE in the leading region 150 and an upper surface of the conductive layer 33 is exposed. A conductive layer in the peripheral region is selectively covered with the mask layer.

Based on the mask layer of the line & space pattern, the conductive layer 33, the insulating film 32, and the semiconductor substrate 30 are processed by, for example, RIE. Accordingly, in the memory cell array 100, a device isolation trench extending in the Y direction is formed in the memory cell array 30. The device isolation trench in the memory cell array 100 has an STI (Shallow Trench Isolation) structure. The processed conductive layer 33 and a semiconductor region (active region) AA below extend in the Y direction. In the leading region 150, the conductive layer and the insulating film are removed by RIE to form a trench (groove).

Then, in the memory cell array 100 and the leading region 150, the insulating films 31A, 31B are formed on the semiconductor substrate 30 in such a way that the trench is filled. Accordingly, as shown in FIG. 8, in the memory cell array 100, the isolation insulating film 31A is embedded in the device isolation groove in the device isolation region STI to partition device formation regions (active regions) AA in which memory cells are arranged. A line & space pattern of the device isolation region (insulating film) STI and the device formation region (semiconductor region) AA is formed on the surface layer of the semiconductor substrate 30 in the memory cell array 100. Also, as shown in FIGS. 7B and 8, the trench of the leading region 150 is filled with the isolation insulating film 31B.

Also in the peripheral region, a device formation region surrounded by a device isolation region (isolation insulating film) is formed. As in the interior of the memory cell array 100, the isolation insulating film and semiconductor region in a line and space pattern may be formed in the leading region 150.

The mask layer on the conductive layer 33 is selectively removed. The mask layer, the conductive layer 33, and the insulating film 32 may be processed or removed by using wet etching or ashing.

After the mask layer on the conductive layer 33 is removed, an insulator (insulating film) 34 in a single-layer structure or multilayer structure is formed on the conductive layer 33 by, for example, the CVD method, ALD (Atomic Layer Deposition) method, or chemical reaction treatment (oxidation treatment, nitriding treatment, or radical treatment of the above treatment). The insulator 34 is used as the inter-gate insulating film of memory cells or block insulating film. Openings (slits) are formed in the insulator 34 in the formation region of the select gate line and the peripheral region so that the upper surface of the conductive layer 33 is exposed.

A second conductive layer 35 is formed on the insulator 34. One of silicon (for example, polysilicon), silicide, and polycide (stacked material of polysilicon and silicide) is used for the conductive layer 35. However, the conductive layer 35 may be a metal (a single element metal or alloy). The conductive layer 35 is used as the control gate electrode (word line WL) of a memory cell or the gate electrode (select gate line) of a select transistor. If silicide or polycide is used for the control gate electrode (word line) of a memory cell, polysilicon may be deposited as the conductive layer 35 to form silicide or polycide by chemical reaction treatment (heat treatment) on polysilicon and metal after the gate of the memory cell is processed.

As described above, formation members of the memory cell, select transistor, and peripheral transistor are formed on the semiconductor substrate 30. A member (layered product of members) to form an interconnect (such as a word line, select gate line, and gate electrode) or a device (such as a memory cell and transistor) may also be called a processed layer.

As shown in FIGS. 7A, 7B, and 8, a mask layer 60 is deposited on processed layers 33 to 35. For example, the mask layer (also called the hard mask layer) 60 is formed so as to have a stacked structure including a plurality of films 601, 602. As the first hard mask 601, the silicon oxide 601 is deposited on the processed layers 33 to 35 by, for example, the CVD method. As the second hard mask 602, the amorphous silicon film 602 is deposited on the silicon oxide 601 by the CVD method. The thickness of the silicon oxide 601 as the first hard mask 601 is set to, for example, about 200 nm and the thickness of the amorphous silicon film 602 as the second hard mask 602 is set to, for example, about 75 nm.

In the present embodiment, the mask layer 60 in a two-layer structure is illustrated as the mask layer 60 on the processed layers 33 to 35. However, if the processing selection ratio (etching selectivity or etching selection ratio) of the member in the upper or lower layer and the mask layer 60 can be secured, the mask layer 60 may have a single-layer structure. Alternatively, the mask layer 60 may have a stacked structure of three layers or more.

A BARC (Bottom Anti-Reflection Coating) film 62 is deposited on the mask layer 60 as an antireflection film. The BARC film 62 is formed so as to have a thickness of, for example, 30 nm. The BARC film 62 is formed of, for example, a carbon film or a compound film containing carbon.

A sacrificial layer 70 having a predetermined shape is formed on the BARC film 62 by photolithography and etching. The sacrificial layer 70 is used as a core material to form a sidewall mask corresponding to the pattern of an interconnect (word line). In the present embodiment, the process to form a sidewall film (sidewall mask) as a mask corresponding to the pattern of an interconnect will be called the sidewall mask formation process. A plurality of the sacrificial layers 70 are formed on the BARC film 62 in accordance with the number of word lines formed in the memory cell array 100 (and blocks).

For example, a resist material is used for the sacrificial layer (also called the core material) 70. The sacrificial layers 70 are patterned so as to have a planar shape having a linear portion (called the linear or first portion) 701 and a fringe 709 connected to the linear portion 701.

For example, immersion exposure technology using an ArF laser is used for photolithography to pattern the sacrificial layer 70. The critical dimension of the resolution of photolithography by the immersion exposure technology, for example, the minimum half pitch (or the line width or interconnect interval) of the formed interconnect is represented by k1×(λ/NA). "λ" is the wavelength (exposure wavelength) of the light source used for photolithography, "NA" is the numerical aperture of a lens of an exposure device, and "K1" is a process parameter (process difficulty) in photolithography.

Regarding the direction crossing the direction in which the linear portion 701 of the sacrificial layer 70 extends, here the Y direction, a dimension FA2 of the fringe 709 of the sacrificial layer 70 in the Y direction is formed to be larger than a line width A1 of the linear portion 701. A dimension FA1 of the fringe 709 in the X direction is larger than the line width A1 of the linear portion 701. The fringe 709 is connected to an end of the linear portion 701 in the leading region 150 so as to project to the boundary side of a block. For example, the fringes 709 project in the same direction (to the boundary side of a block) in a plurality of the sacrificial layers 70 in one block.

The fringe 709 of each of the sacrificial layers 70 is each formed in the contact formation region 200 of the leading region 150 to secure a space to form a pad to be connected to an interconnect and a contact plug.

The size of the sacrificial layer 70 may be adjusted so as to have a dimension less than the critical dimension of the resolution of photolithography by slimming (etch-back or control of the exposure time to a resist film) the sacrificial layer 70.

A structure in which the fringe 709 larger than the size of the linear portion 701 is connected to an end of the linear portion 701 will be called a flag structure below.

In a flash memory formed by the manufacturing method according to the present embodiment, the dimension (the line width, interconnect interval, or half pitch) of an interconnect structure of a line & space pattern in the memory cell array 100 is formed so as to be ⅙ the critical dimension of the resolution of photolithography. In the present embodiment, for example, the line width of an interconnect (word line) and the interconnect interval (space dimension) in a line & space pattern are set to substantially the same dimension (for example, about 15 nm). For example, the half pitch of the interconnect structure formed of interconnects and spaces in the memory cell array 100 is set to about 15 nm.

In the present embodiment, if the interconnect structure in a line & space pattern in the memory cell array 100 is formed so as to have the half pitch (the line width or interconnect interval) of about ⅙ the critical dimension of the resolution of photolithography, the line width A1 of the linear portion 701 of the sacrificial layer 70 is set to the size substantially five times the half pitch of the formed interconnect structure and an interval B1 between the linear portions 701 of the sacrificial layers 70 adjacent to each other is set to the size substantially seven times the half pitch of the formed interconnect structure. If the line width of the formed interconnect and the interconnect interval are 15 nm, the sacrificial layer 70 is patterned in such a way that the line width A1 of the sacrificial layer 70 becomes 75 nm and the interval B1 between the sacrificial layers 70 adjacent to each other becomes 105 nm. For example, the thickness (height, which is a dimension in a direction perpendicular to the surface of the semiconductor substrate 30) of the sacrificial layer 70 is set to about 170 nm.

By considering the thickness of each member and the combination of materials as described above, the processing selection ratio (etching selectivity) between members on the processed layers is secured.

A process of the method of manufacturing a flash memory according to the present embodiment will be described using FIGS. 9 to 11B. FIG. 9 shows a plan view of a portion of the memory cell array 100 and the leading region 150 of a flash memory in a process of the method of manufacturing a flash memory according to the present embodiment. FIGS. 10A and 10B show sectional process drawings corresponding to FIG. 9. FIG. 10A shows a sectional process drawing along an Xa-Xa line in FIG. 9. FIG. 10B shows a sectional process drawing along an Xb-Xb line in FIG. 9. FIGS. 11A and 11B show sectional process drawings of a process following the manufacturing process in FIGS. 10A and 10B. FIG. 11A corresponds to the process subsequent to FIG. 10A and FIG. 11B corresponds to the process subsequent to FIG. 10B.

As shown in FIGS. 9 to 11B, a sidewall film (sidewall mask) corresponding to an interconnect pattern is formed on the side face of the first sacrificial layer 70 in the first sidewall mask formation process shown below.

As shown in FIGS. 10A and 10B, the BARC film 62 is vertically etched by RIE using an $O_2$ (oxygen) gas and the upper surface of the hard mask layer 60 (here, the amorphous silicon film 602) below the BARC film 62 is exposed. The BARC film 62 between the sacrificial layer 70 and the hard mask layer 60 remains. The upper surface of the amorphous silicon film 602 of the hard mask layer 60 may be over-etched by etching of the BARC film 62.

As shown in FIGS. 10A and 10B, a material (sidewall material) 89 to form a sidewall mask is formed on the sacrificial layer 70, the BARC film 62, and the hard mask layer 60. The sidewall material 89 is formed by using, for example, silicon nitride ($Si_3N_4$ film).

For example, the sidewall material 89 is formed by the ALD (Atomic Layer Deposition) method at the formation temperature of 70° C. to 100° C. so as to cover the side face and the upper surface of the sacrificial layer 70. Silicon nitride as the sidewall material 89 can form the silicon nitride 89 with good coverage of the sacrificial layer 70 by being deposited using the ALD method. A thickness t1 of the deposited sidewall material 89 is set to a size corresponding to the line width (here, about 15 nm) of the formed interconnect.

Etching of the sidewall material 89 is performed by RIE using a gas such as $CF_4$ and $CHF_3$. For example, the upper surface of the hard mask layer 60 may be etched by etch-back of the sidewall material 89.

As shown in FIGS. 9, 11A, and 11B, a first sidewall mask (sidewall film) 80 self-aligningly remains on the side face of the first sacrificial layer 70. A maximum dimension LWa in the direction parallel to the surface of the semiconductor substrate 30 (thickness t1 in the direction parallel to the surface of the semiconductor substrate 30) of the sidewall mask 80 remaining on the side face of the sacrificial layer 70 is, for example, substantially the same dimension as the thickness t1 (here, 15 nm) in the direction parallel to the surface of the semiconductor substrate 30 when the sidewall material 89 is deposited.

Formation conditions for the sidewall material in the sidewall mask formation process and etching conditions for the sidewall material are adjusted when appropriate so that the line width LWa of the sidewall mask 80 is substantially the same as, for example, the line width LW1 of the formed word line WL. However, before the sacrificial layer 70 is removed (immediately after the sidewall mask 80 is formed), the line width LWa (thickness t1) of the sidewall mask 80 may be larger than the line width LW1 of the formed word line WL. For example, when a sidewall material to form the sidewall mask 80 is deposited, a sidewall material having the thickness (for example, two to four times the thickness) larger than the line width of the formed interconnect is deposited and the sidewall material is etched back to form the sidewall mask 80 having a line width larger than the line width of the formed interconnect. In the following process or subsequent process, etching of the sidewall mask 80 is performed so that the line width LWa of the sidewall mask 80 becomes substantially the same as the line width LW1 of the formed word line WL.

The sidewall mask 80 is formed so as to surround the sacrificial layer 70. The sidewall mask 80 forms a closed loop shape along the shape of the sacrificial layer 70 and extends from in the memory cell array 100 into the leading region 150. For example, the upper end of the sidewall mask 80 is positioned more to the side of the semiconductor substrate than the upper end of the sacrificial layer 70.

The formed sidewall mask 80 has a linear planar shape extending in the X direction along the linear portion 701 of the sacrificial layers 70 in the memory cell array 100. The sidewall mask 80 is bent two-dimensionally from the X direction to the Y direction or from the Y direction to the X direction in the leading region 150 in accordance with the shape of the fringe 709 of the sacrificial layer 70. The position of bending of the sidewall mask 80 in the leading region 150 can be adjusted by adjusting the size and formation position of the fringe 709.

As described above, the interval B1 between the linear portions 701 of the adjacent sacrificial layers 70 before the sidewall mask 80 is formed is set to the size about seven times the line width of the formed interconnect and the line width LWa of the sidewall mask 80 is set to the line width LW1 of the formed interconnect. Thus, as shown in FIGS. 9 and 11A, after the sidewalls 80 are formed, an interval B2 between the sidewalls 80 opposite to each other in the Y direction without sandwiching the sacrificial layer 70 therebetween in the memory cell array 100 is substantially the same size (dimension about five times the formed interconnect) as the interval A1 between the sidewalls 80 opposite to each other in the Y direction by sandwiching the sacrificial layer 70 therebetween, that is, the line width A1 of the linear portion 701 of the sacrificial layer 70. The sidewalls 80 opposite to each other without sandwiching the sacrificial layer 70 therebetween are sidewalls formed for each of the sacrificial layers 70 adjacent to each other.

As shown in FIGS. 9 and 11B, the intervals FA1, FA2 between the sidewalls 80 on the side faces of the fringe 709 in the leading region 150 in the X direction and the Y direction are larger than the intervals A1, B2 between the sidewall masks 80 in the memory cell array 100 in the Y direction respectively.

Thus, the first sidewall mask 80 is formed by using the sacrificial layer 70 in a flag structure as a core material in the first sidewall mask formation process.

Figure 12:
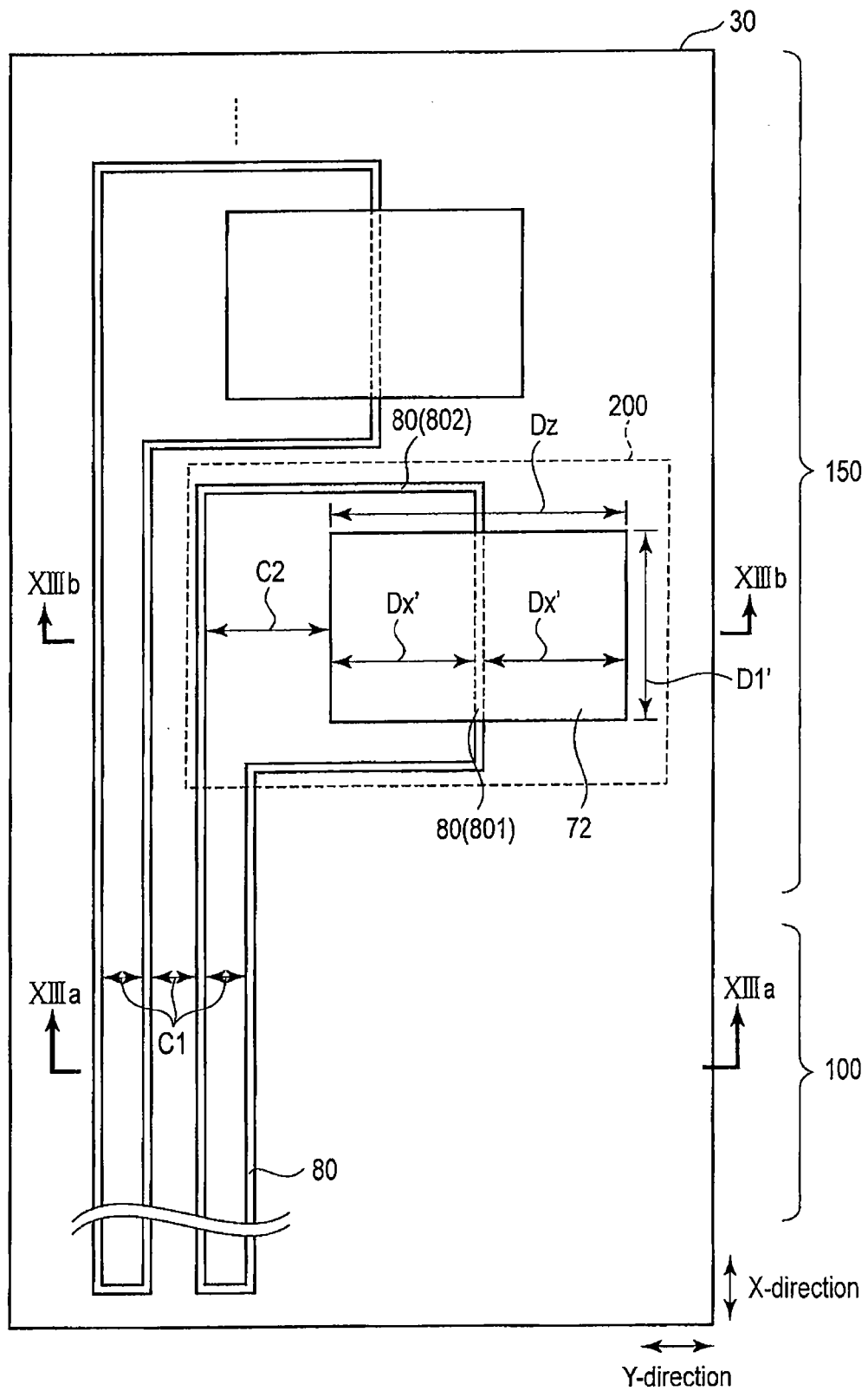
FIG. 12 is a plan process drawing illustrating the method of manufacturing the semiconductor device according to the first embodiment.

A process of the method of manufacturing a flash memory according to the present embodiment will be described using FIGS. 12 to 13B. FIG. 12 shows a plan view of a portion of the memory cell array 100 and the leading region 150 of a flash memory in a process of the method of manufacturing a flash memory according to the present embodiment. FIGS. 13A and 13B show sectional process drawings corresponding to FIG. 12. FIG. 13A shows a sectional process drawing along an XIIIa-XIIIa line in FIG. 12. FIG. 13B shows a sectional process drawing along an XIIIb-XIIIb line in FIG. 12.

As shown in FIGS. 12, 13A, and 13B, after the sidewall mask 80 is formed, the sacrificial layer as core materials to form the sidewall mask 80 and the BARC film below are selectively removed by etching (ashing) using, for example, an $O_2$ gas. The sidewall mask 80 in the closed loop shape remains on the hard mask layer 60.

A second sacrificial layer 72 is formed in the contact formation region 200 of the leading region 150 so as to cover a portion of the sidewall mask 80. The sacrificial layer 72 covering the sidewall mask 80 is, for example, the resist film (a film containing carbon) 72 and is patterned to a predetermined shape (here, a rectangular shape) and processed by photolithography and etching. For example, the sacrificial layer 72 in a rectangular planar shape is formed so as to have a dimension D1' in the X direction and a dimension Dz in the Y direction equal to the critical dimension of the resolution of photolithography or more.

The sacrificial layer 72 is used as a spacer to increase the interconnect interval in the contact formation region 200 of interconnects patterned based on the sidewall mask 80 and other sidewall masks formed in the subsequent sidewall mask formation process. To clarify the description, the sacrificial layer 72 covering the sidewall mask 80 may be called the spacer layer 72 below.

The spacer layer 72 formed in the contact formation region 200 is provided on both side faces of the sidewall mask 80 so as to cover the upper surface of the sidewall mask 80 and also to project to the outer side (both sides) from the side face of the sidewall mask 80 in the line width direction (direction crossing the extending direction of the sidewall mask 80 in the direction parallel to the surface of the semiconductor substrate) of the sidewall mask 80. As a result, the dimension Dz in the line width direction of the sidewall mask 80 of a pattern (portion) formed from the sidewall mask 80 and the spacer layer 72 in the contact formation region 200 in a closed loop pattern becomes larger than the line width LWa of the sidewall mask 80.

As shown in FIG. 13B, according to the method of manufacturing a flash memory in the present embodiment, the sacrificial layer (spacer layer) 72 is laid out in the leading region 150 so as to cover a portion (X-direction extending portion) 801 of the sidewall mask 80 in a closed loop extending in the X direction on the side on which the fringe of the sacrificial layer in a flag structure projects in the contact formation region 200. For example, a portion (called a Y-direction extending portion) 802 of the sidewall mask 80 in a closed loop extending in the Y direction may be covered with the sacrificial layer 72 together with the portion 801 of the sidewall mask 80 extending in the X direction.

Regarding the direction (here, the Y direction) parallel to the line width direction of the portion 801 of the sidewall mask 80 covered with the sacrificial layer 72, the dimension Dz of the sacrificial layer 72 in the Y direction is larger than five times the dimension of the line width LWa of the sidewall mask 80. That is, the dimension Dz is larger than five times the line width of the formed interconnect. The dimension Dz of the sacrificial layer 72 in the Y direction is preferably equal to the critical dimension of the resolution of photolithography or more.

As shown in FIG. 13A, intervals C1 of the sidewall masks 80 in the Y direction in the memory cell array 100 have substantially the same size in accordance with the line width A1 of the removed sacrificial layer or the interval B1 between the sidewalls 80 formed on different sacrificial layers, regardless of the one sidewall mask 80 in a closed loop shape and the sidewalls 80 of mutually different closed loop shapes.

As shown in FIG. 13B, an interval C2 in the Y direction between the sacrificial layer 72 and the sidewall mask 80 not covered with the sacrificial layer 72 is set to a dimension larger than four times the line width of the formed interconnect (sidewall mask) and a dimension allowing a space to arrange a pad by adjusting the size and formation position of the sacrificial layer 72 as a spacer layer. An interval of a predetermined size may also be secured in the X direction between the sacrificial layer 72 and the Y-direction extending portion 802 of the sidewall mask 80.

Regarding the direction parallel to the line width direction of the sidewall mask 80, a projecting dimension Dx' (here, a dimension in the Y direction) of the sacrificial layer 72 between the side face of the sidewall mask 80 covered with the sacrificial layer 72 and the end of the sacrificial layer 72 is set to a dimension larger than the line width of the formed interconnect or the interconnect interval in the memory cell array 100 in consideration of the size of the formed pad. Regarding both side faces of the sidewall mask 80, the dimension (second dimension) Dx' in the Y direction from the side face of the sidewall mask 80 to the end of the sacrificial layer 72 is preferably set to a dimension larger than the critical dimension of the resolution of photolithography or a dimension (width) larger than the dimension of the formed pad in the Y direction. However, the dimension Dx' in the Y direction from the side face of the sidewall mask 80 to the end of the sacrificial layer 72 may be equal to the critical dimension of the resolution of photolithography or less such as, for example, the dimension of half the critical dimension of the resolution of photolithography or less if the dimension Dx' is larger than the line width of the formed interconnect or the interconnect interval in the memory cell array 100. For example, the formation position of the sacrificial layer 72 relative to the sidewall mask 80 is adjusted so that the dimension Dx' between the side face of the sidewall mask 80 and the end of the sacrificial layer 72 becomes a size about half the dimension Dz of the sacrificial layer 72 in the Y direction in consideration of symmetry of the layout of interconnects in the contact formation region 200.

FIGS. 13C and 13D are sectional process drawings showing a modification of the process shown in FIGS. 13A and 13B.

In FIGS. 13A and 13B, an example in which the sacrificial layer 72 as the spacer layer 72 is formed so as to cover the sidewall mask 80 corresponding to the line width LW1 of the formed interconnect is shown, but as shown in FIG. 13C, the spacer layer 72 may be formed before the sidewall mask 80 having substantially the same line width as the line width LW1 of the formed interconnect is formed. As shown in FIG. 13C, the spacer layer 72 is formed so as to cover a sidewall mask 80' having a line width LWa' larger than the line width LW1 of the formed interconnect. Then, the sidewall mask 80' having the line width LWa' larger than the line width LW1 of the interconnect is processed (slimmed) by, for example, etching to have the dimension LWa corresponding to the line width LW1 of the formed interconnect. In this case, a portion 801' of the sidewall mask 80' covered with the sacrificial layer 72 is not exposed to etching conditions for the sidewall masks 80, 80' and thus, the line width LWa' of the sidewall mask 80' before being slimmed is maintained.

If, as shown in FIG. 13C, the line width LWa of the sidewall mask 80 is adjusted to the line width LW1 of the formed interconnect after the sacrificial layer in a flag structure is removed, both side faces of the sidewall mask 80' are etched to slim the sidewall mask 80'. A line width A1' of the linear portion of the sacrificial layer in a flag structure and an interval B1' between linear portions are adjusted when appropriate so that a line & space pattern having the predetermined interconnect width and interconnect interval (for example, ⅙ the critical dimension of the resolution of photolithography) is formed in consideration of the thickness of the sidewall material to form the sidewall mask 80 when deposited and the amount of etching when the sidewall mask 80' having the line width LWa' larger than the line width LW1 of the formed interconnect is slimmed.

As shown in FIG. 13D, the spacer layer 72 may be formed so as to cover a portion of the sidewall mask 80 and the sacrificial layer 70 in the contact formation region 200 before the sacrificial layer in a flag structure is removed. In this case, the sacrificial layer is selectively removed while the spacer layer 72 covers a portion 709A of the sacrificial layer together with the sidewall mask 80 and thus, the portion 709A of the fringe of the sacrificial layer remains below the spacer layer 72.

Figure 14:
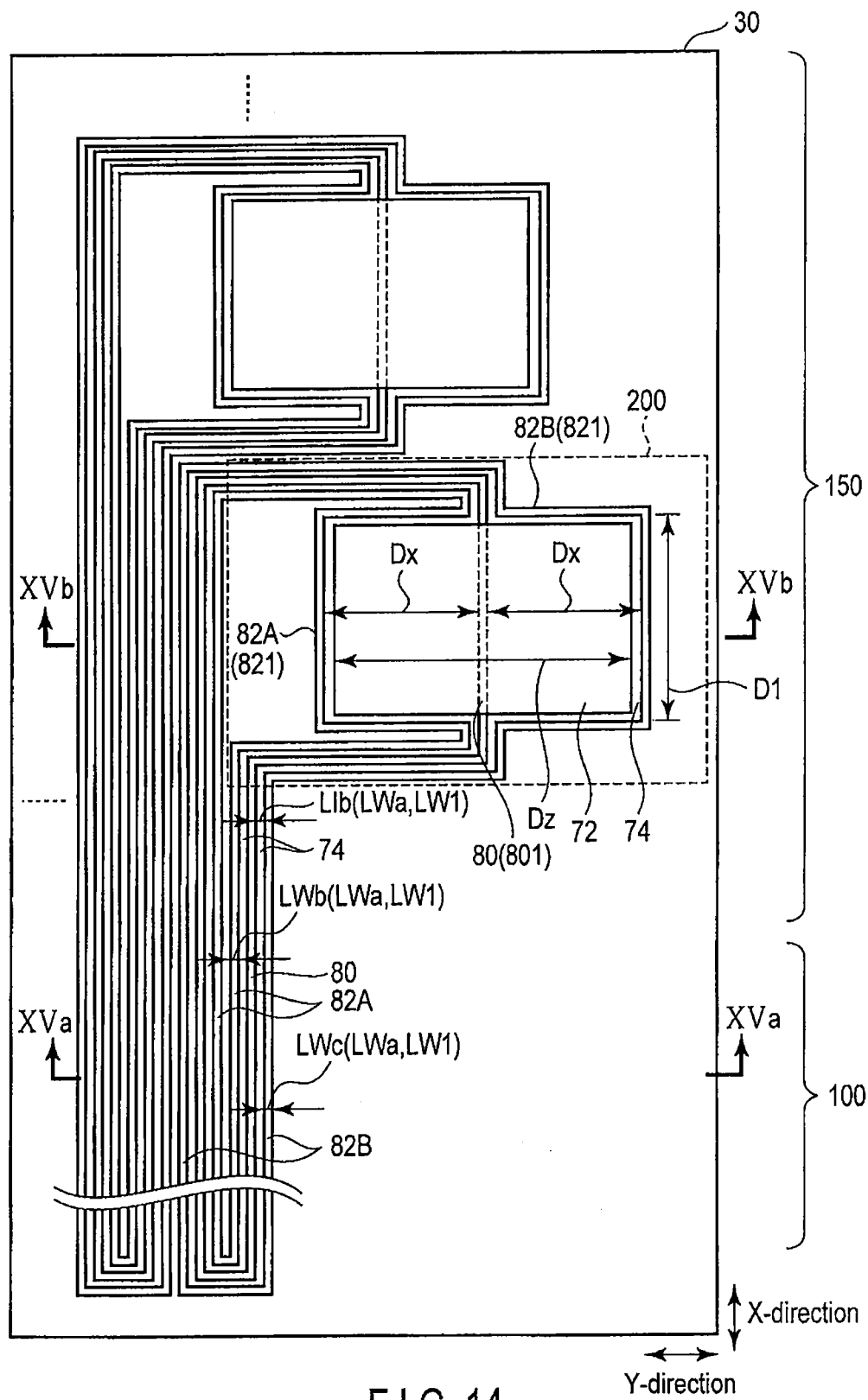
FIG. 14 is a plan process drawing illustrating the method of manufacturing the semiconductor device according to the first embodiment.

A process of the method of manufacturing a flash memory according to the present embodiment will be described using FIGS. 14 to 16B. FIG. 14 shows a plan view of a portion of the memory cell array 100 and the leading region 150 of a flash memory in a process of the method of manufacturing a flash memory according to the present embodiment. FIGS. 15A and 15B shows sectional process drawings corresponding to FIG. 14. FIG. 15A shows a sectional process drawing along an XVa-XVa line in FIG. 14. FIG. 15B shows a sectional process drawing along an XVb-XVb line in FIG. 14. FIGS. 16A and 16B show sectional process drawings of a process following the manufacturing process in FIGS. 15A and 15B. FIG. 16A corresponds to the process subsequent to FIG. 15A and FIG. 16B corresponds to the process subsequent to FIG. 15B.

As shown in FIGS. 14, 15A, and 15B, a carbon film (or a film containing carbon) 74 as a third sacrificial layer 74 is formed on the sidewall mask (silicon nitride) 80 and the second sacrificial layer (spacer layer) 72.

The carbon film 74 is formed by using, for example, the PE (Plasma Enhanced)-CVD method to form a film with good coverage. When the carbon film 74 is deposited by the PE-CVD method, $C_3H_6$ or $C_2H_4$ is used as a forming gas and the forming temperature of the carbon film 74 is set to about 350° C. Then, etch-back of the deposited carbon film 74 is performed by RIE using an etching gas containing an $O_2$ gas as a main component.

The carbon film 74 as a sacrificial layer is formed along the side face on the inner circumferential side of the sidewall mask 80 in a closed loop shape and along the side face on the outer circumferential side of the sidewall mask 80 and side face of the spacer layer 72 across the sidewall mask 80 and the spacer layer 72. The formed sacrificial layer 74 has a closed-loop planar shape. The carbon film 74 as a formed sacrificial layer is a sidewall film.

Etching conditions for the carbon film as the sacrificial layer 74 are set so that a line width (thickness in the direction parallel to the surface of the semiconductor substrate 30) LIb of formed sacrificial layer 74 becomes substantially the same dimension (here, 15 nm) as the line width LWa of the sidewall mask 80 and the sacrificial layer 74 is etched based on the etching conditions. However, the line width LIb of the sacrificial layer 74 may be different on the inner circumferential (internal surface) side and the outer circumferential (external surface) side of the sidewall mask 80 in a closed loop shape. The line width LIb of the sacrificial layer 74 corresponds to the interconnect interval of formed interconnects and is also substantially equal to the line width of the formed interconnect.

The carbon film 74 as a sacrificial layer becomes a spacer between the sidewall mask 80 formed in the first sidewall mask formation process and the sidewall mask to be formed in the next sidewall mask formation process. To clarify the description, the sacrificial layer (sidewall film) as a spacer between sidewall masks formed in different processes may be called a sidewall spacer below.

Silicon nitrides 82A, 82B as second and third sidewall masks (sidewall films) 82A, 82B are formed on the side faces of the sacrificial layer (sidewall spacer) 74 on the first sidewall mask 80 and on the spacer layer 72 in the second sidewall mask formation process by using substantially the same material and the same method (sidewall formation process) as the first sidewall mask 80. For example, the second and third sidewall masks 82A, 82B are formed by depositing a sidewall material (silicon nitride) by using the ALD method to obtain good coverage and performing etch-back of the deposited sidewall material by RIE using an etching gas such as $CF_4$ and $CHF_3$.

Because the carbon film 74 is used as the sidewall spacer 74, a large processing selection ratio (etching selectivity) is secured between the sidewall masks 80, 82A, 82B using silicon nitride and the sidewall spacer 74 and also the sidewall spacer 74 using a carbon film and the spacer layer 72 using a resist film can be etched (removed) in a common process in a subsequent step. The etching selection ratio of the sidewall spacer 74 and the spacer layer 72 is adjusted by thicknesses of the sidewall spacer 74 and the spacer layer 72 and even if etch-back to form the sidewall spacer 74 formed of the carbon film is performed, the spacer layer 72 formed of the resist material does not disappear.

The second sidewall films 82A, 82B formed in the second sidewall mask formation process correspond to the pattern of formed interconnects (word lines). The first sidewall mask 80 corresponds to the pattern of a formed interconnect and also functions practically as a core material to form the second sidewall films 82A, 82B.

Thus, in the second sidewall mask formation process, the second and third sidewall masks (second sidewall films) 82A, 82B in a closed loop shape are each formed along the inner circumference (internal surface) and the outer circumference (external surface) of the sidewall spacer 74 on the first sidewall mask 80 in a closed loop shape and the spacer layer 72 covering the sidewall mask 80.

The sidewall masks 82A, 82B formed in the second sidewall mask formation process have, like the sidewall mask 80 formed in the first sidewall mask formation process, a linear planar shape and extend in the X direction in the memory cell array 100. The sidewall masks 82A, 82B are bent two-dimensionally (the X direction and Y direction) around the sidewall mask 80 in a predetermined position in the leading region 150 in accordance with the planar shape of the sidewall mask 80 functioning as a core material.

Line widths (thicknesses in the direction parallel to the surface of the semiconductor substrate 30) LWb, LWc of the sidewall masks 82A, 82B are formed so as to have substantially the same size (here, about 15 nm) as the line width LWa of the first sidewall mask 80 and the line width LIb of the sidewall spacer (carbon film) 74. With the sidewall spacer 74 formed on the side face of the sidewall mask 80, the sidewall masks 80, 82A, 82B having the predetermined interval (half pitch) are formed in the memory cell array 100 and also the line widths LWb, LWc of the sidewall masks 82A, 82B in the contact formation region 200 are substantially the same sizes as the line widths LWb, LWc of the sidewall masks 82A, 82B in the memory cell array 100.

In the memory cell array 100, the second sidewall mask 82A in a closed loop shape on the inner circumferential side of the first sidewall mask 80 has side faces opposed to each other in the Y direction on the side that is not in contact with the sidewall spacer 74 of the second sidewall mask 82A without sandwiching sidewall spacer 74 therebetween.

As described above (see FIG. 7 or 11), the line width of the sacrificial layer (core material) for the first sidewall mask 80 is substantially set to five times the line width of the formed interconnect (half pitch of the interconnect) and the line width LIb of the sidewall spacer 74 and the line width LWb of the second sidewall mask 82A are each set to substantially the same size as the line width of the formed interconnect (half pitch of the interconnect). As a result, an interval LIc between the second sidewall masks 82A opposed in the Y direction on the inner circumferential side of the first sidewall mask 80 is substantially the same as, for example, the line width LWa of the sidewall mask 80 and the line width LIb of the sidewall spacer 74.

The third sidewall mask 82B in a closed loop shape on the outer circumferential side of the first sidewall mask 80 is also opposed to the other third sidewall mask 82B formed for the mutually different sidewall masks 80 in the Y direction without sandwiching sidewall spacer 74 therebetween.

As described above (see FIG. 7 or FIG. 11), the interval between sacrificial layers (core materials) adjacent to each other is set to substantially seven times the line width of the formed interconnect, the first sidewall mask 80 of the line width LWa is formed on the side face of each of the sacrificial layers 72, and the sidewall masks 80 are adjacent to each other with a dimension substantially five times the line width of the formed interconnect. Further, the sidewall spacer 74 of the line width LIb and the sidewall mask 82B of the line width LWc are formed on the side face of each of the sidewall masks 80. The line widths LIb, LWc of the sidewall spacer 74 and the sidewall mask 82B are set to substantially the same size as the line width of the formed interconnect. As a result, an interval LId between the third sidewall masks 82B opposed in the Y direction on the outer circumferential side of the first sidewall mask 80 is substantially the same as, for example, the line width LWa of the sidewall mask 80 and the line width LIb of the sidewall spacer 74.

For example, a dimension (height) H1 in the vertical direction of the sidewall mask 80 formed in the first sidewall mask formation process with respect to the surface of the semiconductor substrate 30 is different from a dimension H2 in the vertical direction of the sidewall masks 82A, 82B formed in the second sidewall mask formation process with respect to the surface of the semiconductor substrate 30. The position (position on the opposite side of the semiconductor substrate side) of the upper end of the first sidewall mask 80 is higher than the position of the upper end of the second and third sidewall masks 82A, 82B.

The height H1 of the sidewall mask 80 can be controlled by the thickness of the sacrificial layer 70 in a flag structure and the height H2 of the sidewall masks 82A, 82B can be controlled by the thickness of the spacer layer 72 covering the sidewall mask 80 in the contact formation region 200 of the leading region 150. By adjusting the thicknesses of the sacrificial layer 70 and the spacer layer 72, variations of the heights H1, H2 of the sidewall masks 80, 82A, 82B can be reduced. As a result, variations in processing of lower layers resulting from variations in height of the sidewall masks 80, 82A, 82B can be suppressed.

In the memory cell array 100, as shown in FIG. 15A, the first sidewall mask 80 in a closed loop shape is sandwiched between the sidewall mask 82A in a closed loop shape on the inner circumferential side and the sidewall mask 82B in a closed loop shape on the outer circumferential side via the sidewall spacer (the third sacrificial layer, carbon film) 74.

As shown in FIG. 15B, the sidewall mask 80 is sandwiched between the sidewall mask 82A on the inner circumferential side and the sidewall mask 82B on the outer circumferential side via the spacer layer (the second sacrificial layer, resist film) 72 and the sidewall spacer 74 in the contact formation region 200 of the leading region 150. An interval (second interval) Dx larger than the interval (first interval) LIb, LIc, LId between the sidewall masks 80, 82A, 82B in the memory cell array 100 is secured by the spacer layer 72 (and the sidewall spacer 74) covering the sidewall mask 80 in the contact formation region 200 between the sidewall mask 80 and the sidewall mask 82A on the inner circumferential side thereof and between the sidewall mask 80 and the sidewall mask 82B on the outer circumferential side thereof. The interval Dx between the sidewall masks 80, 82A, 82B in the contact formation region 200 is equal to the sum of the line width of the sidewall spacer 74 and the thickness of the spacer layer 72 on the side face of the sidewall mask 80. The interval Dx (=Dx'+LIb) between the sidewall masks 80, 82A, 82B in the contact formation region 200 of the leading region 150 mainly corresponds to the dimensions Dx', Dz of the spacer layer 72 in the Y direction because the line width (thickness) of the sidewall spacer 74 is small when compared with the dimension (dimension relative to the side face of the sidewall mask 80) of the spacer layer 72.

As shown in FIGS. 16A and 16B, the sacrificial layers (the carbon film 74 and the resist film 72) between the sidewall masks 80, 82A, 82B are removed by ashing using, for example, an $O_2$ gas. As described above, the two sacrificial layers (the spacer layer and sidewall spacer) 72, 74 formed in different processes have a mutually small etching selectivity (difference of etching rates for a common etching gas) by being formed using materials containing same element (here carbon) as a mainly containing element and can be removed substantially simultaneously in a common process (the same method) by being formed using materials with. Accordingly, compared with a case when the sacrificial layers 72, 74 are formed by using materials with a large etching selectivity (etching selection ratio) between the sacrificial layers 72, 74, the manufacturing process of a flash memory can be prevented from increasing.

FIG. 16C is a sectional process drawing showing a modification of the process shown in FIGS. 15A and 15B. If the sidewall spacer 74 can maintain a predetermined dimension (here, substantially the same line width as the sidewall mask 80) under processing conditions of the spacer layer (for example, the resist film) 72, as shown in FIG. 16C, the sidewall spacer 74 may be formed on the side face of the first sidewall mask 80 before the spacer layer 72 is formed.

In this case, after the sidewall spacer 74 is formed, the spacer layer 72 is formed so as to cover the sidewall spacer 74 and the sidewall mask 80 in the contact formation region 200. Then, the second and third sidewall masks 82A, 82B are formed on the side face of the sidewall spacer 74 in the memory cell array 100 and on both side faces of the spacer layer 72 in the contact formation region 200. To form the sidewall spacer 74 of the predetermined line width, after a sidewall material to form the sidewall spacer 74 being deposited and the spacer layer 72 being patterned to a predetermined shape in the process shown in FIG. 16C, the sidewall spacer 74 may be processed to the predetermined line width. In this case, materials with a significantly different etching selectivity may be used for the spacer layer 72 and the sidewall spacer 74.

In the process of removing the sacrificial layers (the spacer layer and sidewall spacer) 72, 74 shown in FIGS. 16A, 16B, and 16C, it is preferable to appropriately select the combination of materials forming the members 82A, 82B, 72, 74 and/or the removal method so that the sidewall masks 80, 82A, 82B are not damaged (for example, the reduction of the line width) depending on conditions for removing the sacrificial layers 72, 74.

With the processes heretofore, the sidewall masks 80, 82A, 82B in a closed loop shape having a line & space pattern with a predetermined pitch are formed in the memory cell array 100. The three sidewall masks 80, 82A, 82B in a closed loop shape form a group and are led from the memory cell array 100 into the contact formation region 200 of the leading region 150.

According to the method of manufacturing a flash memory in the present embodiment, the three sidewall masks 80, 82A, 82B in a closed loop shape are formed in two sidewall mask formation processes based on the one sacrificial layer 70 in a flag structure. The formed sidewall masks 80, 82A, 82B have the line widths LWa, LWb, LWc, about ⅙ the critical dimension of the resolution of photolithography. Regarding the direction crossing the extending direction of interconnect (word lines) formed in the memory cell array 100, the sidewall masks 80, 82A, 82B adjacent to each other in the memory cell array 100 are separated by the intervals LIb, LIc, LId, about ⅙ the critical dimension of the resolution of photolithography.

Thus, pitch of sidewall masks 80, 82A, 82B as a whole are substantially ⅙ the pitch of the sacrificial layer in flag structure. In other words, the sidewall masks 80, 82A, 82B to form interconnects of a line & space pattern are formed so as to have the half pitch about ⅙ the critical dimension of the resolution of photolithography in the memory cell array 100.

Also as described above, the interval (space) D2 larger than at least one of the line widths LWa, LWb, LWc of the sidewall masks 80, 82A, 82B corresponding to the line width LW1/interconnect interval LI1 of interconnects of the formed line & space pattern and the intervals LIb, LIc, LId of the sidewall masks 80, 82A, 82B in the memory cell array 100 is secured between the sidewall masks 80, 82A, 82B in the contact formation region 200 in accordance with the size of the fringe provided in the sacrificial layer as a core material to form the sidewall mask 80 and the size of the sacrificial layer (resist mask) as a spacer covering the sidewall mask 80 in the contact formation region 200 of the leading region 150.

Therefore, the sidewall masks 80, 82A, 82B adjacent to each other in the contact formation region 200 of the leading region 150 have the interval D2 larger than the intervals LIb, LIc, LId of the sidewall masks 80, 82A, 82B in the memory cell array 100.

Figure 17:
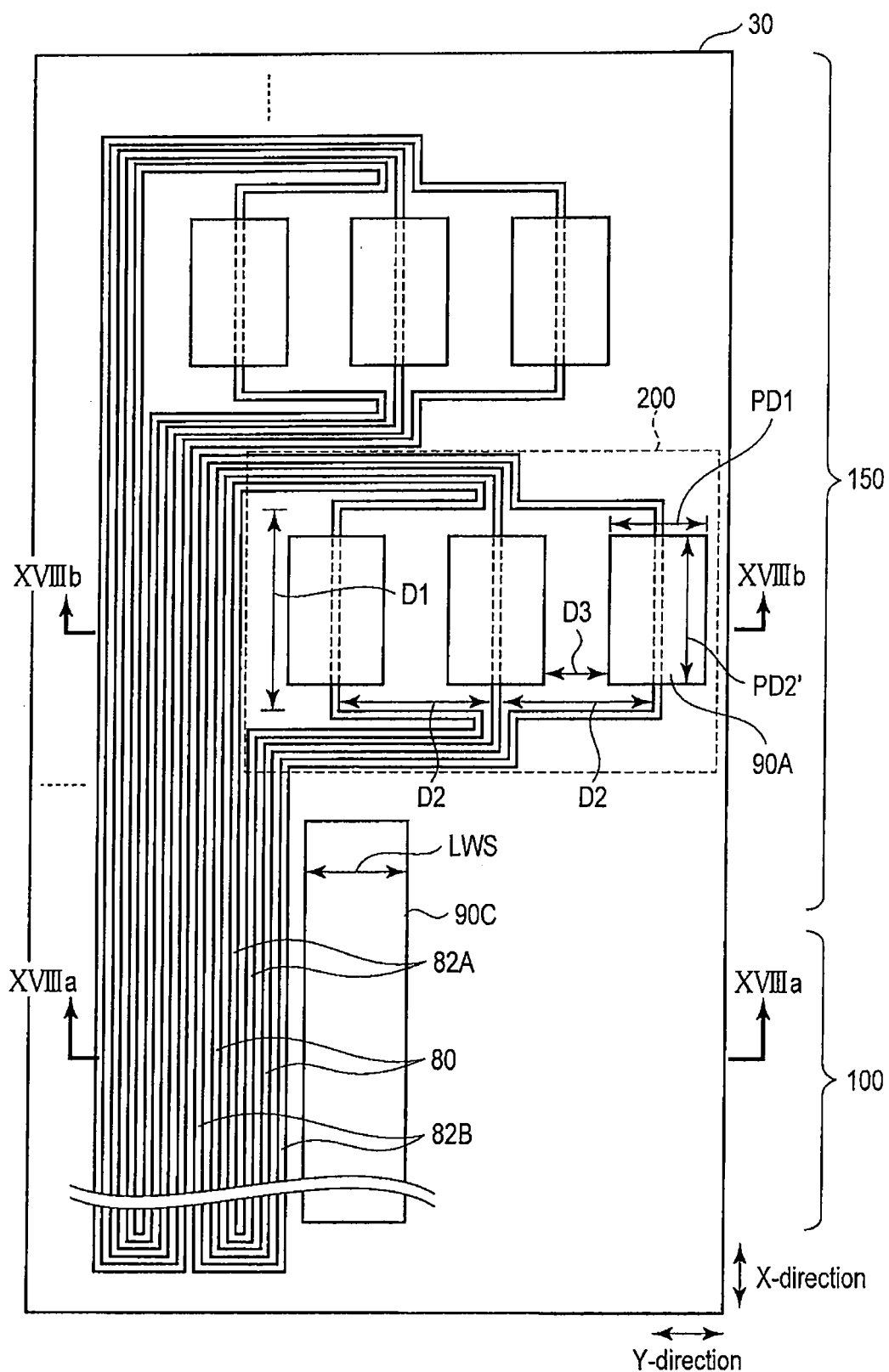
FIG. 17 is a plan process drawing illustrating the method of manufacturing the semiconductor device according to the first embodiment.

A process of the method of manufacturing a flash memory according to the present embodiment will be described using FIGS. 17 to 21B. FIG. 17 shows a plan view of a portion of the memory cell array 100 and the leading region 150 of a flash memory in a process of the method of manufacturing a flash memory according to the present embodiment. FIGS. 18A and 18B show sectional process drawings corresponding to FIG. 17. FIG. 18A shows a sectional process drawing along an XVIIIa-XVIIIa line in FIG. 17. FIG. 18B shows a sectional process drawing along an XVIIIb-XVIIIb line in FIG. 17.

Figure 19A:
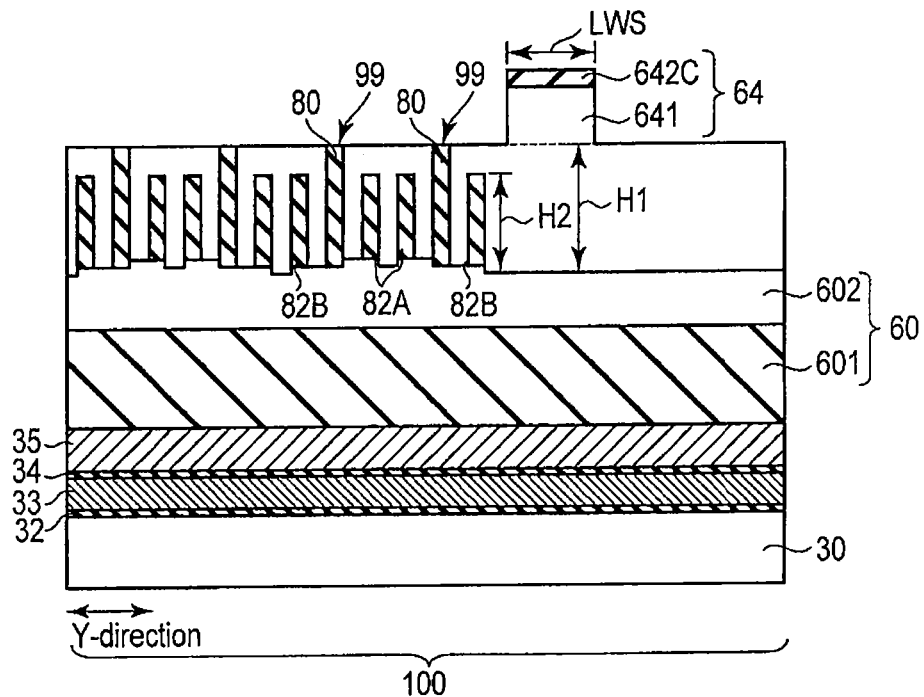
FIGS. 19A and 19B are sectional process drawings illustrating the method of manufacturing the semiconductor device according to the first embodiment.

FIGS. 19A to 21B show sectional process drawings following FIGS. 18A and 18B. FIGS. 19A, 20A, and 21A correspond to processes successively following FIG. 18A. FIGS. 19B, 20B, and 21B correspond to processes successively following FIG. 18B.

After the sidewall masks 80, 82A, 82B having a line & space pattern are formed, a mask to form a pad connected to interconnects is patterned (mask formation).

As a process to pattern the mask of a pad, for example, the stacked mask process is used.

As shown in FIGS. 17, 18A, and 18B, an SOC (Spin On Carbon) film 641 and an SOG (Spin On Glass) film 642 to form a stacked mask 64 are successively stacked on the sidewall masks 80, 82A, 82B and the mask layer 60 so as to cover the sidewall masks 80, 82A, 82B.

A mask 90A to pattern a pad in the contact formation region 200 is formed on the SOG film 642 of the stacked mask 64 by using photolithography and etching so as to overlap with the sidewall masks 80, 82A, 82B in a direction perpendicular to the surface of the semiconductor substrate 30.

For example, each of the masks 90A overlaps (is stacked vertically) with each of portions (X-direction extending portion) 801, 821 of the sidewall masks 80, 82A, 82B extending in the X direction in the contact formation region 200 in a direction perpendicular to the surface of the semiconductor substrate 30. Each of the masks 90A is formed so as not to extend over two or more of the sidewall masks 80, 82A, 82B.

For example, the mask 90A is a resist film (resist mask) having a rectangular (for example, oblong) planar shape and is patterned in dimensions (length, width) PD1, PD2' larger than the critical dimension of the resolution of photolithography.

For example, the three resist masks 90A in a rectangular shape are formed in the contact formation region 200 corresponding to the three sidewall masks 80, 82A, 82B in a closed loop shape led into the contact formation region 200. If the resist masks 90A are formed so as to cover the portions 801, 821 of the sidewall masks extending in the X direction, the resist masks 90A are laid out in the contact formation region 200 to be aligned, for example, in the Y direction (direction crossing the extending direction of the sidewall masks 80, 82A, 82B).

The dimension PD2' of the resist mask 90A in the X direction is smaller than the dimension of the X-direction extending portion 801, 821 of the sidewall masks 80, 82A, 82B in the X direction. The dimension PD1 of each of the resist masks 90A in the Y direction is larger than the line width of the sidewall masks 80, 82A, 82B. However, the dimension PD1 of the resist mask 90A is set so that the adjacent resist masks 90A do not come into contact. For example, the dimension from the end of the resist mask 90A in the Y direction to the side face of the X-direction extending portion 801, 821 of the sidewall masks 80, 82A, 82B covered therewith is smaller than half the interval D2 between the X-direction extending portions 801, 821.

According to the method of manufacturing a flash memory in the present embodiment, as described above, the interval D2 between the X-direction extending portions 801, 821 of each of the sidewall masks 80, 82A, 82B is larger than the interval LIb, LIc, LId of the sidewall masks 80, 82A, 82B in the memory cell array 100 and thus, defects such as the masks 90A coming into contact and the one mask 90A overlapping with a plurality of the sidewall masks 80, 82A, 82B can be inhibited.

For example, a mask (resist mask) 90C to pattern the gate of a select gate line (select transistor) and peripheral transistor is formed on the stacked mask 64 simultaneously with the formation of the mask 90A for pad patterning. FIGS. 17 and 18A illustrate the mask 90C to pattern a select gate line. The mask 90C is provided in the memory cell array 100 so as not to overlap with the sidewall masks 80, 82A, 82B in a direction perpendicular to the surface of the semiconductor substrate 30. A line width (dimension in the Y direction) LWS of the mask 90C is set to the critical dimension of the resolution of photolithography or more. The line width LWS of the mask 90C is set so that, for example, a select transistor having a predetermined channel length (for example, a channel length satisfying the breakdown voltage of a gate insulating film) is formed.

The stacked mask 64 including the SOC film 641 and the SOG film 642 is etched by RIE based on the resist masks 90A, 90C. A $CHF_3$ gas is used for etching of the SOG film 642 of the mask 64 in a stacked structure and an $O_2$ gas is used for etching of the SOC film 641.

Figure 19B:
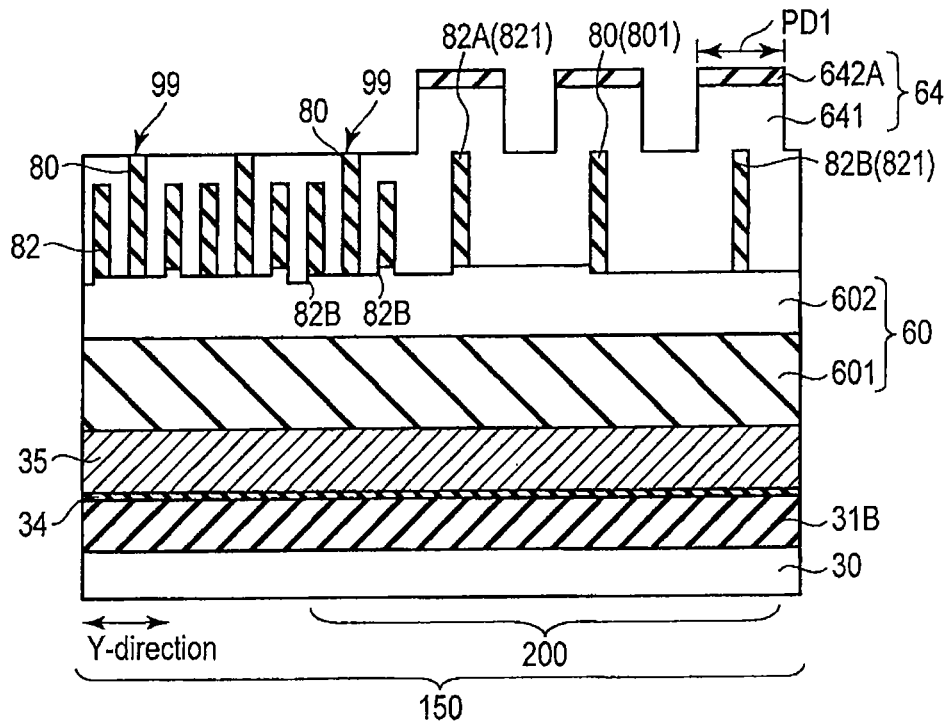

As shown in FIGS. 19A and 19B, SOG films 642A, 642C remain corresponding to the pattern of resist masks. The SOC film 641 is etched with the SOG films 642A, 642C to which the resist mask pattern is transferred serving as masks. The etching gas is switched in accordance with the stage of etching of the SOG films 642A, 642C and the SOC film 641.

The resist masks may be removed selectively or simultaneously with processing of the SOG films 642A, 642C or the SOC film 641 depending on etching conditions for the SOG film 642 or the SOC film 641.

As described above, the dimension (height, the position of the upper end) H1 of the sidewall mask 80 in a direction perpendicular to the surface of the semiconductor substrate 30 is larger than the dimension H2 of the sidewall masks 82A, 82B formed after the sidewall mask 80 is formed.

For example, as shown in FIGS. 19A and 19B, etching of the stacked mask 64 (here, the SOC film 641) covering the sidewall masks 80, 82A, 82B is interrupted when an upper end 99 of the sidewall mask 80 in the memory cell array 100 is exposed. At this point, the upper end of the sidewall masks 82A, 82B lower than the height H1 of the sidewall mask 80 and the sidewall masks 80, 82A, 82B in a lower portion of the SOG film 642A of the pattern corresponding to the resist masks are covered with the SOC film 641.

Then, the sidewall mask 80 whose upper end is exposed first is selectively etched.

As shown in FIGS. 20A and 20B, an upper end 99X of a sidewall mask 80X retreats to the side of the semiconductor substrate 30. Accordingly, the difference between a height H1' of the sidewall mask 80X and the height H2 of the sidewall masks 82A, 82B is made smaller and a level difference of upper ends of the sidewall masks 80X, 82A, 82B is almost eliminated.

If, for example, a significant difference in the dimension of openings between the adjacent sidewall masks 80, 82A, 82B arises due to a difference between the heights H1, H2 of the sidewall masks 80, 82A, 82B, the amount of etching gas flowing between the sidewall masks 80, 82A, 82B may vary due to the difference in dimension of the openings. This may cause dimensional conversion differences in lower layers processed based on the sidewall masks 80, 82A, 82B having different heights.

According to the present embodiment, by contrast, the difference in height between the sidewall masks 80, 82A, 82B can be made smaller while processing the stacked mask 64 and as a result, variations of processing of the hard mask layer 60 processed based on the sidewall masks 80X, 82A, 82B can be reduced.

After the heights H1', H2 of the sidewall masks 80X, 82A, 82B are aligned, the SOC film 641 of the stacked mask 64 is selectively processed by etching using an $O_2$ gas based on the patterned SOG films 642A, 642C.

Accordingly, as shown in FIG. 21B, the mask pattern to form a pad is transferred to the SOC film 641A of the stacked mask 64 in the contact formation region 200 of the leading region 150. A mask 64A corresponding to the pattern to form a pad is formed in the contact formation region 200.

As shown in FIG. 21A, a mask (hereinafter, also called a select gate line pattern mask) 64C (an SOG film 642C and an SOC film 641C) to form a select gate line and a select transistor is formed in the memory cell array 100 simultaneously with the formation of the mask (hereinafter, also called a pad pattern mask) 64A for pad patterning. The select gate line pattern mask 64C is formed in the memory cell array 100 so as to extend in the X direction.

For example, the pad pattern mask 64A remains on the hard mask layer 60 so as to cover the sidewall masks 80X, 82A, 82B in the contact formation region 200. The select gate line pattern mask 64C does not cover the sidewall masks 80X, 82A, 82B.

As shown in FIGS. 21A and 21B, the second hard mask (amorphous silicon film) 602 of the mask layer 60 is processed by RIE using the sidewall masks 80X, 82A, 82B and the pattern masks 64A, 64C as masks. A mixed gas containing $CF_4$ or HBr is used for RIE on the amorphous silicon film 602 as a hard mask.

Patterns of the sidewall masks 80X, 82A, 82B and the stacked masks 64A, 64C are transferred to the hard mask layer 60 by etching of the amorphous silicon film 602 based on the sidewall masks 80X, 82A, 82B and the patterned stacked masks 64A, 64C.

Accordingly, a mask pattern to form an interconnect of the line width/interconnect interval smaller than the critical dimension of the resolution of photolithography is transferred to the amorphous silicon film 602 on the upper-layer side of the mask layer 60. The amorphous silicon film 602 is processed into a mask pattern including a line pattern (and a space pattern) 602A in the memory cell array 100 and a pad pattern 602B in the contact formation region 200 of the leading region 150. The line pattern 602A has a closed-loop planar shape and the pad pattern (rectangular pattern) 602B is connected to a portion of the pattern in a closed loop shape.

The line pattern 602A and the pad pattern 602B are transferred to the amorphous silicon film 602 and at the same time, a pattern 602C of a select gate line is formed in the memory cell array 100. The line width LWS thereof is substantially the same as the line width of the select gate line (channel length of the select transistor).

After a line & space pattern 602A formed of the sidewall masks 80X, 82A, 82B and a pad pattern 602B are transferred to the amorphous silicon film 602, the SOG films 642A, 642C and the SOC films 641A, 641C are selectively removed. The SOG films 642A, 642C and the SOC films 641A, 641C are removed by ashing using an $O_2$ gas. After the SOG films 642A, 642C and the SOC films 641A, 641C are removed, the sidewall masks 80X, 82A, 82B are selectively removed. The silicon nitride as the sidewall masks 80X, 82A, 82B is removed by, for example, wet etching using phosphoric acid.

In the present embodiment, the stacked mask process is used to form a pattern corresponding to a pad. However, resist masks 90A, 90C to pattern a pad and a select gate line may directly be formed on the sidewall masks 80X, 82A, 82B and the hard mask layer 60 without using the stacked mask process.

A mask to form a select gate line may be formed by forming the resist mask 90C to pattern the select gate line on the sidewall material 89 before the first to third sidewall masks are formed and transferring the mask pattern corresponding to the pattern of the select gate line to the sidewall material 89.

A process of the method of manufacturing a flash memory according to the present embodiment will be described using FIGS. 22 to 24C. FIG. 22 shows a plan view of a portion of the memory cell array 100 and the leading region 150 of a flash memory in a process of the method of manufacturing a flash memory according to the present embodiment. FIGS. 23A and 23B show sectional process drawings corresponding to FIG. 22. FIG. 23A shows a sectional process drawing along an XXIIIa-XXIIIa line in FIG. 22. FIG. 23B shows a sectional process drawing along an XXIIIb-XXIIIb line in FIG. 22.

FIGS. 24A, 24B, and 24C show sectional process drawings of processes following the manufacturing process in FIGS. 23A and 23B. FIG. 24A corresponds to the process subsequent to FIG. 23A and FIG. 24B corresponds to the process subsequent to FIG. 23B. FIG. 24C shows a sectional process drawing corresponding to XXIVc-XXIVc in FIG. 22 after the process in FIGS. 23A and 23B.

As shown in FIGS. 22, 23A, and 23B, a loop cut process to create a plurality of independent patterns from a closed-loop pattern is executed on a plurality of the amorphous silicon films 602A, 602B in a closed loop shape based on, for example, the amorphous silicon films 602A, 602B in a closed loop shape to which a sidewall mask pattern is transferred before lower layers (the first hard mask 601 or the processed layers 33 to 35) are processed.

To execute the loop cut process, a mask (resist mask) 94 having an opening OP1 is formed on the amorphous silicon films 602A, 602B and the silicon oxide 601 of the hard mask layer 60 by using photolithography and RIE so that a portion (central portion) of the pad pattern 602B in the contact formation region 200 is exposed. The opening OP1 of the resist mask 94 is formed so as to extend over a plurality (three) of the rectangular pad patterns 602B arranged in the Y direction in each of the contact formation regions 200.

As shown in FIG. 22, an opening OP2 is formed in the resist mask 94 so that a bent portion (looped portion) of the amorphous silicon film 602A in a closed loop shape is exposed on the opposite side of the leading region 150 in which the pad pattern 602B is provided.

The amorphous silicon films 602A, 602B exposed through the openings OP1, OP2 are etched based on the resist mask 94 having the openings OP1, OP2 to cut the pattern in a closed loop shape.

As shown in FIGS. 24A, 24B, and 24C, a plurality of independent patterns 602Z, 602Y corresponding to patterns of interconnects (word lines) and pads connected to interconnects are formed by the loop cut process of the second hard masks 602A, 602B in a closed loop shape.

Then, after the amorphous silicon film 602Z of the line pattern 602Z including the pad pattern 602Y is formed by the loop cut process, the first hard mask (silicon oxide) 601 below the amorphous silicon film 602Z is etched by RIE using, for example, a $C_4F_8$ gas by using the loop-cut amorphous silicon films 602Z, 602Y as masks.

Accordingly, the independent line pattern 602Z and the independent pad pattern 602Y connected to the line pattern 602Z are transferred to silicon oxides 601Z, 601Y of the hard mask layer 60. Also, the select gate line pattern 602C is transferred to a silicon oxide hard mask 601C.

As shown in FIG. 24B, the silicon oxide is removed from the region from which the amorphous silicon film as a hard mask has been loop-cut (removed) and the upper surface of the processed layer (here, the conductive layer 35) is exposed. As shown in FIG. 24C, on the other hand, the pad patterns 602Y, 601Y remain on the conductive layer 35 in a pad formation position.

The line width LW1 of the line patterns 601Z, 602Z of the hard mask layer 60 corresponds to the line widths LWa, LWb, LWc of the above sidewall masks and is substantially the same dimension as the line width of the formed word line. The interval (space) LI1 between line patterns corresponds to the intervals LIb, LIc, LId between the above sidewall masks and is substantially the same dimension as the interconnect interval (and the line width) of word lines having the formed line & space pattern. The line width LW1 of the line patterns 601Z, 602Z and the interval LI1 between the patterns 601Z, 602Z are set to ⅙ (for example, about 15 nm) the critical dimension of the resolution of photolithography.

The line width PD1 of the pad patterns 601Y, 602Y of the hard mask layer 60 has a dimension larger than the line width LW1 of the line patterns 601Z, 602Z. The pad patterns 601Y, 602Y are adjacent to each other with the interval D3 larger than the interval LI1 between the line patterns 601Z, 602Z in the memory cell array 100. Incidentally, the interval D2 between the line patterns 601Z, 602Z in the contact formation region 200 is larger than the interval LI1 between the line patterns 601Z, 602Z in the memory cell array 100.

The line width LWS of the patterns 601C, 602C of the hard mask layer 60 corresponding to a select gate line is substantially the same dimension as the line width of the select gate line (channel length of the select transistor).

The conductive layer 35, the insulator 34, and the conductive layer 33 are successively etched using the silicon oxides 601Z, 601Y of the hard mask layer 60 to which the independent line pattern 602Z and pad pattern 602Y have been transferred as a mask.

Accordingly, as shown in FIGS. 4, 5A, 5B, and 5C, the interconnects (word lines) WL having an interconnect structure of a line & space pattern are formed so as to extend from the memory cell array 100 into the leading region 150.

The formed word line WL has the line width LW1 about ⅙ the critical dimension of the resolution of photolithography. The word line WL has the interconnect interval LI1 about ⅙ the critical dimension of the resolution of photolithography in the memory cell array 100.

In the present embodiment, the word lines WL of a flash memory are formed in such a way that the interconnect interval in the memory cell array 100 and the interconnect interval in the contact formation region 200 of the leading region 150 are different. According to the method of manufacturing a flash memory in the present embodiment, the interconnect interval D2 between the word lines WL adjacent to each other in the contact formation region 200 of the leading region 150 is larger than the interconnect interval LI1 between the word lines WL in the memory cell array 100.

The pad 35P connected to each of the word lines WL is formed from the conductive layer to form a word line.

The memory cell MC having the charge storage layer 33A and the control gate electrode (word line) 35A is formed in the memory cell array 100 simultaneously with the formation of the word lines WL. The gate electrodes 33S, 35S of the select transistor ST are formed in the memory cell array 100 and the gate electrode of a peripheral transistor (not shown) is formed in a peripheral region (not shown) simultaneously with the formation of the memory cell MC.

The diffusion layers 39, 39S as a source/drain are formed by ion implantation using the formed gate electrodes 33A, 35A, 33S, 35S as masks.

The first inter-layer insulating film 51 is formed on the semiconductor substrate 30. A contact hole is formed in the first inter-layer insulating film 51 in the formation positions of the contact plugs CP1, CP2 like the drain diffusion layer 39S of a drain-side select transistor, the source diffusion layer of a source-side select transistor, and the pad 35P. A conductor such as tungsten (W) and molybdenum (Mo) is embedded in the contact hole self-aligningly to form the contact plugs CP1, CP2.

At the first interconnect level M0, a metallic film of copper (Cu), aluminum (Al) or the like is deposited on the first inter-layer insulating film 51 and the contact plugs CP1, CP2 by, for example, the sputter process. The deposited metallic film is processed into a predetermined shape by photolithography/etching or the damascene method to form the wiring layers (intermediate interconnects) 59A, 59B connected to the contact plugs CP1, CP2.

The second inter-layer insulating film 52 is formed on the first inter-layer insulating film 51 and the wiring layers 59A, 59B. Then, the via plug VP connected to the wiring layer 59A is embedded in a via hole formed in the second inter-layer insulating film 52.

At the second interconnect level M1, the bit line BL and the third inter-layer insulating film 53 are formed on the second inter-layer insulating film 52. The bit line BL may be formed by using sidewall transfer technology or by using photolithography and etching.

The bit line BL may also be formed by using the damascene method. For example, a damascene recess in which the bit line BL is embedded can be formed in the third inter-layer insulating film 53 by the sidewall transfer technology. The formation process of the bit line BL to which the sidewall transfer technology is applied may be substantially the same as the formation process of a word line described in the present embodiment.

With the above processes, a semiconductor device (flash memory) according to the present embodiment is formed.

Incidentally, a dimensional conversion difference by processing arises in accordance with the size of a pattern (mask) and the interval between patterns adjacent to each other. The dimensional conversion difference of a mask and a processed layer is assumed to be zero in the method of manufacturing a flash memory according to the present embodiment, but it is preferable to adjust the dimension (the thickness, line width, or patterning dimension) of each mask in each of the above processes in consideration of a dimensional conversion difference.

In the method of manufacturing a flash memory according to the present embodiment, the material to form a mask layer used to pattern a processed layer is not limited to the above materials if a combination capable of securing the processing selection ratio (etching selectivity) between masks is used. For example, materials such as silicon carbide, silicon oxynitride, crystalline silicon (for example, polysilicon), coating materials, and organic materials may be used as a mask material.

In the present embodiment, an example in which the pad 35P is connected to one end of the formed interconnect WL is shown. However, an interconnect structure in which the pad 35P is connected to both ends of the interconnect WL may be adopted if the interconnect is an interconnect of a line & space pattern formed by using the sidewall transfer technology. In this case, a fringe is connected to both ends of a sacrificial layer to be a core material to form the first sidewall mask.

In the method of manufacturing a flash memory according to the present embodiment, as described above, the interconnect (here, the word line) WL of the flash memory is formed by using the sidewall transfer technology. The word line WL and the memory cell MC connected to the word line WL are formed by the above manufacturing method in such a way that the line width LW1 of the word line WL and the interconnect interval LI1 between the word lines WL become smaller than the critical dimension of the resolution of photolithography.

For example, the line width LW1 of the word line WL and the interconnect interval LI1 have a dimension that is ⅙ the critical dimension of the resolution of photolithography. However, if an interconnect structure of a line & space pattern of the predetermined interconnect width and interconnect interval is formed by the manufacturing process using the above sidewall transfer technology, the line width LW1 of the word line WL and the interconnect interval LI1 may be a dimension that is larger than ⅙ the critical dimension of the resolution of photolithography (for example, ½ to ¼ the critical dimension of the resolution of photolithography) or a dimension that is smaller than ⅙ the critical dimension of the resolution of photolithography.

Thus, the method of manufacturing a flash memory according to the present embodiment can provide a flash memory of an interconnect structure having a line & space pattern (interconnect pattern) of the half pitch smaller than the dimension that can be formed by photolithography.

In the method of manufacturing a flash memory according to the present embodiment, a plurality of the sidewall masks 80, 82A, 82B corresponding to interconnect patterns are formed by the sidewall mask formation process a plurality (for example, twice) of times.

If the sacrificial layer formed between the sidewall masks 80, 82A, 82B in the contact formation region 200 of the leading region 150 is only the sidewall film 74 having fine dimensions as a sacrificial layer, such as in the memory cell array 100, it may become difficult to secure a space to form and arrange the pad 35P connected to the word line WL because the interval between the sidewall masks 80, 82A, 82B in the contact formation region 200 is small like the interval between the sidewall masks 80, 82A, 82B in the memory cell array 100.

The sacrificial layer 72 of the predetermined size (for example, the critical dimension of the resolution of photolithography or more) is formed so as to cover the portion 801 of the first sidewall mask 80 formed in the first sidewall mask formation process in the contact formation region 200 of the leading region 150.

The second sidewall masks 82A, 82B are formed in the second sidewall mask formation process while the first sidewall mask 80 is covered with the sacrificial layer 72 by using the sidewall mask 80 (and the sidewall spacer 74 on the side face thereof) in the first sidewall mask formation process as a core material.

The interval Dx (=Dx'+LIb) larger than the intervals LIb, LIc, LId between the sidewall masks 80, 82A, 82B in the memory cell array 100 is secured between the first sidewall mask 80 and the second sidewall masks 82A, 82B in the contact formation region 200 by the sacrificial layer 72 covering the first sidewall mask 80.

By controlling the size of the sacrificial layer 72 covering the first sidewall mask 80, the interconnect intervals D1, D2 between the interconnects WL in the contact formation region 200 of the leading region 150 can be made larger than the interconnect interval LI1 between the interconnects WL in the memory cell array 100 for the interconnects WL extending from in the memory cell array 100 into the leading region 150.

Thus, according to the method of manufacturing a flash memory in the present embodiment, a space to arrange the pad 35P of the interconnect WL and the mask 90A to form the pad 35P or a space for a processing margin of the pad 35P and the mask 90A can be secured in the leading region 150 (in the contact formation region 200) by using a process substantially common (simultaneous) to patterning and processing of members in the memory cell array 100.

Therefore, the method of manufacturing a flash memory according to the present embodiment can prevent a short (short circuit) that may arise between the pad, interconnect, and contact caused by an ever finer line width of the interconnect WL and a finer interconnect interval (pitch) in the leading region 150 and device failures caused by the short can be reduced.

As a result, the method of manufacturing a flash memory according to the present embodiment can control reduced manufacturing yields of semiconductor devices caused by ever finer patterns of devices and interconnects. The method of manufacturing a flash memory according to the present embodiment can also form the interconnect WL including a different dimension (the line width or interconnect interval), the pad 35P connected to the interconnect WL, and the contact plug CP2 without adding complex manufacturing processes.

Therefore, according to the first embodiment, a semiconductor device including a fine pattern whose reliability of contact formation thereon is high can be provided.

(2) Second Embodiment

A semiconductor device according to the second embodiment and the method of manufacturing a semiconductor device will be described with reference to FIGS. 25 to 32B. In the second embodiment, structural elements and manufacturing processes that are the same as in the first embodiment will be described when necessary.

(a) Structure

The structure of a semiconductor device (for example, a flash memory) according to the second embodiment will be described by using FIGS. 25 and 26. The description of structural elements of a flash memory in the present embodiment that are substantially the same as structural elements of a flash memory in the first embodiment is omitted or provided in a simplified manner.

FIG. 25 is a plan view showing a planar structure of a portion of a memory cell array 100 and a leading region 150 of a flash memory according to the present embodiment. FIG. 26 is a sectional view showing a section structure of the flash memory according to the present embodiment. FIG. 26 is a sectional view along an XXVI-XXVI line in FIG. 25. Section structures along a Va-Va line and a Vc-Vc line in FIG. 25 are substantially the same as those in FIGS. 5A and 5C described above respectively and the description thereof is omitted.

The flash memory according to the present embodiment is different from the flash memory according to the first embodiment in the formation position of a pad 35P connected to an interconnect (word line) WL and the layout of the pad 35P in a contact formation region 200.

As shown in FIGS. 25 and 26, if the pad 35P is connected to each of a plurality (six) of word lines 35A forming a group, the six pads 35P are arranged in the contact formation region 200 along the X direction. An interconnect interval D3 larger than an interconnect interval LI1 (or a line width LW1) in the memory cell array 100 is secured between the adjacent pads 35P.

Like the flash memory according to the first embodiment, the flash memory according to the second embodiment includes an interconnect (word line) WL having a line & space pattern of the half pitch smaller than the critical dimension of the resolution of photolithography, for example, the line width LW1 and the interconnect interval LI1 of ⅙ the critical dimension of the resolution of photolithography in the memory cell array 100 and having an interconnect interval D2 larger than the interconnect interval LI1 (or the line width LW1) in the memory cell array 100 in the contact formation region 200 of the leading region 150.

Accordingly, like in the first embodiment, the flash memory according to the present embodiment can increase a space to arrange the pad 35P and a space for a processing margin of the pad 35P in the contact formation region 200.

Therefore, according to the second embodiment, substantially the same as in the first embodiment, the reliability of contact formation on a fine pattern in a semiconductor device including the fine pattern can be improved.

(b) Manufacturing Method

The method of manufacturing a semiconductor device (for example, a flash memory) according to the second embodiment will be described with reference to FIGS. 25 to 32. The description of processes of the method of manufacturing a flash memory in the present embodiment that are substantially the same as processes of the method of manufacturing a flash memory in the first embodiment is omitted or provided in a simplified manner.

A process of the method of manufacturing a flash memory according to the present embodiment will be described using FIGS. 27 to 28B. FIG. 27 shows a plan view of a portion of the memory cell array 100 and the leading region 150 of a flash memory in a process of the method of manufacturing a flash memory according to the present embodiment. FIGS. 28A and 28B show sectional process drawings corresponding to FIG. 27. FIG. 28A shows a sectional process drawing along an XXVIIIa-XXVIIIa line in FIG. 27. FIG. 28B shows a sectional process drawing along an XXVIIIb-XXVIIIb line in FIG. 27. The sectional process drawing along an XIIIa-XIIIa line in FIG. 27 is substantially the same as the sectional process drawing in FIG. 13A and thus, the illustration thereof is omitted.

As shown in FIGS. 27, 28A, and 28B, like the method of manufacturing a flash memory according to the first embodiment, materials to form memory cells and interconnects are formed on a semiconductor substrate 30 as processed layers 32, 33, 34, 35.

Then, a hard mask layer 60 is deposited on the processed layers 33 to 35. The hard mask layer 60 has a stacked structure formed of a silicon oxide 601 and an amorphous silicon film 602.

After a sacrificial layer (not shown) in a flag structure is formed on the hard mask layer 60, a first sidewall mask (for example, a silicon nitride) 80 is formed on the side face of the sacrificial layer by using substantially the same method as the formation method described in the first embodiment.

In the memory cell array 100, the first sidewall masks 80 in a closed loop shape are opposed in the Y direction with an interval C1 corresponding to a line width A1 of a linear portion of the sacrificial layer in a flag structure. The first sidewall masks 80 formed for mutually different sacrificial layers are opposed in the Y direction with the interval C1 corresponding to an interval B2 obtained by subtracting a dimension twice a line width LWa of the sidewall mask 80 from an interval B1 of the adjacent sacrificial layers.

The sidewall mask 80 is bent in a predetermined position in the leading region 150 in accordance with the formation position and size (planar shape) of a fringe included in the sacrificial layer in a flag structure. The sidewall mask 80 in the contact formation region 200 of the leading region 150 loops along the shape of the fringe (not shown) with intervals FA1, FA2 corresponding to the fringe size, that is, the intervals FA1, FA2 in the X direction or the Y direction larger than the interval C1 corresponding to the line width A1 of the linear portion of the sacrificial layer.

After the sidewall mask 80 is formed in the first sidewall mask formation process, the sacrificial layer is selectively removed.

After the sacrificial layer in a flag structure is removed, a sacrificial layer (resist film) 72X as a spacer between the first sidewall mask 80 and a sidewall mask formed in a subsequent process is formed so as to cover the first sidewall mask 80 in the contact formation region 200.

The method of manufacturing a flash memory according to the present embodiment is different from the method of manufacturing a flash memory according to the first embodiment in the position where the sacrificial layer 72X as a spacer between sidewall masks covers the first sidewall mask 80.

In the method of manufacturing a flash memory according to the present embodiment, the spacer layer 72X is formed in the contact formation region 200 so as to cover, for example, a portion (Y-direction extending portion) 802 of the sidewall mask 80 extending in the Y direction. Then, the two spacer layers 72X are formed on the Y-direction extending portion 802 of the sidewall mask 80 for the one sidewall mask 80 in a closed loop shape.

For example, the two spacer layers 72X are laid out in the contact formation region 200 so as to be adjacent to each other in the X direction. An interval C3 in the X direction between the adjacent spacer layers 72X is set to be larger than four times the line width of the formed interconnect. The interval C3 between the spacer layers 72X is preferably larger than the critical dimension of the resolution of photolithography.

Regarding the direction parallel to the line width direction of the sidewall mask 80, a dimension (here, a dimension in the X direction) Dx' from the side face of the sidewall mask 80 to an end of the spacer layer 72X is preferably set to a dimension larger than the line width of the formed interconnect or the interconnect interval in the memory cell array 100, for example, a dimension larger than the critical dimension of the resolution of photolithography in consideration of the shape and layout of the formed pad.

Figure 30A:
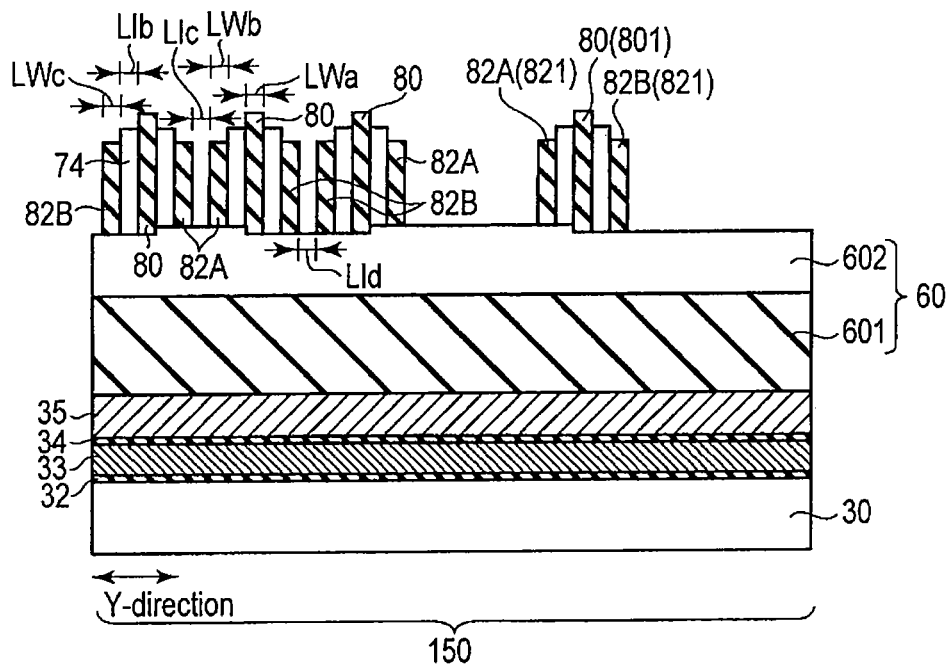
FIGS. 30A and 30B are sectional process drawings illustrating the method of manufacturing the semiconductor device according to the second embodiment.
Figure 30B:
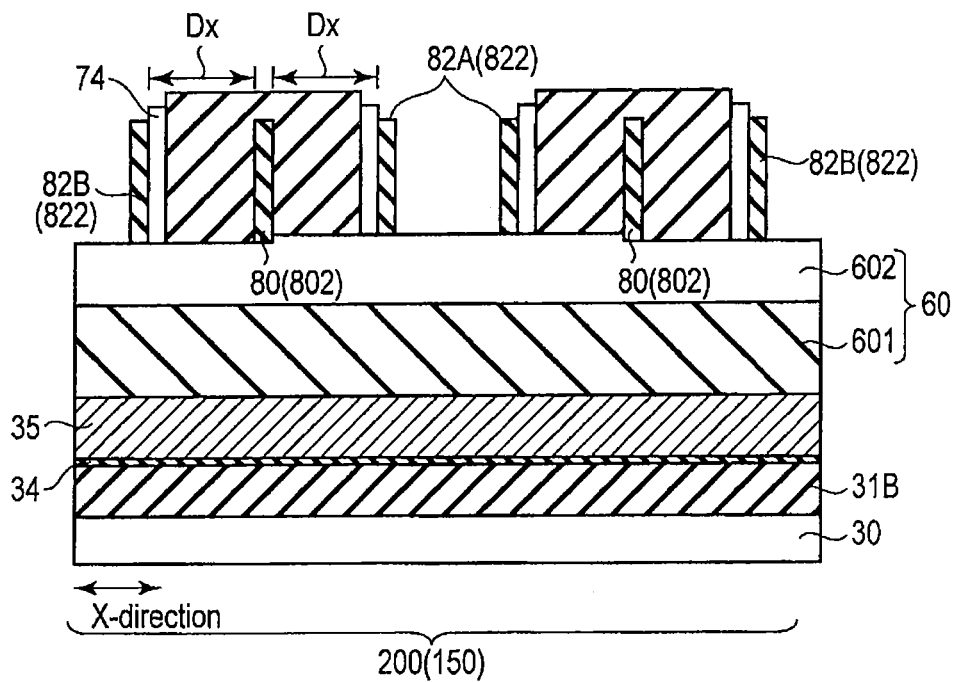

A process of the method of manufacturing a flash memory according to the present embodiment will be described using FIGS. 29 to 30B. FIG. 29 shows a plan view of a portion of the memory cell array 100 and the leading region 150 of a flash memory in a process of the method of manufacturing a flash memory according to the present embodiment. FIGS. 30A and 30B show sectional process drawings corresponding to FIG. 29. FIG. 30A shows a sectional process drawing along an XXXa-XXXa line in FIG. 29. FIG. 303 shows a sectional process drawing along an XXXb-XXXb line in FIG. 29. The sectional process drawing along an XVa-XVa line in FIG. 29 is substantially the same as the sectional process drawing in FIG. 15A and thus, the illustration thereof is omitted.

As shown in FIGS. 29, 30A, and 30B, a sacrificial layer (carbon film or sidewall spacer) 74 is formed on the side faces of the first sidewall mask 80 and the spacer layer 72X in substantially the same process as the process shown in FIGS. 14 to 15B described in the first embodiment. Second and third sidewall masks 82A, 82B are formed on the side face of the sacrificial layer 74 in the second sidewall mask formation process. The sidewall masks 80, 82A, 82B have line widths LWa, LWb, LWc, which are ⅙ the critical dimension of the resolution of photolithography (for example, about 15 nm), to correspond to the line width of the formed interconnect. The sidewall masks 80, 82A, 82B are also adjacent to each other at intervals LIb, LIc, LId, which are ⅙ the critical dimension of the resolution of photolithography (for example, about 15 nm), in the memory cell array 100 to correspond to the interconnect interval (space) of the formed interconnect.

According to the method of manufacturing a flash memory in the present embodiment, with the portion 802 of the first sidewall mask 80 extending in the Y direction being covered with the spacer layer 72X, the second and third sidewall masks 82A, 82B are formed by being bent two-dimensionally around the sidewall mask 80 in accordance with the shape and size of the spacer layer 72X.

Regarding the first sidewall mask 80 and second sidewall mask 82A, and the first sidewall mask 80 and third sidewall mask 82B, an interval Dx in the X direction of the Y-direction extending portions 802, 822 of the sidewall masks 80, 82A, 82B is larger than the intervals LIb, LIc, LId in the Y direction between the sidewall masks 80, 82A, 82B in the memory cell array 100 in accordance with the size of the spacer layer 72X and the line width (thickness) of the sidewall sacrificial layer 74. The interval Dx in the Y direction of the sidewall masks 80, 82A, 82B is preferably larger than the critical dimension of the resolution of photolithography.

A process of the method of manufacturing a flash memory according to the present embodiment will be described using FIGS. 31 to 32B. FIG. 31 shows a plan view of a portion of the memory cell array 100 and the leading region 150 of a flash memory in a process of the method of manufacturing a flash memory according to the present embodiment. FIGS. 32A and 32B show sectional process drawings corresponding to FIG. 31. FIG. 32A shows a sectional process drawing along an XXXIIa-XXXIIa line in FIG. 31. FIG. 32B shows a sectional process drawing along an XXXIIb-XXXIIb line in FIG. 31. The sectional process drawing along an XIXa-XIXa line in FIG. 31 is substantially the same as the sectional process drawing in FIG. 19A and thus, the illustration thereof is omitted. The manufacturing processes corresponding to FIGS. 31, 32A, and 32B will be described by using also FIGS. 18A to 24C when appropriate.

As shown in FIGS. 31, 32A, and 32B, after the spacer layer and the sidewall spacer between the sidewall masks 80, 82A, 82B are removed, like the processes shown in FIGS. 18A and 19A in the first embodiment, a stacked mask 64 including an SOC film 641 and an SOG film 642A is formed on the hard mask layer 60 so as to cover the sidewall masks 80, 82A, 82B.

Like in the first embodiment, a resist mask 90D to pattern a pad, a resist mask 90C to form a select gate line, and a resist mask (not shown) to form a gate pattern of a peripheral transistor are formed on the stacked mask 64 by common processes.

The resist masks 90D are formed on the stacked mask 64 by photolithography and etching in such a way that each of the resist masks 90D overlaps with the respective Y-direction extending portions 802, 822 of the sidewall masks 80, 82A, 82B. The resist masks 90D are arranged in predetermined positions in the contact formation region 200 so as to correspond to the layout of the formed pad. For example, each of the resist masks 90D in the common contact formation region 200 is aligned on the same straight line along the X direction.

In the present embodiment, the six resist masks 90D are formed in the one contact formation region 200. Each of the resist masks 90D is formed by adjusting the size and layout of the resist mask 90D so that the one resist mask 90D should not extend over two of the sidewall masks 80, 82A, 82B or more. Each of the resist masks 90D is patterned so as to correspond to the shape and sizes PD1, PD2 of the formed pad.

Then, the SOG film 642A and the SOC film 641 of the stacked mask 64 are etched by using the resist mask 90D as a mask.

As shown in FIG. 32A, in substantially the same manner as the process shown in FIG. 19A in the first embodiment, etching of the SOC film 641 of the stacked mask 64 is stopped when an upper end 99 of the sidewall mask 80 in the memory cell array 100 is exposed.

Then, in substantially the same manner as the process shown in FIG. 20A in the first embodiment, etching is performed so that the position of the upper end of the sidewall mask 80 exposed first becomes substantially as high as the upper end of the sidewall masks 82A, 82B.

Then, in substantially the same manner as the process shown in FIG. 21A in the first embodiment, etching of the stacked mask 64 continues. After the pattern of each of the masks 90D is transferred to the SOC film 641 of the stacked mask 64, the second hard mask (amorphous silicon film) 602 of the mask layer 60 is etched by using the sidewall masks 80, 82A, 82B and the stacked mask 64 to which a pad pattern is transferred as a mask. Thus, like in the first embodiment, after the line & space pattern of the sidewall masks 80, 82A, 82B and the pad pattern of the stacked mask 64 are transferred to the amorphous silicon film 602 as the hard mask 602, the sidewall masks 80, 82A, 82B and stacked mask 64 are removed.

Then, in substantially the same manner as the process shown in FIGS. 23A to 24C in the first embodiment, a mask for loop-cutting is formed on the hard mask layer 60 before the silicon oxide 601 as the first hard mask 601 is processed. In the present embodiment, an opening of the mask for loop-cutting is formed so that, for example, portions 801, 821 extending in the X direction on the side on which a pattern in a closed loop shape projects are exposed.

Accordingly, in the present embodiment, like in the first embodiment, a pattern of a hard mask in a closed loop shape is made an independent pattern corresponding to a word line and a pad connected to the word line. Then, in substantially the same manner as the manufacturing process described in the first embodiment, the word line WL (select gate line) and pad, inter-layer insulating film, contact plug/via plug, and intermediate wiring layer/bit line are successively formed.

With the above processes, a flash memory according to the present embodiment is formed.

According to the method of manufacturing a flash memory in the present embodiment, like the method of manufacturing a flash memory in the first embodiment, a flash memory including a interconnect (for example, word line) WL having a line & space pattern of the line width LW1 and the interconnect interval LI1 smaller than the critical dimension of the resolution of photolithography (for example, ⅙ the critical dimension of the resolution of photolithography) in the memory cell array 100 and having the interconnect intervals D1, D2 larger than the interconnect interval LI1 or the line width LW1 in the contact formation region 200 of the leading region 150 is formed.

According to the method of manufacturing a flash memory in the present embodiment, a plurality of the pads 35P connected to each of the word lines WL forming a group are formed in the contact formation region 200 so as to be arranged on the same straight line along the X direction.

According to the method of manufacturing a flash memory in the present embodiment, the sacrificial layer 72X as a spacer layer is formed so as to cover the portion 802 extending in the Y direction of the first sidewall mask 80 by the first sidewall mask formation process. Accordingly, the interval Dx, D2 between the sidewall masks 80, 82A, 82B and between the interconnects WL in the contact formation region 200 of the leading region 150 can be made larger than the intervals LIb, LIc, LId and LI1 between the sidewall masks 80, 82A, 82B and between the interconnects WL in the memory cell array 100 respectively. As a result, a relatively large space to arrange the pad 35P and the mask 90D to form the pad 35P and a relatively large space for a processing margin thereof can be secured in the contact formation region 200.

As described in the method of manufacturing a flash memory according to the first and second embodiments, the formation position of the pad 35P can be adjusted by adjusting the formation position of the sacrificial layer (spacer layer) 72X covering the first sidewall mask 80 to be the core material of the second sidewall masks 82A, 82B in the contact formation region 200.

According to the second embodiment, as described above, like the first embodiment, a semiconductor device including a fine pattern whose reliability of contact formation thereon is high can be provided.

[Others]

According to a semiconductor device and the method of manufacturing a semiconductor device in the present embodiment, a sidewall mask corresponding to an interconnect pattern is formed by the sidewall mask formation process executed twice. However, if the interval between sidewall masks in the contact formation region 200 of the leading region 150 can be made sufficiently larger than the interval between sidewall masks in the memory cell array 100 by forming a sacrificial layer (spacer layer) so as to cover the sidewall mask (n-th sidewall mask) functioning as a core material to form the sidewall mask ((n+1)-th sidewall mask)

in the next ((n+1)-th) sidewall mask formation process, a mask pattern to form an interconnect may be formed by repeating the sidewall mask formation process executed at least three times and the formation of a spacer layer.

According to a semiconductor device and the method of manufacturing a semiconductor device in the present embodiment, the flash memory is illustrated as a semiconductor device, but the present embodiment is not limited to the flash memory. For example, the above embodiments may be applied to the structure and the manufacturing method of a volatile semiconductor memory such as a DRAM and SRAM. Also, the above embodiments may be applied to the structure and the manufacturing method of a resistance change type memory such as MRAM (Magnetoresistive RAM), PCRAM (Phase Change RAM), and ReRAM (Resistive RAM) in which an element whose resistance changes reversibly is used as a memory element. For example, a semiconductor device according to the present embodiment described above and the manufacturing method thereof can be applied to the structure and the manufacturing method of an interconnect (word line/bit line) of a cross-point memory cell array included in a resistance change type memory and a contact portion connected to the interconnect.

Further, in addition to the memory as a semiconductor device, the structure and the manufacturing method described in the present embodiment may be applied to a gate electrode of a FET (Field Effect Transistor), an interconnect connected to a FET, or a contact portion (a pad or fringe) connected to the gate electrode and the interconnect in a logic circuit formed from a FET in a planar structure or a Fin FET.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first sacrificial layer above a processed layer in first and second regions adjacent to each other in a first direction of a semiconductor substrate, the first sacrificial layer including a linear portion extending in the first direction and having a first width and a fringe portion of a flag shape provided in the second region and having a first dimension in a second direction crossing the first direction larger than the first width;
    forming a first sidewall film on a side face of the first sacrificial layer;
    forming at least a second sacrificial layer covering at least a portion of the first sidewall film in the second region so as to project to both sides in a direction parallel to a width direction of the portion of the first sidewall film from a side face of the portion and forming a third sacrificial layer having substantially a second width smaller than the first width on side faces of the first sidewall film having the second width and the second sacrificial layer, after the first sacrificial layer is removed; and
    forming second and third sidewall films having substantially the second width in such a way that each of the second and third sidewall films is adjacent to the first sidewall film across the third sacrificial layer by having a first interval corresponding to the second width in the first region and is adjacent to the first sidewall film across the second and third sacrificial layers by having a second interval larger than the first interval in the second region, wherein
    the first sacrificial layer is formed in such a way that a plurality of patterns are arranged along the second direction in the first region,
    the first sidewall film is formed on the side face of the first sacrificial layer with the second width,
    the second and third sidewall films are formed in such a way that each of the second and third sidewall films are adjacent to the first sidewall film across the third sacrificial layer in the first region,
    the first to third sidewall films as a whole have substantially ⅙ pitch in the second direction of the plurality of patterns of the first sacrificial layer in the first region.

2. The method according to claim 1, further comprising:
    after the second and third sacrificial layers are removed, forming a first mask pattern having a second dimension larger than the second width in a direction parallel to a width direction of the first to third sidewall films in a position in the second region overlapping with portions of the first to third sidewall films adjacent to each other with the second interval for each of the first to third sidewall films; and
    forming a plurality of interconnects adjacent to each other with the first interval in the first region and with the second interval in the second region and having substantially the second width and a plurality of contact portions connected to the interconnects respectively and having substantially the second dimension by processing the processed layer so that the first to third sidewall films and the first mask pattern are transferred.

3. The method according to claim 2, wherein
when the first mask pattern is formed in the position in the second region, upper ends of the first to third sidewall films exposed first in the first region are selectively etched so that the positions of the upper ends of the first to third sidewall films are aligned.

4. The method according to claim 3, wherein
a stacked mask including a first mask layer covering the first to third sidewall films and a second mask layer on the first mask layer is formed above the processed layer,
a first resist mask corresponding to the first mask pattern is formed above the stacked mask by lithography, and
the stacked mask is processed based on the first resist mask to form the first mask pattern.

5. The method according to claim 4, wherein
when the stacked mask is processed, the upper end of the first sidewall film among the first to third sidewall films is exposed from an upper surface of the first mask layer prior to the upper ends of the second and third sidewall films and the upper ends of the second and third sidewall films are covered with the first mask layer.

6. The method according to claim 2, wherein
a second mask pattern corresponding to a transistor gate pattern and having a third width larger than the second width is formed in the first region simultaneously with formation of the first mask pattern and the processed layer is processed so that the first to third sidewall films and the first and second mask patterns are transferred.

7. The method according to claim 2, wherein
the second and third sacrificial layers are removed substantially simultaneously under a same condition.

8. The method according to claim 7, wherein
the second and third sacrificial layers include a same element as a mainly containing element.

9. The method according to claim 2, wherein
the portion of first sidewall film is formed so as to extend in the first direction along a shape of the fringe portion.

10. The method according to claim 2, wherein
among the plurality of contact portions, a half of the contact portions are formed in the second region so as to be arranged in the first direction and
a remaining half of the contact portions are formed in the second region so as to be arranged in the second direction and to be opposed to the half of the contact portions in the first direction.

11. The method according to claim 2, wherein said at least a portion of first sidewall film includes two portions, the two portions are formed so as to extend in the second direction along a shape of the fringe and to be opposed to each other in the first direction.

12. The method according to claim 11, wherein
the plurality of contact portions are formed in the second region so as to be arranged along the first direction.

13. The method according to claim 1, wherein
the first sidewall film is formed on the side face of the first sacrificial layer so as to have the second width.

14. The method according to claim 1, wherein
after the first sacrificial layer is removed, a width of the first sidewall film is set to the second width.

15. The method according to claim 1, wherein
the second sacrificial layer is formed to cover the portion of the first sacrificial layer in the second region before the first sacrificial layer is removed,
when the first sacrificial layer is removed, the portion of the first sacrificial layer covered by the second sacrificial layer in the second region remains in the second sacrificial layer, and
the first sacrificial layer covered with the second sacrificial layer appears at one side face of the second sacrificial layer in the width direction, and the second sacrificial layer appears at the other side face of the second sacrificial layer in the width direction.

16. The method according to claim 1, wherein
after the first sacrificial layer is removed, the second sacrificial layer is formed to cover the portion of first sidewall film,
after the second sacrificial layer is formed, the third sacrificial layer is formed on the side face of the second sacrificial layer.

17. The method according to claim 1, wherein
after the third sacrificial layer is formed on the side face of the first sidewall film, the second sacrificial layer is formed so as to cover the portion of first sidewall film and the third sacrificial layer.

18. The method according to claim 1, wherein
the second width and the first interval are set to less than a limit dimension of a resolution of photolithography and the second interval is set to the limit dimension of the resolution of photolithography or more.

19. The method according to claim 1, wherein
the plurality of patterns of the first sacrificial layer are formed so as to be adjacent to each other with a third interval in the second direction,
the first width is set to a size of five times the second width and
the third interval is set to the size of seven times the second width.

* * * * *